(12) United States Patent
Nagaura et al.

(10) Patent No.: US 6,203,644 B1
(45) Date of Patent: Mar. 20, 2001

(54) METHOD AND APPARATUS FOR MANUFACTURE OF QUARTZ OSCILLATOR

(76) Inventors: Yoshiaki Nagaura; Kumiko Nagaura; Zenichiro Nagaura, all of Room 104 Comfort Tenpai, 246-1, Ohaza-Kamikoga, Chikushino-shi, Fukuoka 818 (JP)

( * ) Notice: Subject to any disclaimer, the term of this patent is extended or adjusted under 35 U.S.C. 154(b) by 0 days.

(21) Appl. No.: 09/117,025

(22) PCT Filed: Aug. 18, 1997

(86) PCT No.: PCT/JP97/02860

§ 371 Date: Jul. 21, 1998

§ 102(e) Date: Jul. 21, 1998

(87) PCT Pub. No.: WO98/24588

PCT Pub. Date: Jun. 11, 1998

(30) Foreign Application Priority Data

Dec. 6, 1996 (JP) .................................................. 8-357431
Jul. 26, 1997 (JP) .................................................. 9-233221

(51) Int. Cl.[7] ............................. B32B 31/16; B24B 19/00
(52) U.S. Cl. ........................... 156/153; 156/154; 451/41; 451/541; 451/550; 451/913; 279/3; 279/128; 310/312
(58) Field of Search ............................... 451/41, 42, 540, 451/541, 548, 549, 550, 913; 279/3, 128; 310/312, 320; 156/153, 154

(56) References Cited

U.S. PATENT DOCUMENTS

| | | | |
|---|---|---|---|
| 4,240,311 | * 12/1980 | Shinn ........................................ | 82/12 |
| 5,681,209 | * 10/1997 | Naumann et al. ....................... | 451/51 |
| 5,702,294 | * 12/1997 | Baltazar et al. ....................... | 451/541 |

FOREIGN PATENT DOCUMENTS 59-191251 * 12/1984 (JP) .

* cited by examiner

Primary Examiner—Michael W. Ball
Assistant Examiner—Michael A. Tolin
(74) Attorney, Agent, or Firm—Jordan and Hamburg LLP

(57) ABSTRACT

A method and apparatus for manufacturing high-frequency oscillator elements from a workpiece material includes a tool holder formed of magnetic material providing a magnetic field at a tip thereof and a spherical whetstone made of a magnetic material. A grinding mount is made of a magnetic material installed on a main rotating shaft proximate the tool holder through which flux of the magnetic field is channeled. The spherical whetstone held at the tip of the tool holder by magnetic attraction. The workpiece material is mounted on the grinding mount and the tool holder is rotated around an axis coincident with a center of the spherical whetstone while bringing the spherical whetstone into engagement with the workpiece material to lap the workpiece material.

12 Claims, 57 Drawing Sheets

METHOD AND APPARATUS FOR MANUFACTURE OF QUARTZ OSCILLATOR

BACKGROUND OF THE INVENTION

The present invention relates to a lapping technology for quartz oscillators, quartz resonators, or optical lenses, which are then machined to be as small, thin, and precise as possible in order to transmit and receive electromagnetic waves at higher frequencies.

The conventional lapping techniques for quartz oscillators and quartz resonators consist of machining by barrel lapping, plane lapping, curve generators, etc.

In the case of mechanical lapping, the most common lapping limit for quartz oscillators and resonators is approximately 27.8 µm in a planar shape. The resonant primary frequency corresponds to 60 MHz at besl Further, it is impossible for quartz oscillators with holders coupled to grooves in convex and concave lens shapes to be lapped in an extremely thin and small fashion. This also limits the resonant transmitting primary frequency to approximately 60 MHz at best for conventional lapping methods. Mobile communication equipment, for example, amplifies frequencies from 60 MHz to several Ghz because the dimensional size cannot be smaller. The main demerit here is that the electrical power consumption is increased due to the steady direct current in the frequency amplifying circuit. Also, the lower transmitting frequency has resulted in a limited assignment of wave frequencies for mobile communications.

SUMMARY OF THE INVENTION

The objective of the present invention is to manufacture quartz oscillators, quartz resonators, or optical lenses to be as small, thin, and precise as possible, and to transmit and receive electromagnetic waves at a higher frequency than has previously been allowed.

DETAILED DESCRIPTION

The following explanation gives examples of the present invention.

FIGS. 1–15 are examples executed by the present invention. In each Fig., number 3 is a chuck, 4 is lapped material, 12 is a lapping tool, 14 is an adhesive, 15 is a holding part, 31 is a spherical whetstone, 32 is a holder, 33 is an adhesive film with a hole, 34 is glass, 35 is a table, 36 is a grinding plate or diamond grain surface, 37 is a hole, 38 is a table in a vessel shape, 39 is a cooling solvent, 40 is a holder, 41 is a lid, 42 is a thin frozen layer, 43 is a connection part, 44 is a magnetic part, 48 is a magnet holder, 49 is a spherical grinding element of spherical material and 50 is a lapping agent of magnetic material.

Figure 1:
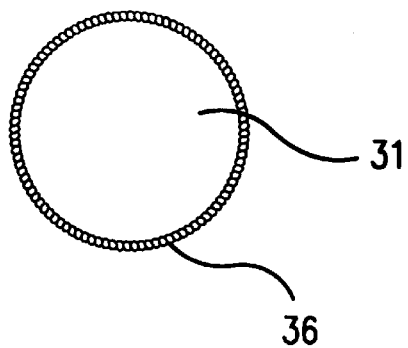
FIG. 1 is a vertical cross section of the spherical whetstone that is used to lap quartz in the method of the present invention.

FIG. 1 is a vertical cross section of the spherical whetstone 31 for lapping the quartz. The spherical whetstone 31, whose diameter may range form approximately 1 mm to several cm, is made of nearly spherical iron steel or other materials. On the surface of the spherical whetstone 31, a lapping agent is coated having diamond grains 36 or other substances by means of electroplating, evaporation, CVD process, thermally solidified bond, thermally solidified metal, adhesive, or glue. Thus the whetstone surface or the diamond grain surface 36 is formed.

Figure 2:
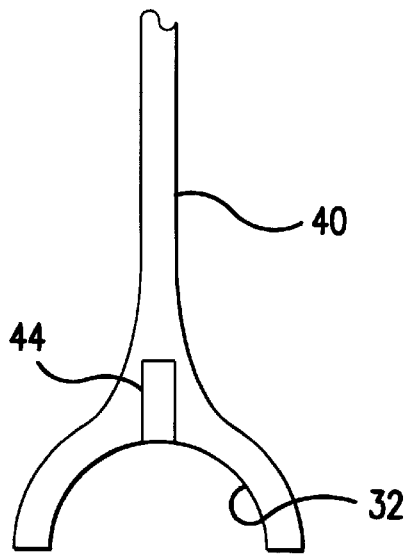
FIGS. 2 and 3 are a vertical cross section and the plan diagram, respectively. They show the cylindrical holder that holds the whetstone in a spherical shape.
Figure 3:
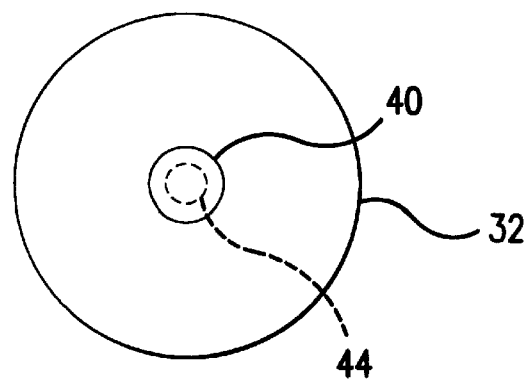

FIGS. 2 and 3 are a vertical cross section and a plan view, respectively, that show an example of holder 40 for holding the spherical whetstone 31. As shown in these FIGS., the holder part 32 of the holder 40 is shaped to be hemispherical in order to be able to support the upper half part of the spherical whetstone 31. The magnet part 44 is installed at a center of the holder 32.

Figure 4:
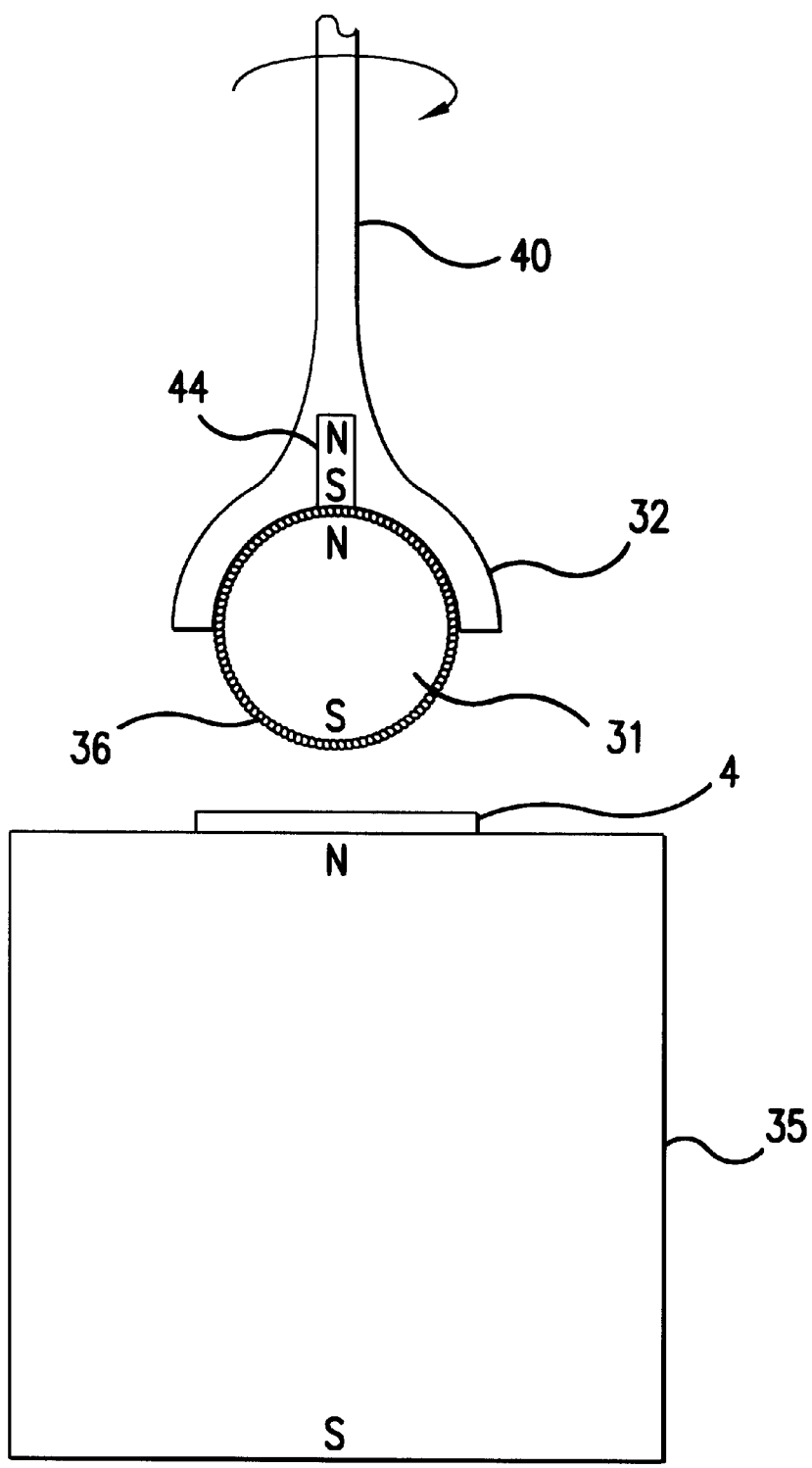
FIG. 4 is a vertical cross section of an example of a lapping apparatus for quartz oscillators of the present invention.

FIG. 4 shows the first example of a lapping machine for quartz oscillators. The magnetic induction of the grinding mount 35 supports the spherical whetstone 31 inside the holder 40 to lap the workpiece material 4. Then, since the holder 40 is rotated around its axis line to use the spherical whetstone 31 with the holder 40, the center line of the spherical whetstone 31 always matches the central axis of the holder 32, and the highest possible lapping accuracy can be achieved.

Figure 5:
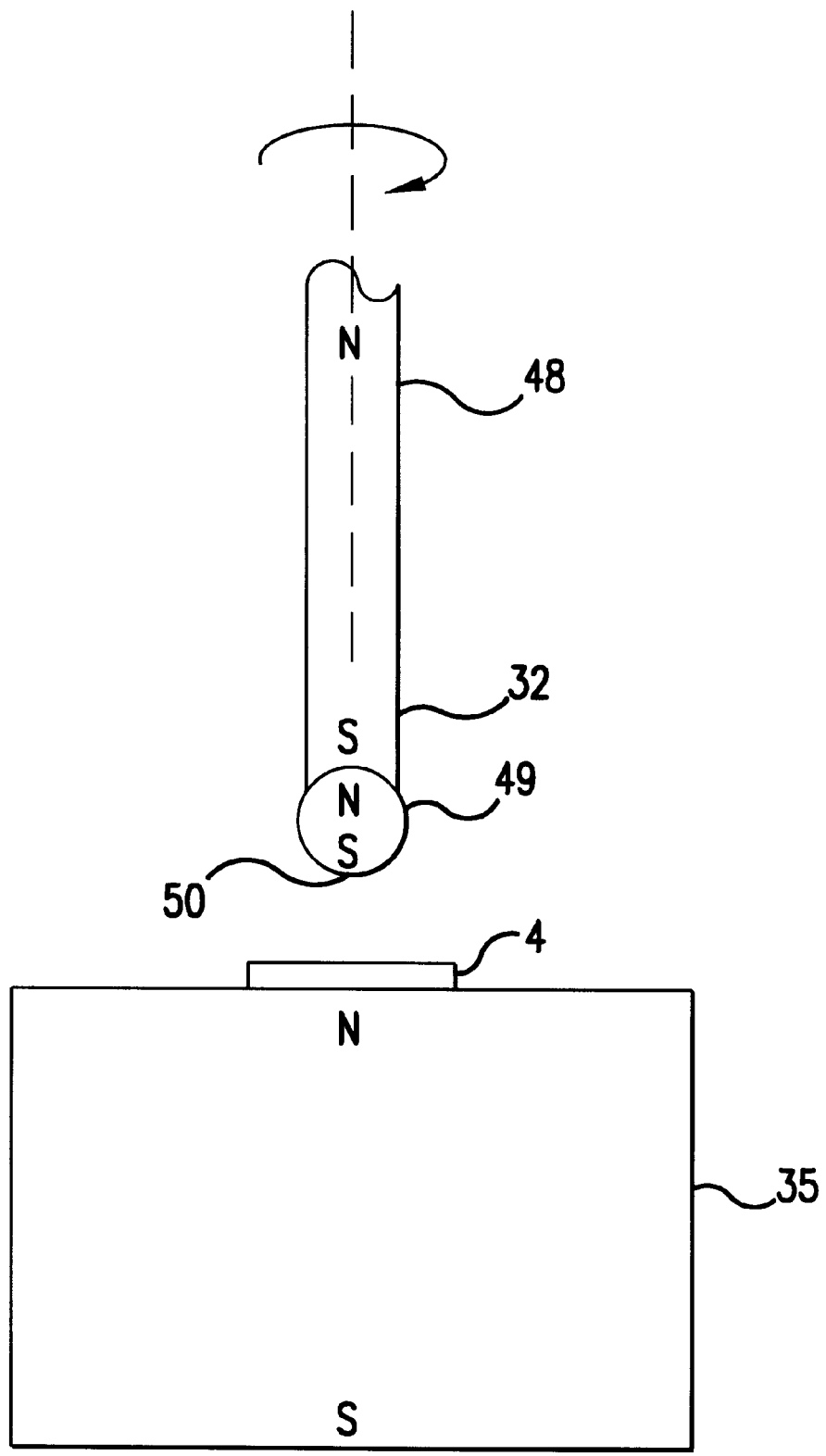
FIG. 5 is a vertical cross section of an example of a typical holder of the present invention.

FIG. 5 shows another example of the holder. The magnetic holder 48 supports the spherical grinding element 49 by means of the magnetic induction of the table 35. The shape of the holding part 32 of the magnetic holder 48 is that of a sphere, a cone, or a similar shape. The holding part 32 of spherical or conical shape supports the spherical grinding element 49, and the spherical grinding element 49 laps by a whetstone surface or diamond grains 50. Therefore, the center line of the spherical grinding element 49 is always equal to the central axis line of the magnetic holder 48, and the highest possible lapping accuracy can be achieved.

Figure 6:
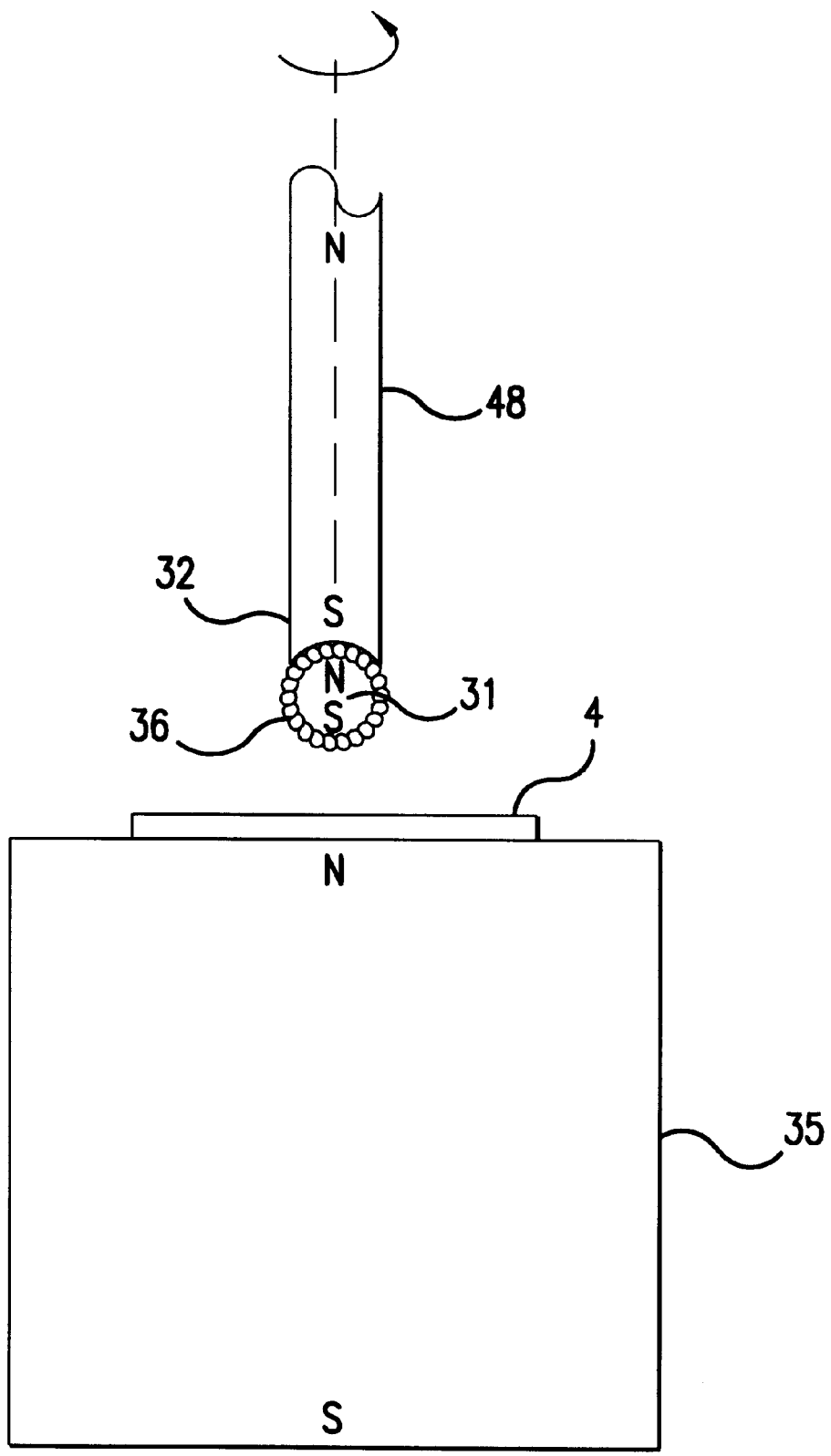
FIG. 6 is a vertical cross section of another example of a holder of the present invention.

FIG. 6 shows another example of the magnetic holder 48. The magnetic holder 48 supports the spherical whetstone 31 with the magnetic induction of the table 35. The holding part 32 for the magnetic holder 48 is spherical, conical, or of a similar shape. Since the surface of the whetstone 31 or diamond grain 36 laps the material by using the spherical or conical holder part 32 supporting the spherical whetstone 31, the center line of the spherical or conical holding part 32 always becomes the same as the center axis line of the spherical whetstone 31. The lapping accuracy is extremely high.

Figure 7:
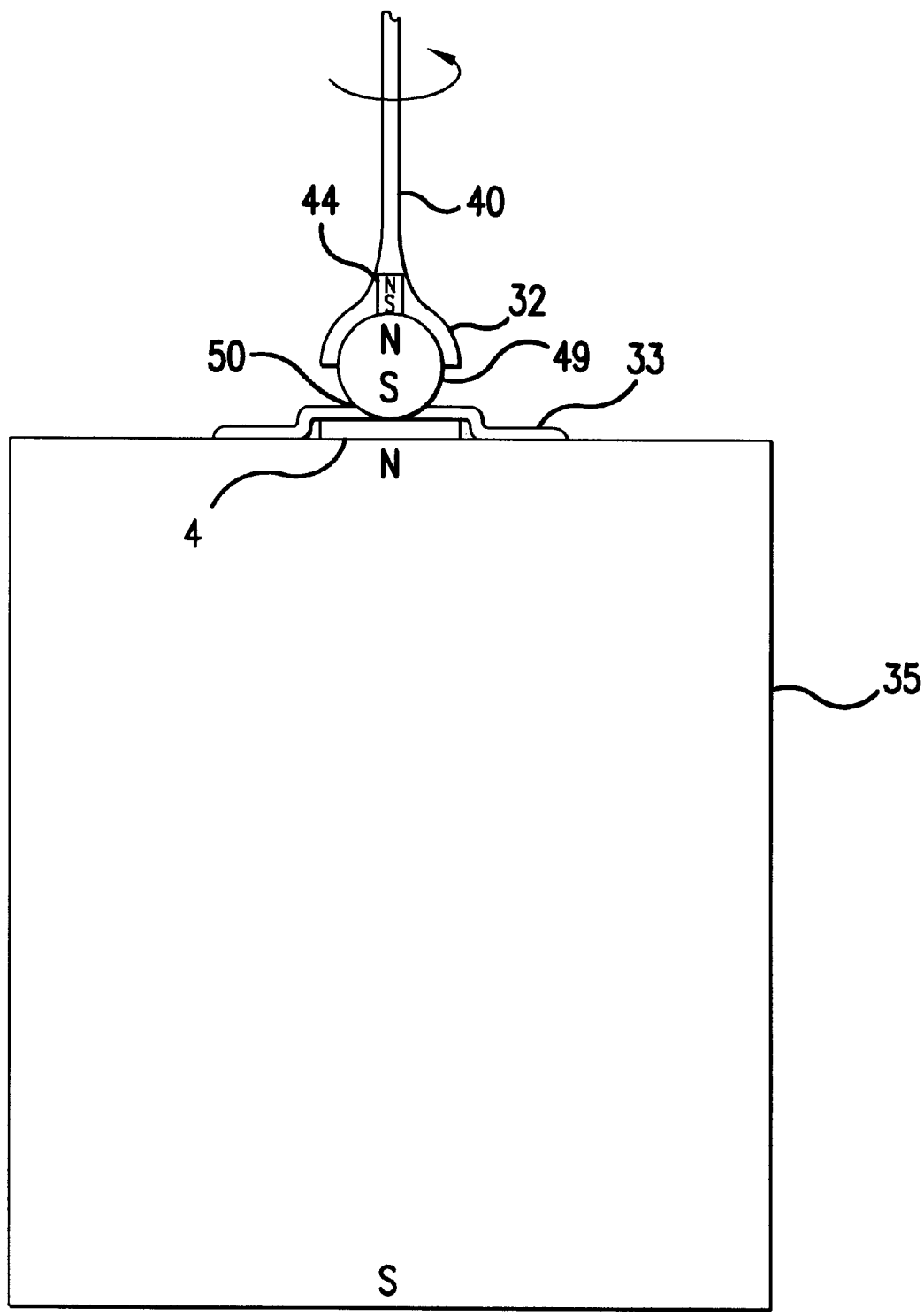
FIGS. 7 and 8 are a vertical cross section and a plan view, respectively, that show another example of a lapping apparatus for quartz oscillators of the present invention.
Figure 8:
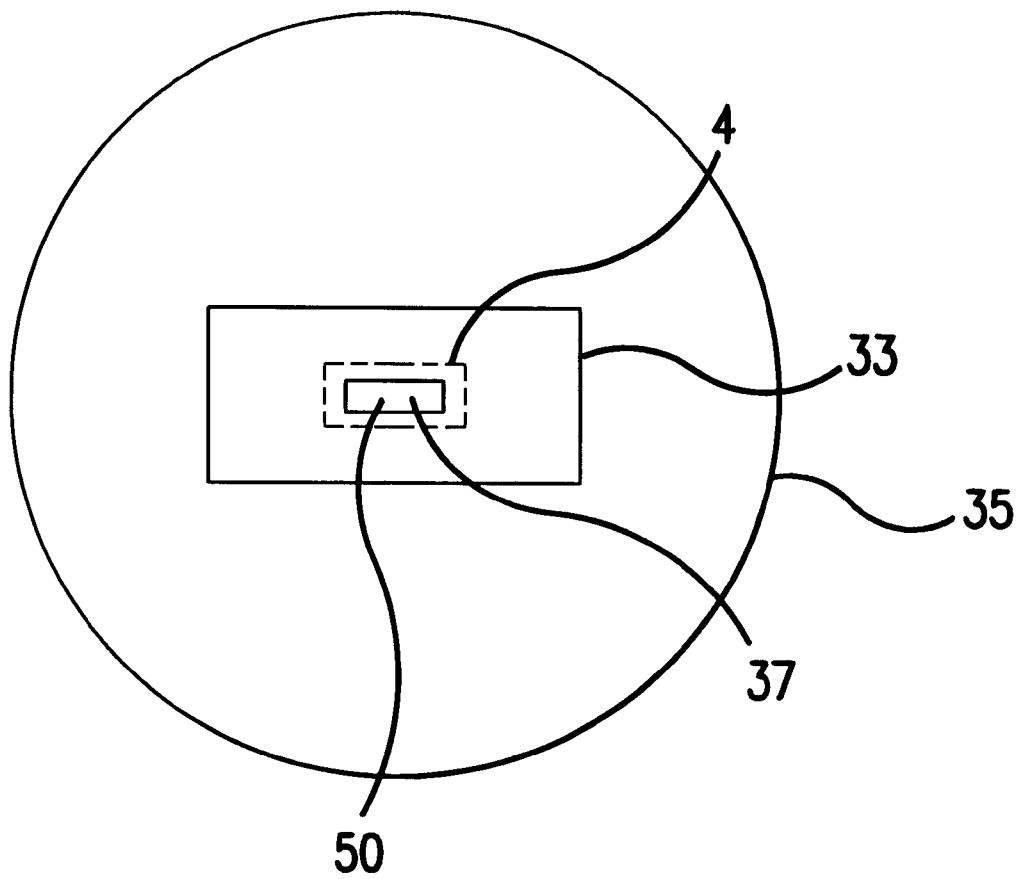

FIGS. 7 and 8 are a vertical cross section and a plan view, respectively, that show another example of the lapping apparatus for quartz oscillators of the present invention. In this example, after the workpiece material 4 is installed on the table 35, which has an electric magnet or a permanent one, a adhesive film with the hole 37 is attached in order to machine solely the lapped material in the hole. Since the magnetic lapping agent 50 is attracted by the magnetic force on the surface of the spherical grinding element 49, the holder 40 with the magnetic part 44 is installed at the center of the holding part 32 with the non-magnetic part The workpiece material 4 is rotated to be machined in the shape of a concave lens.

Figure 9:
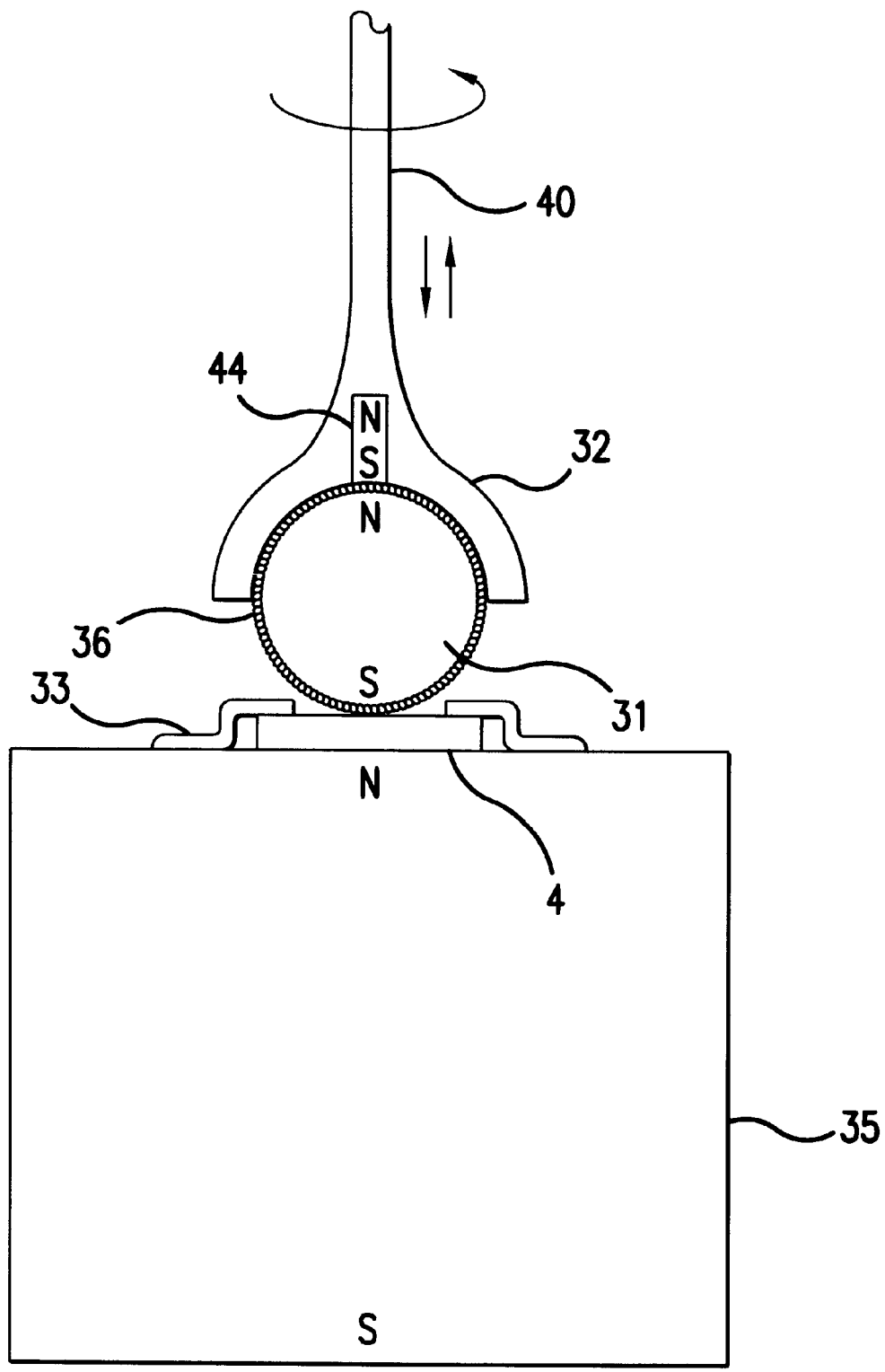
FIG. 9 is a vertical cross section of another example for a lapping apparatus of quartz oscillators of the present invention.
Figure 10:
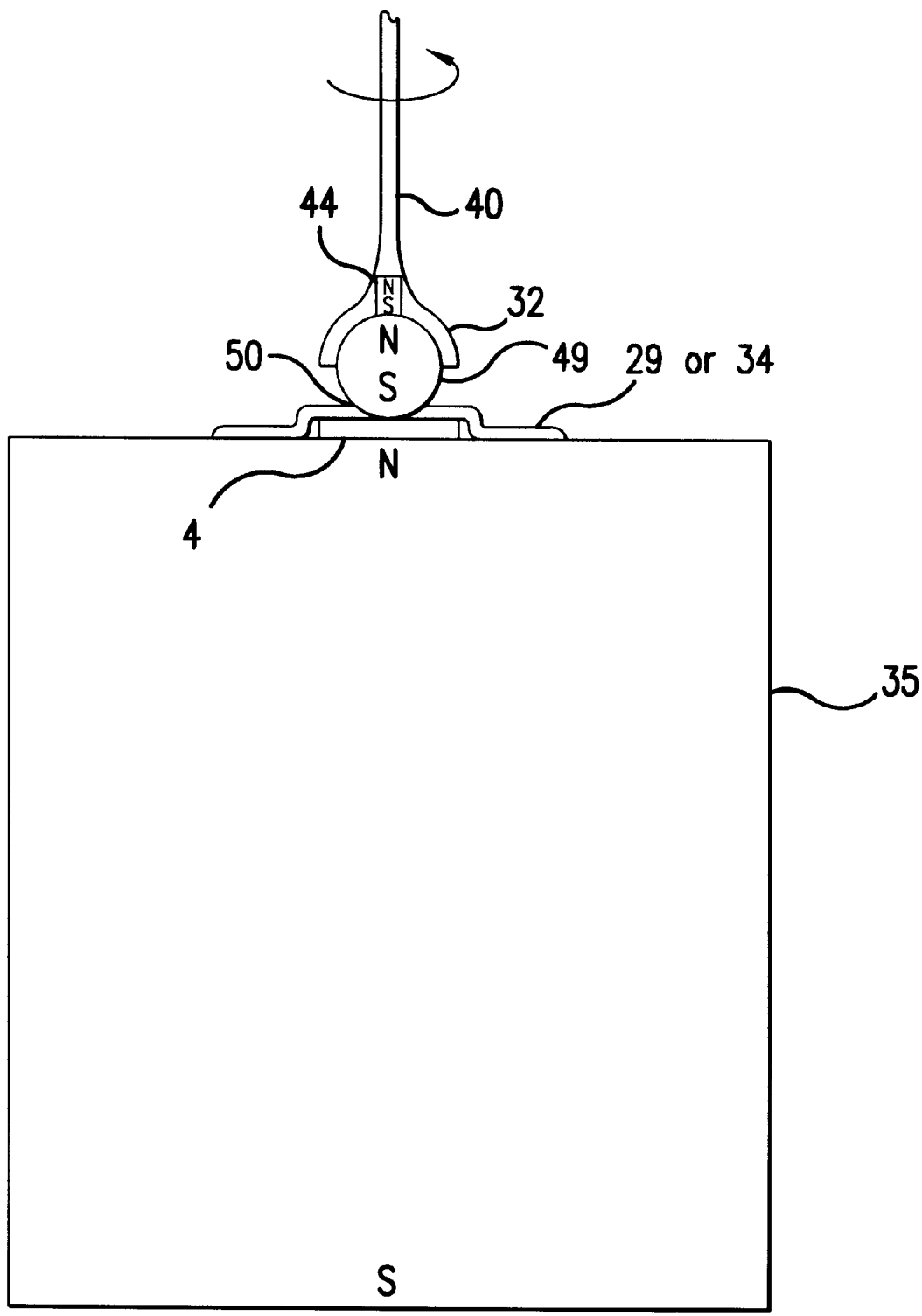
FIGS. 10–13 are vertical cross sections that show other examples of a lapping apparatus for quartz oscillators of the present invention.
Figure 11:
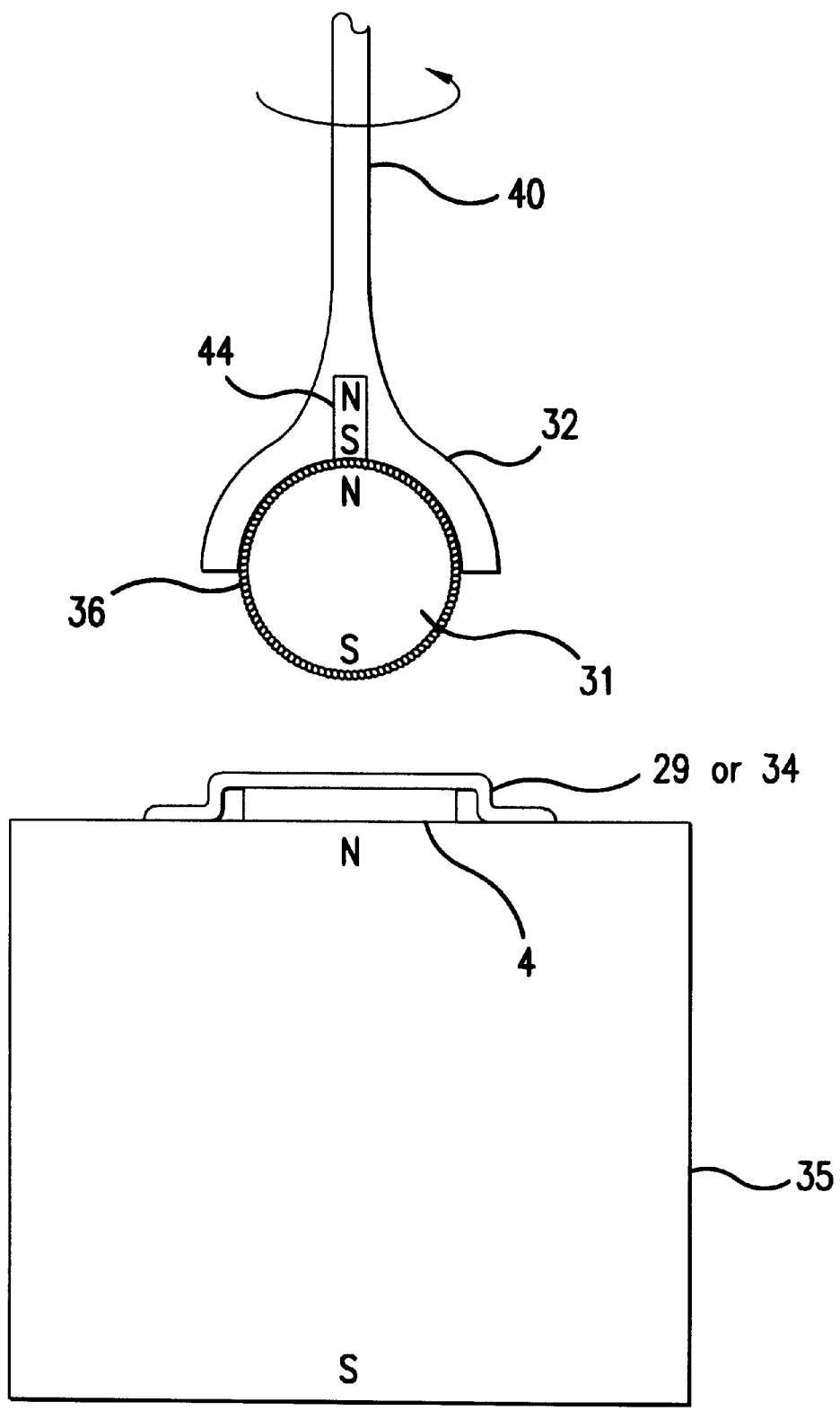
Figure 12:
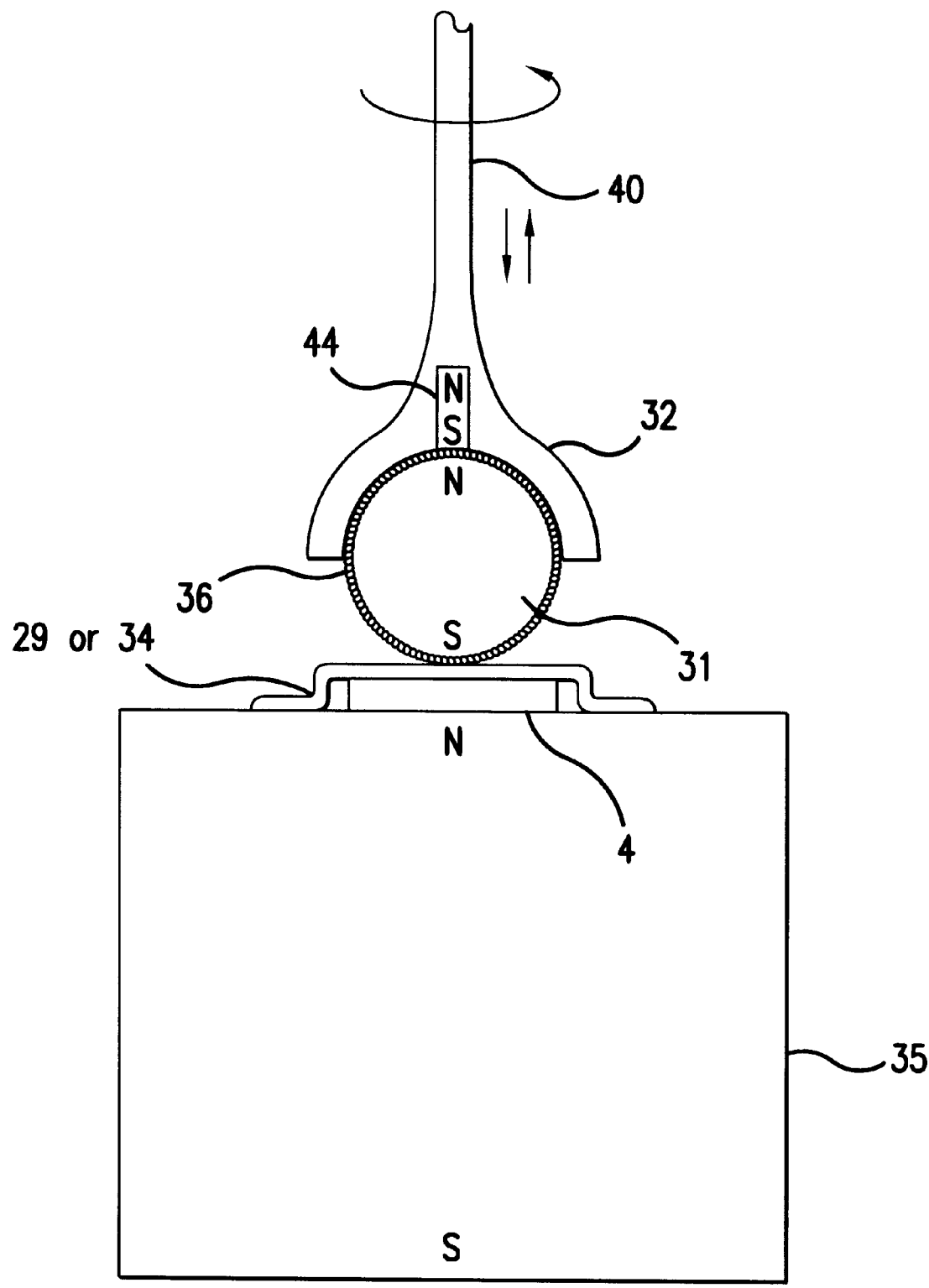
Figure 13:
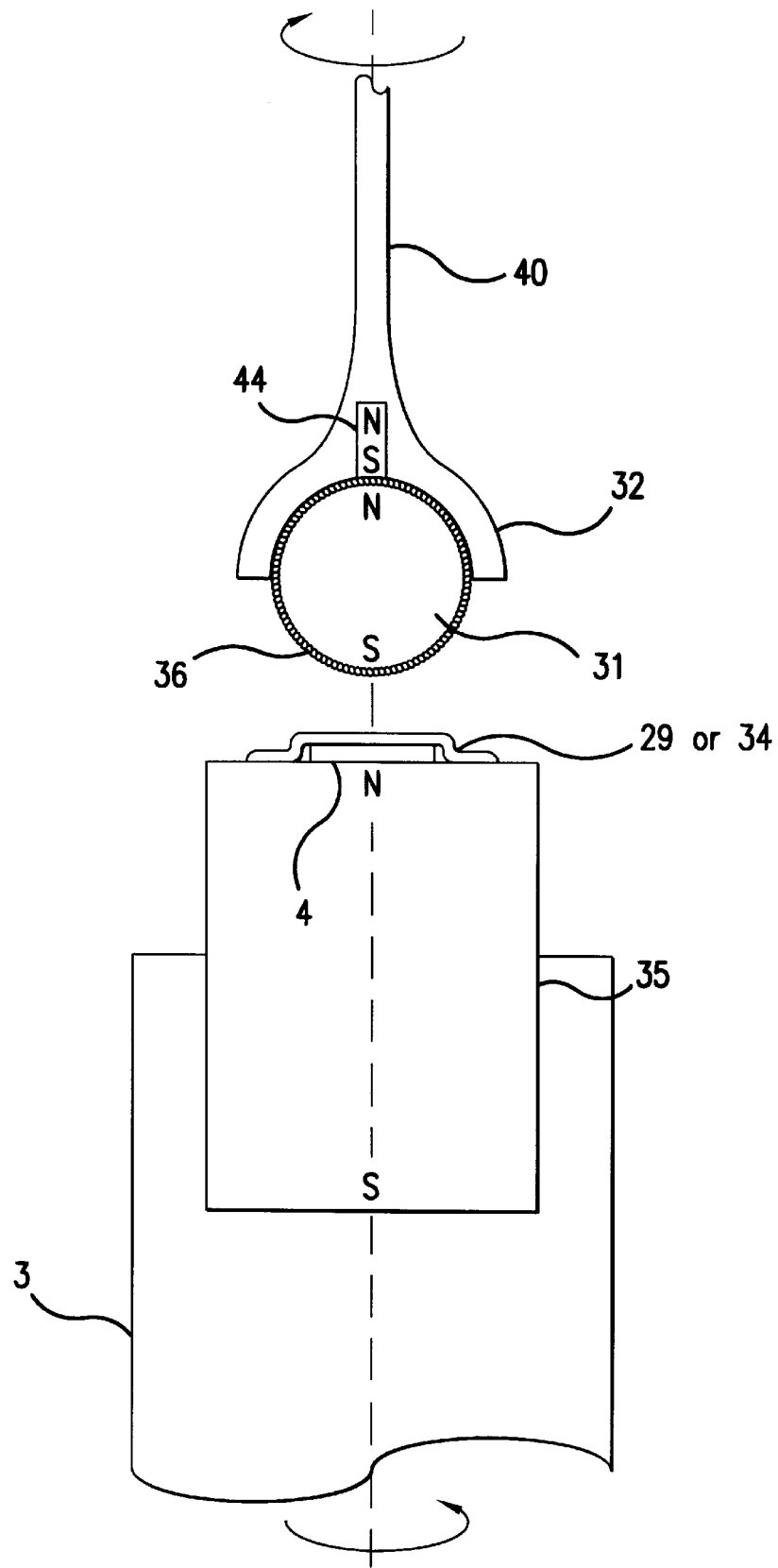

FIG. 9 is a vertical cross section of another example of a lapping apparatus for quartz oscillators of the present invention. In this example, the workpiece material 4 is installed on the grinding mount 35 made of a permanent magnet or an electric magnet, and an adhesive film 33 with a hole 37 is attached in order to machine solely the workpiece material 4 in the hole. The workpiece material 4 is rotated to be machined in a convex shape when the spherical whetstone 31 with the lapping surface or diamond grain surface 36 is installed by magnetic force to the holder 40, which has the magnetic part 44 at the center of the non-magnetic holding part 32.

FIGS. 10–13 are vertical cross sections of another example of a lapping apparatus for quartz oscillators of the present invention. In this example, the workpiece material 4 is installed on the grinding mount 35 made of a permanent magnet or an electric magnet, and adhesive film 29 or glass 34 is attached in order to fix the workpiece material 4. On the adhesive film 29 or glass 34, the spherical whetstone 31, or the spherical grinding element 49, is held by the magnetic force of the magnetic induction by using the holder 40 which has the magnetic part 44 at the center of the holding part 32. The workpiece material 4 is rotated to be machined in the shape of a concave lens. For the example in FIG. 13, the workpiece material 4 is also rotated by holding the grinding mount 35 with the chuck 3 of the lathe.

Figure 14:
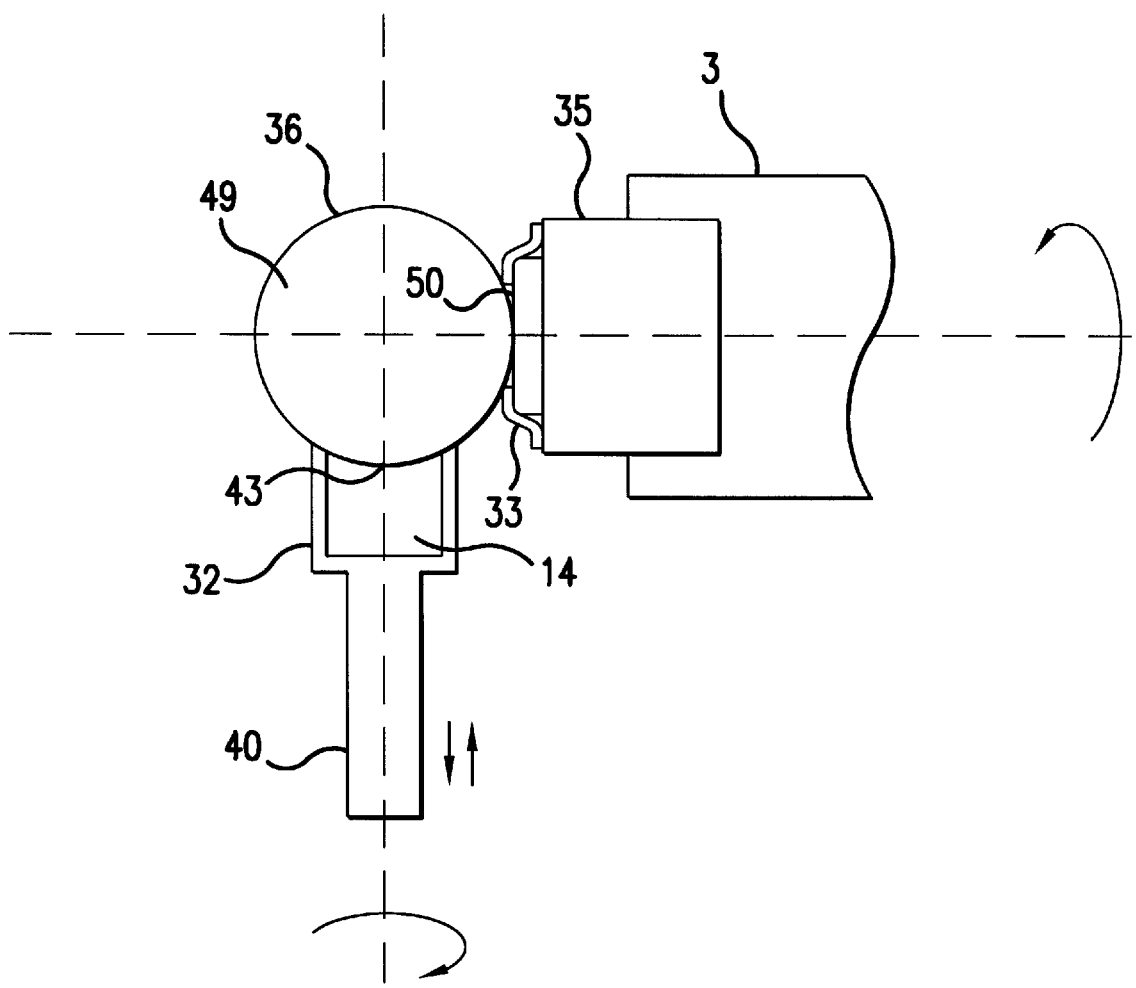
FIG. 14 is a vertical cross section of the lapped state of the present invention.

FIG. 14 shows an example of the spherical material 49, which is connected to the holder 40 by forming the connecting part 43 with a screw, an adhesive agent, welding, or other means after matching the center line of the holder 40 to the spherical grinding element 49. In this example, the holder 40 is directly connected to the grinding element 49. It is used as said lapping apparatus.

Figure 15:
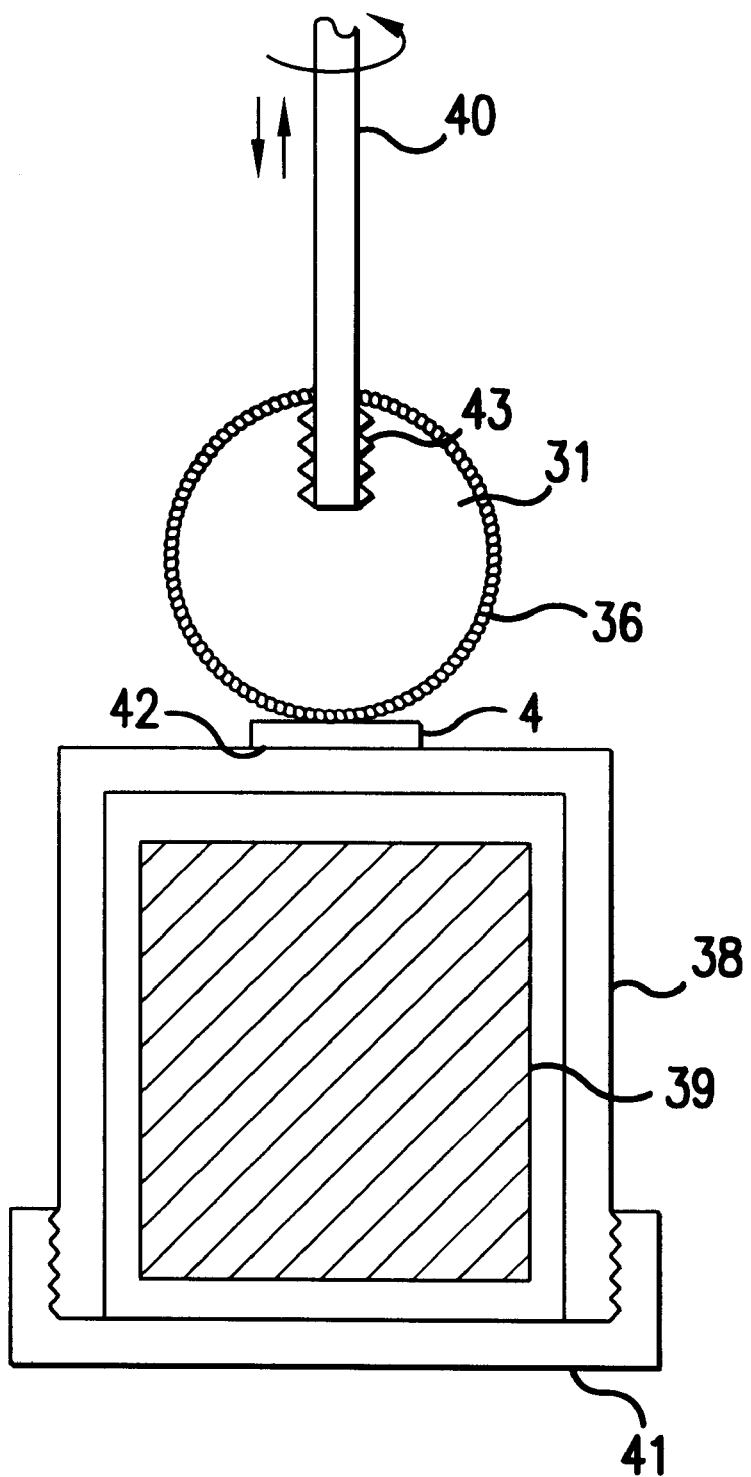
FIGS. 15–21 are vertical cross sections that show other examples of a lapping apparatus for quartz oscillators of the present invention.

FIG. 15 shows an example of the spherical grinding element 49 connected to the holder 32 by forming the connecting part 43 with a screw, an adhesive agent, welding, or other means. This is done after the center line of the holding part 32, whose tip is cylindrical or another similar geometrical shape, matches the spherical whetstone 31. The holder 40 is directly connected to the spherical whetstone 31. The diamond grains are fixed to the surface of the spherical whetstone 31 by utilizing electroplating, electroless plating, or other techniques. This is used as the lapping apparatus.

Figure 16:
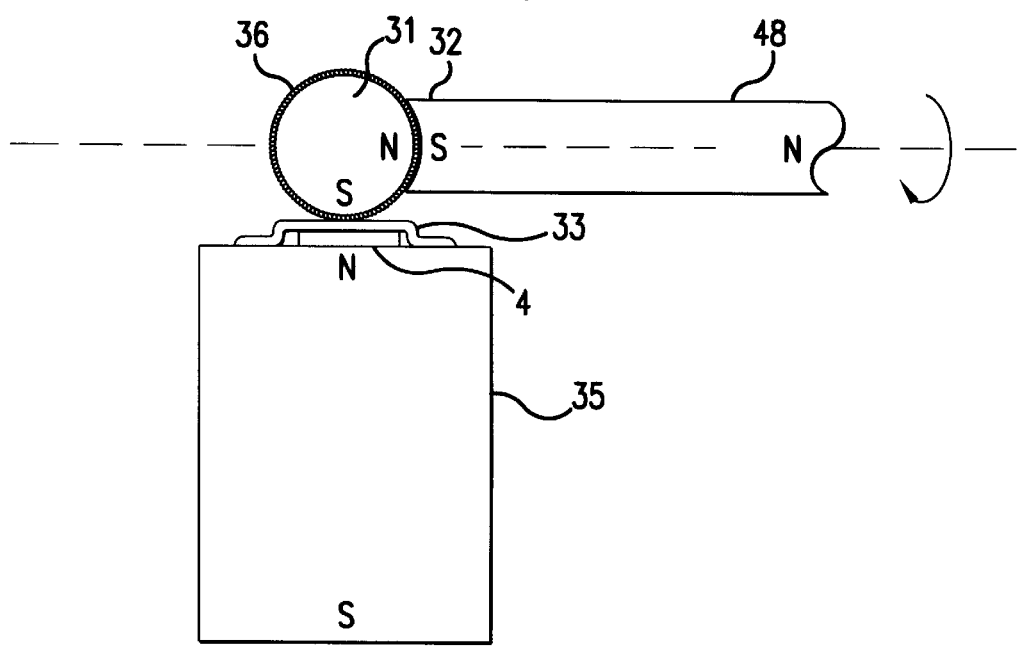
Figure 17:
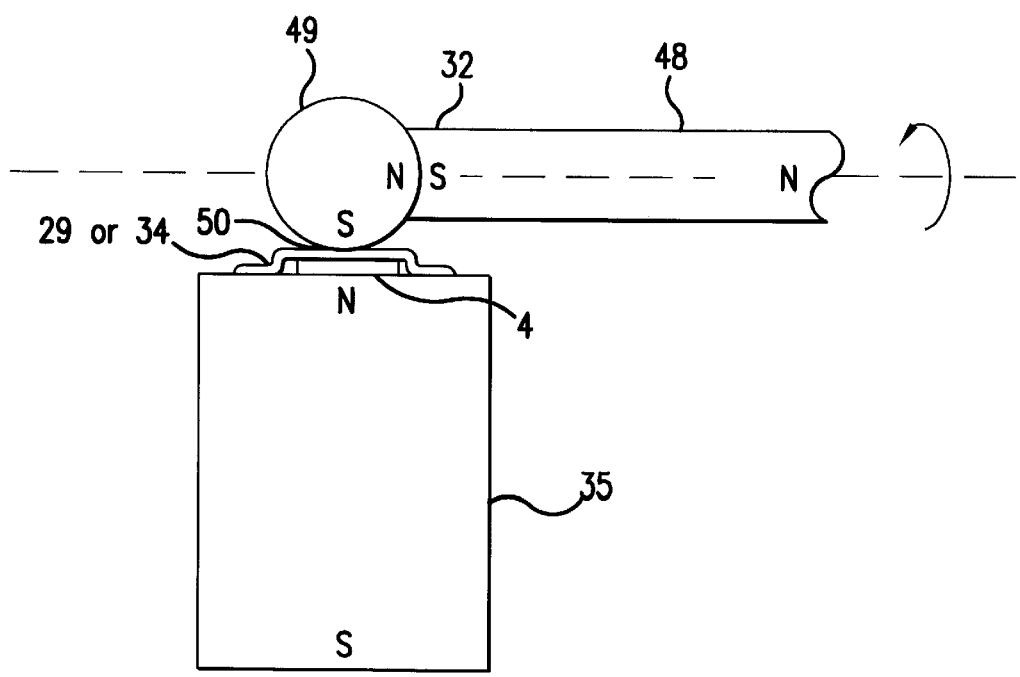
Figure 25:
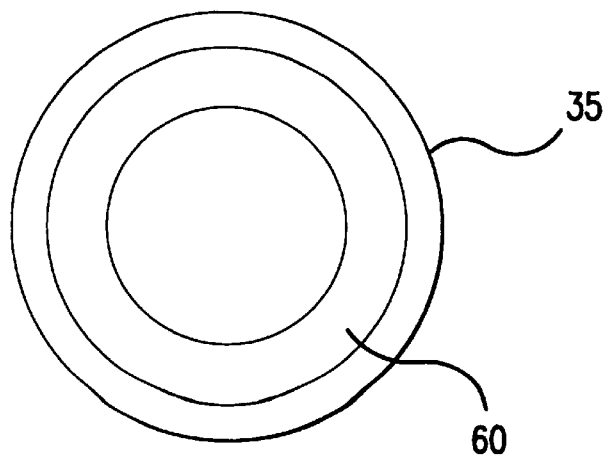
FIG. 25 is a plan view of the plate.

The example of the present invention shown in FIG. 16 is explained below. FIG. 16 is a schematic diagram of a structural drawing of how to lap quartz oscillators. FIGS. 16, 17, 18, 19, 20, 21, 22, 24, 26, 27, 28, 29, and 30 are vertical cross sections. FIGS. 23 and 25 are plan views. In these FIGS., the number 3 is the chuck, 4 is the lapped material, 14 is the adhesive, 31 is the spherical shaped whetstone, 32 is the holding part, 33 is the adhesive film with a hole, 35 is the table, 36 is the whetstone surface, 40 is the holder, 48 is the magnet holder, 149 are ball bearings, 51 is the table, 52 is the air turbine, and 60 is grooves.

FIGS. 18, 26, 28, and 29 show the shaving or lapping state of the machined object while the spherical whetstone 31 is attracted and fixed to the end part of the magnet holder 4 by using the grinding mount 35 having magnet or magnetic induction between the grinding mount 35 and the magnetic table 51.

Figure 18:
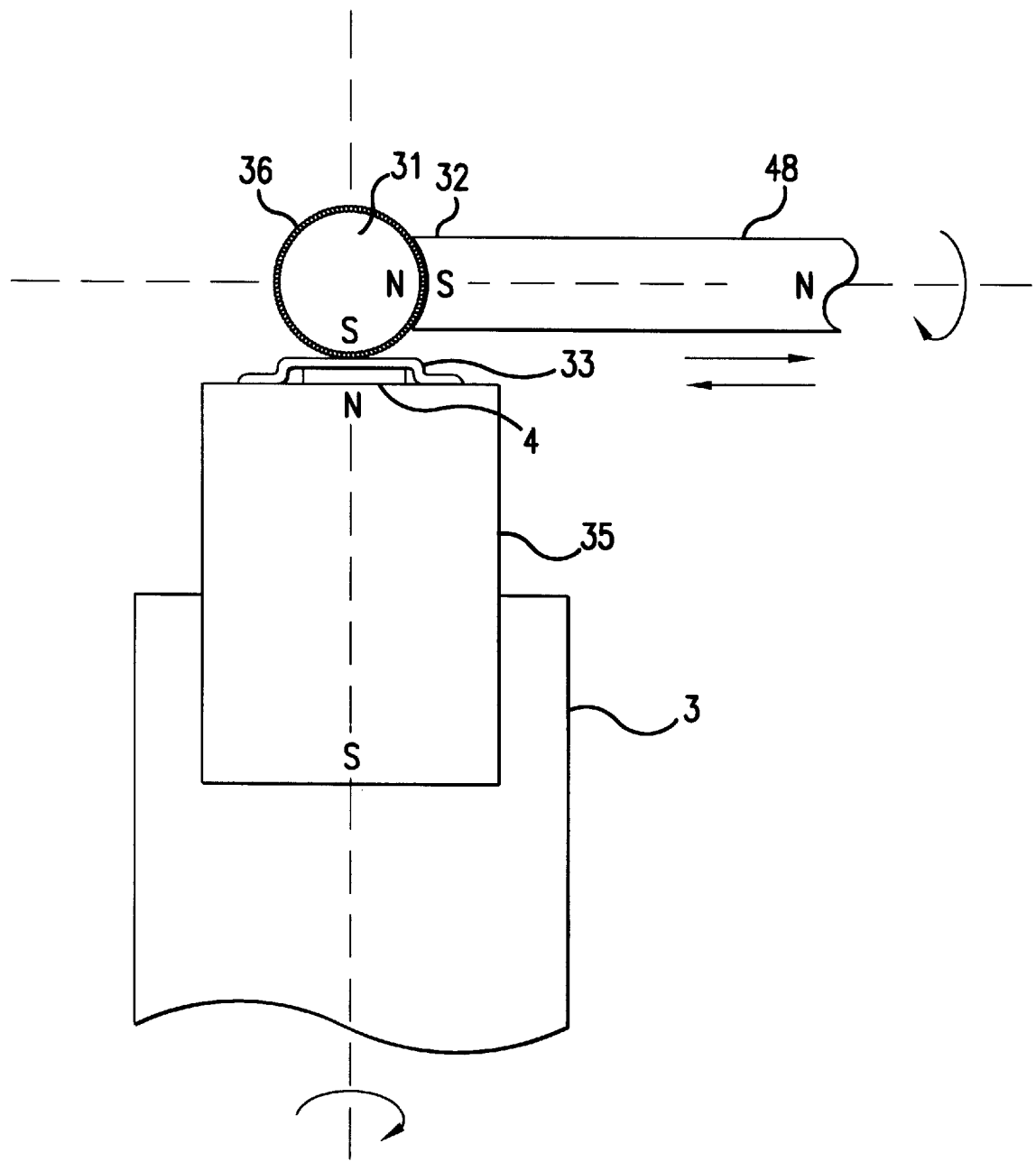
Figure 19:
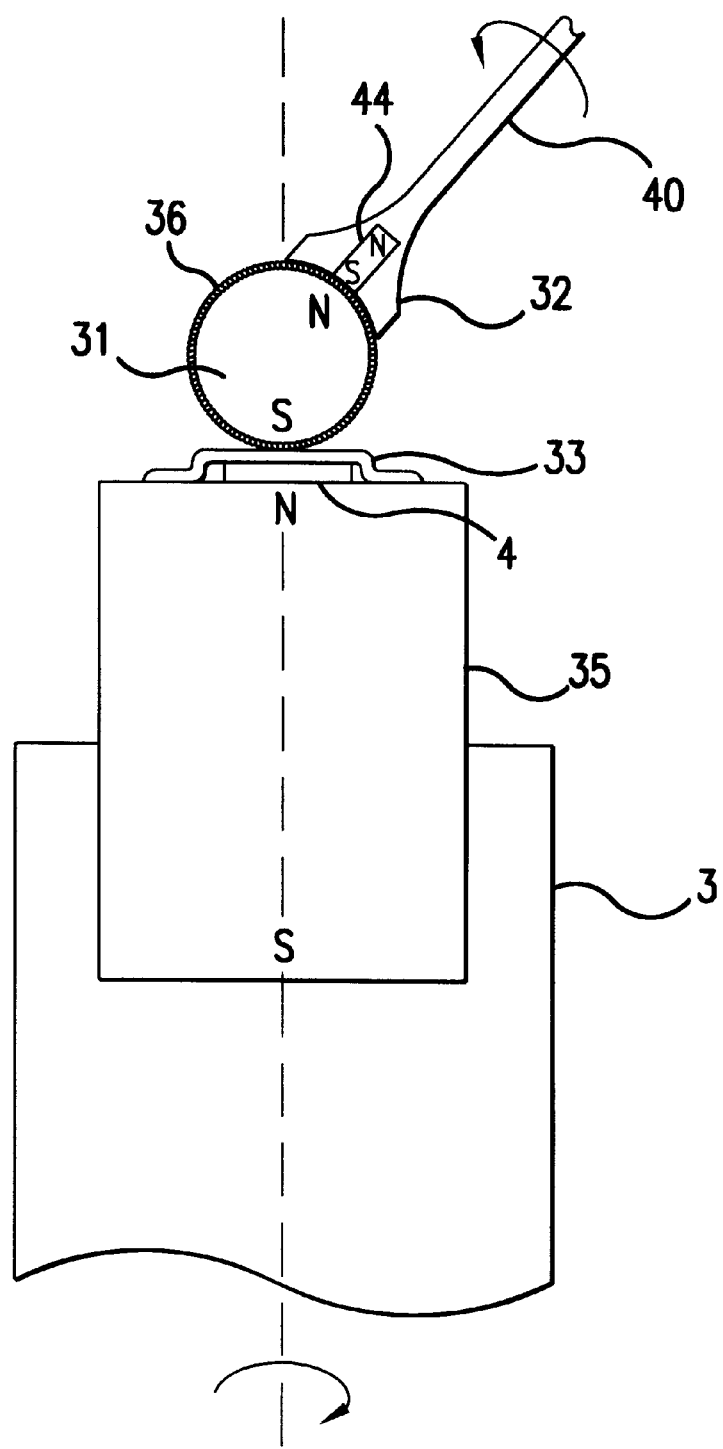
Figure 20:
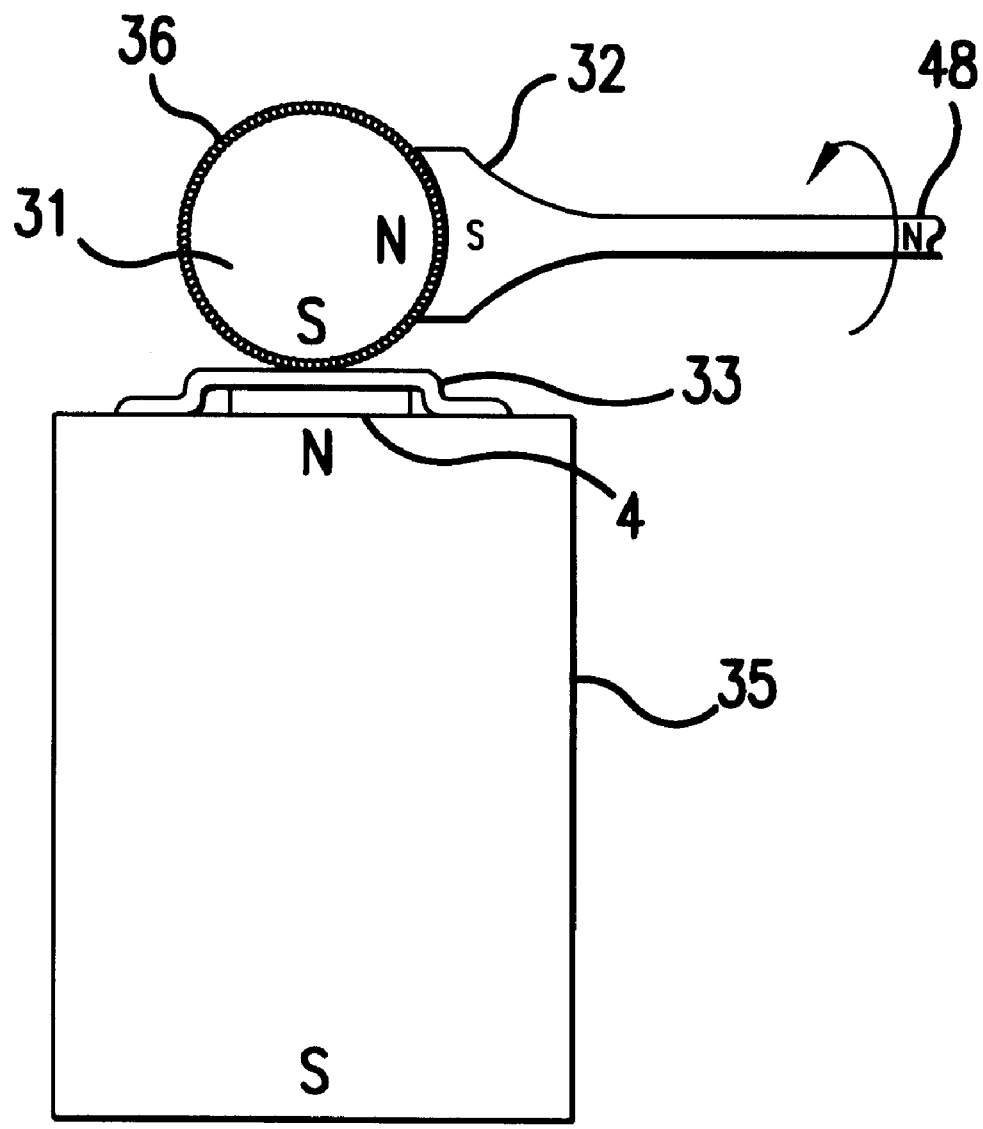
Figure 21:
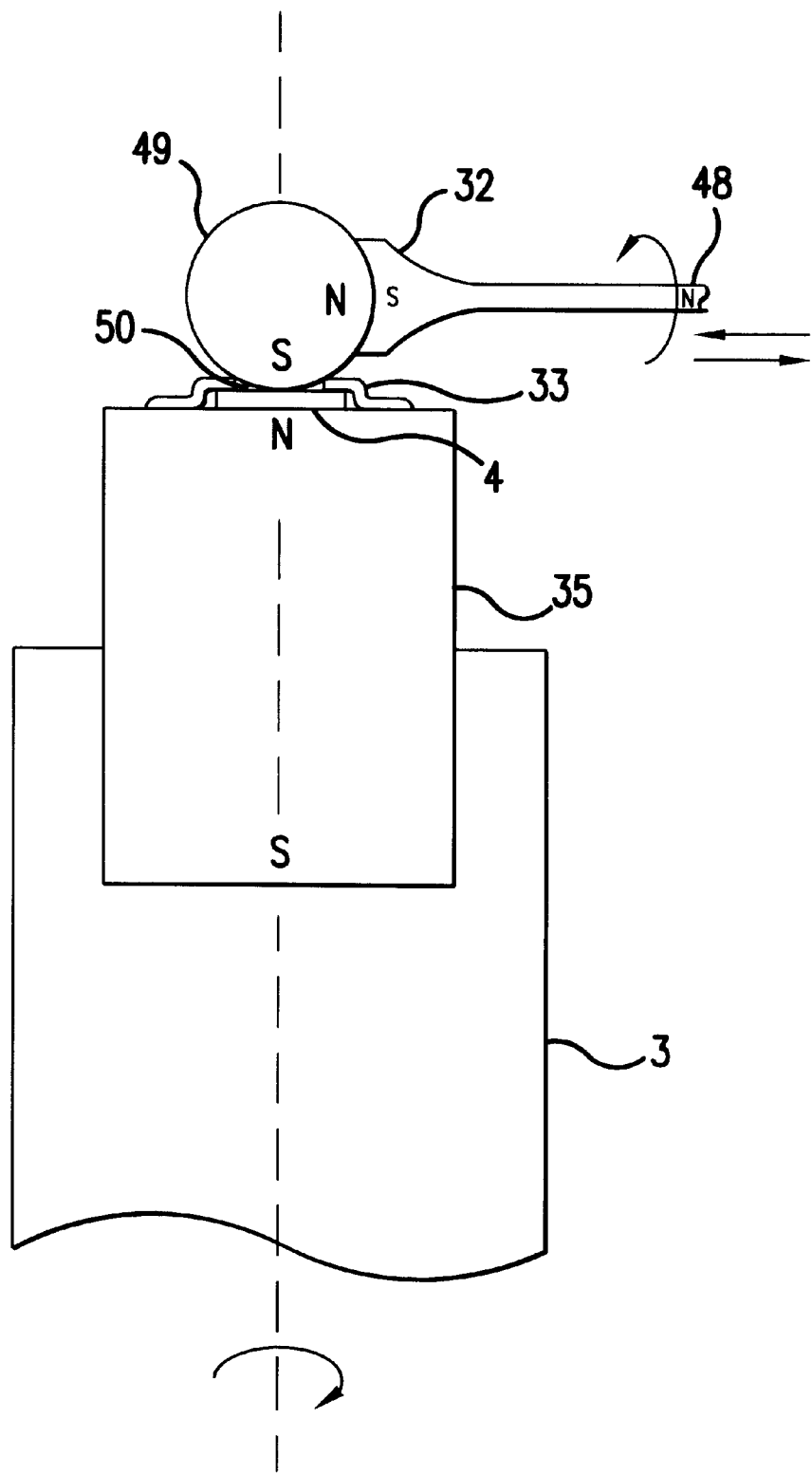

As shown in FIG. 18, a lapped material, such as quartz, is attached on the table 35, which is comprised of a magnet installed on the primary axis of the machine by means of the adhesive agent The magnet holder 48, which is rotated by an air turbine, is installed perpendicular to or at an arbitrary angle to the machining axis. The spherical whetstone 31, whose surface is coated with diamond lapping grains, is attracted by magnetic induction. At the same time, the lapping primary axis rotates at a rate of approximately 300 rpm. The spherical whetstone 31 rotates at nearly 8,000 rpm. The workpiece material 4, such as quartz as a heterogeneous crystal, is shaved precisely and lapped between them. Since the diameter of the magnet holder 48 is smaller than that of the table 35, the magnetic flux between the spherical whetstone 31 and the magnet holder 48 is stronger than that between the spherical whetstone 31 and the table 35. Therefore, as the spherical whetstone 31 made of the magnet attracted to the end of the magnet holder 48 in the shape of a cylinder or a similar geometrical shape, the spherical whetstone 31 and the magnet holder 48 are connected strongly. Moreover, the spherical whetstone 31 can be easily changed due to the magnetic induction of the grinding mount 35. Since the position of the spherical center is unchanged after the exchange, we can easily and effectively machine at a high accuracy by using for finishing a fine spherical whetstone 31 after a coarse spherical whetstone 31.

Figure 22:
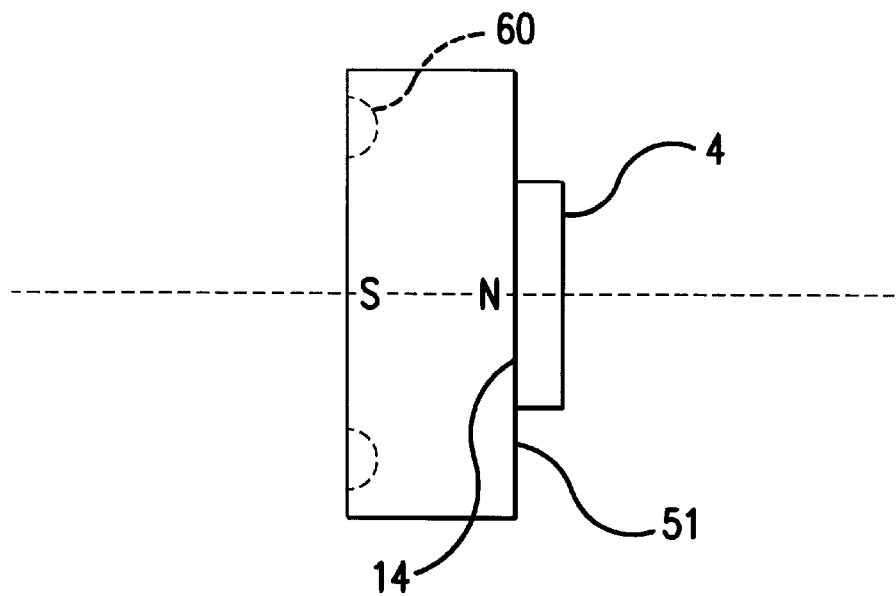
FIGS. 22 and 23 are a vertical cross section and a plan view, respectively, that show the magnetic table.
Figure 23:
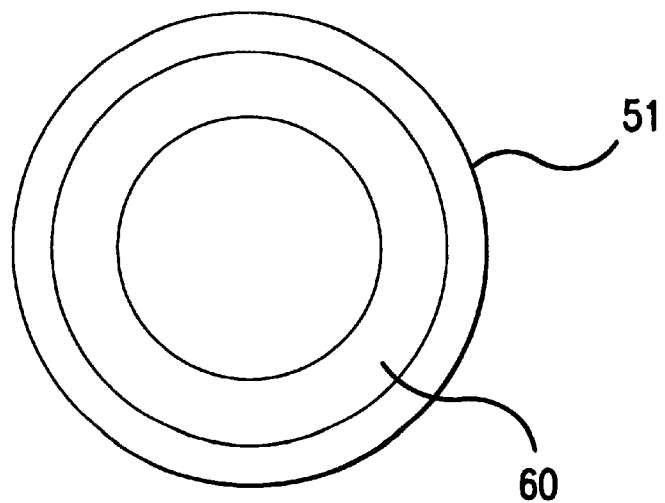
Figure 24:
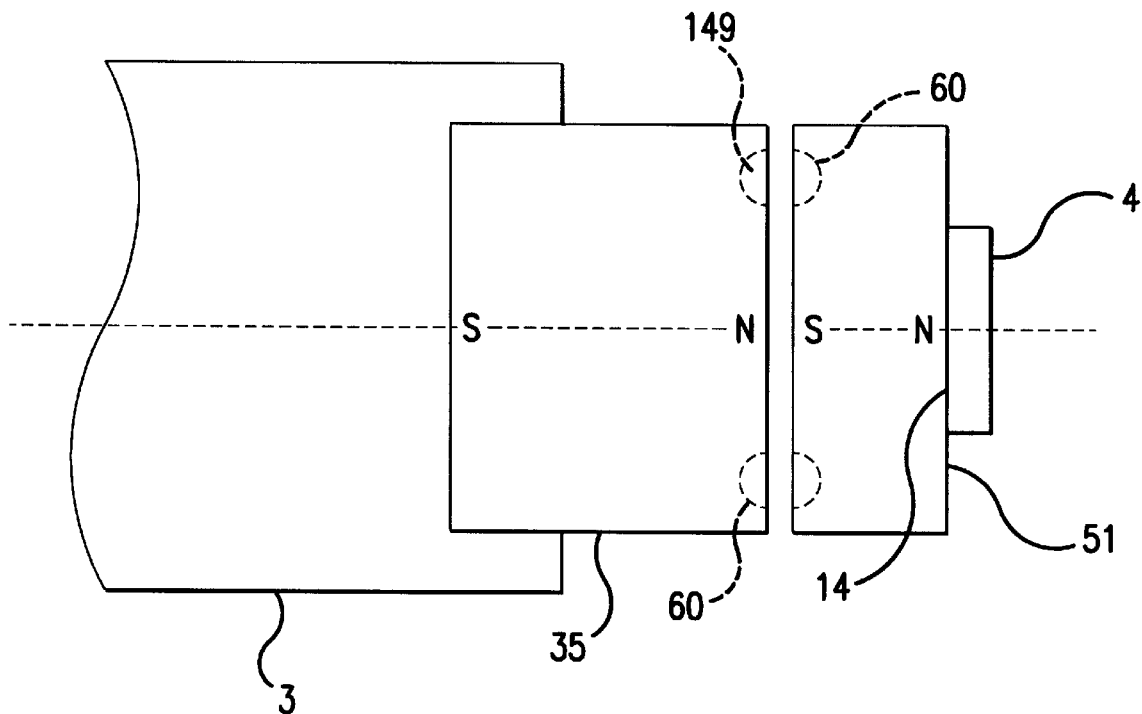
FIG. 24 is a vertical cross section of the lapping apparatus for quartz.

FIGS. 22 and 23 show a side view and back view, respectively, of the magnetic table 51, which is in the same cylindrical shape as that of the cylindrical grinding mount 35 made of the magnet. The back surface of the magnet table 51 has circular grooves. The workpiece material 4 made of a heterogeneous material such as quartz is attached at the center with pine resin, and the pine resin is mixed with wax, or another resin. Also, as seen in FIG. 25, the grooves 60 are installed at the central part of the table 35. FIG. 25 is a side view diagram of the present lapping apparatus for quartz. The circular grooves 60, which are machined on the magnetic table 51, and the grinding mount 35 are used along with ball bearings 149. The center line of the magnet table 51 becomes equal to that of grinding mount 35 due to the principle of slide bearing.

Figure 26:
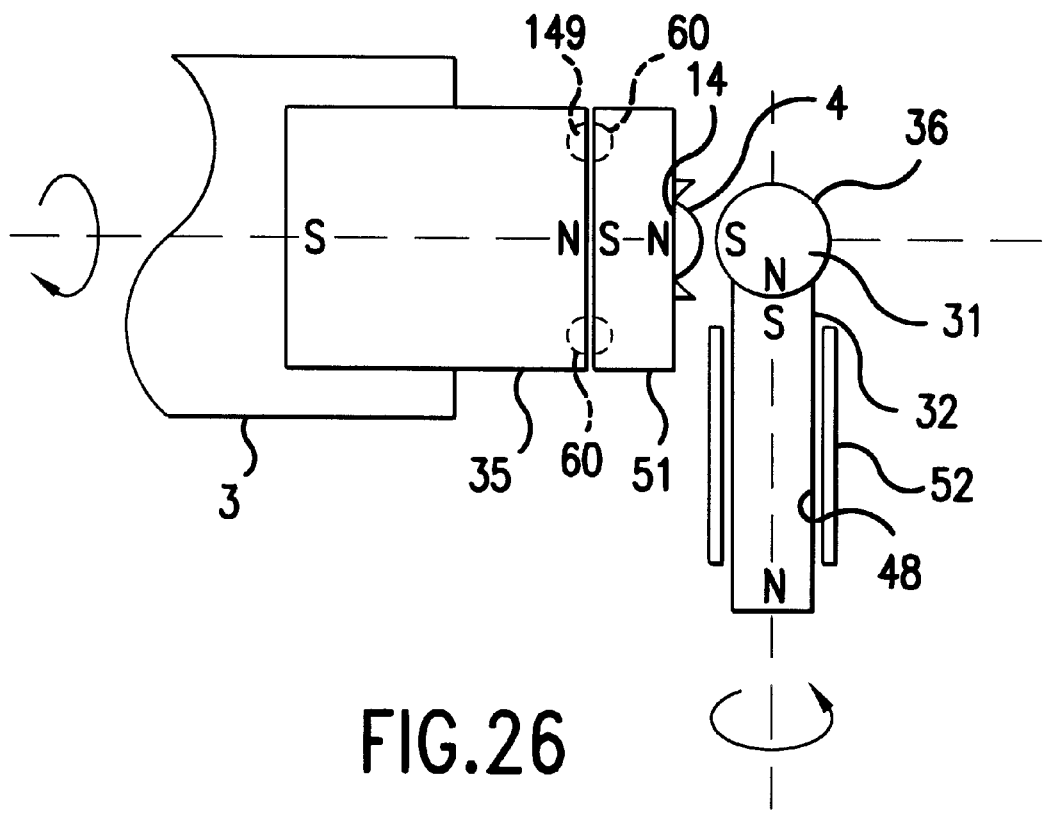
FIG. 26 is a vertical cross section of the lapping apparatus for said quartz.
Figure 27:
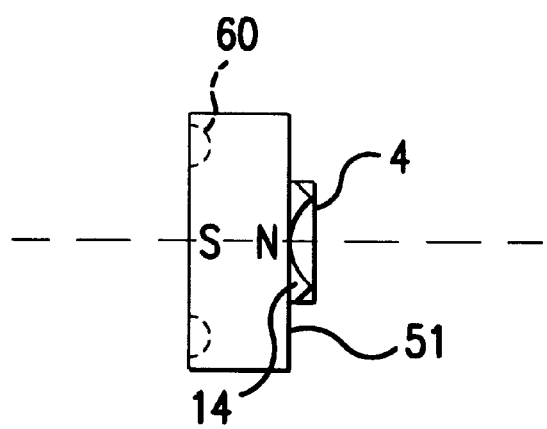
FIG. 27 is a vertical cross section of the magnetic plate of the present invention.
Figure 28:
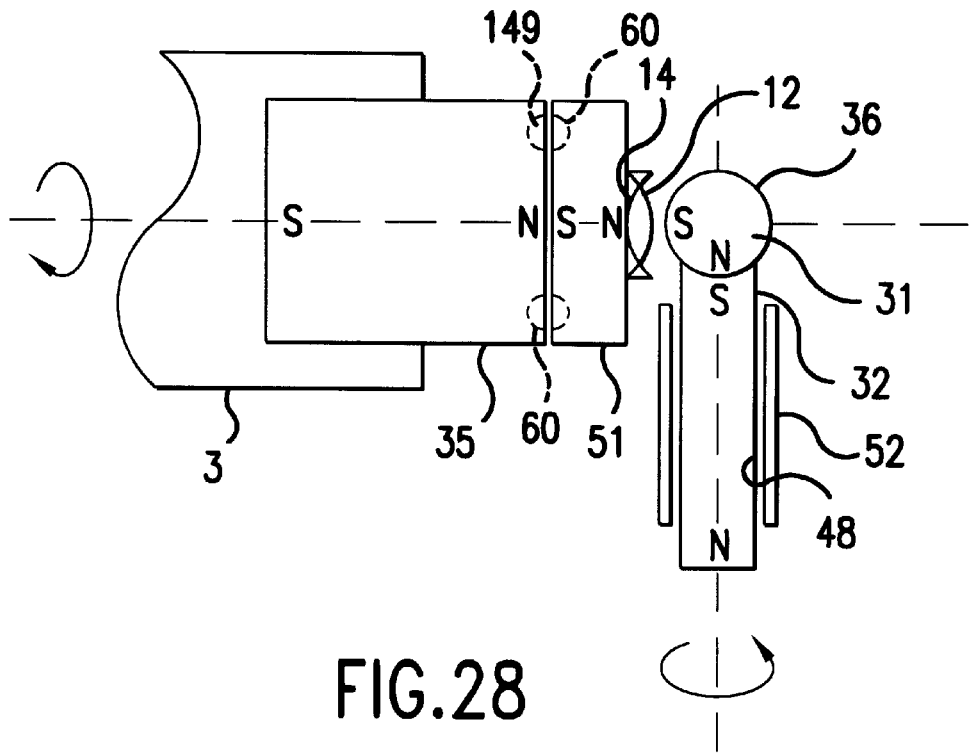
FIGS. 28–30 are vertical cross sections that show the lapping apparatus for quartz of the present invention.

FIG. 26 shows a lapping configuration for a lapping apparatus for quartz. The magnetic table 51 attached to the workpiece material 4 is connected to the central part of the grinding mount 35 installed at the side of the machining primary axis. The workpiece material 4 is machined in the shape shown in FIG. 27. Again as shown in FIG. 28, the central line of the magnet table 51 becomes equal to that of the workpiece material 4. The workpiece material 4 is attached with pine resin, pine resin mixed with wax, or another resin. Also, due to the principle of the slide bearing, the center line of the grinding mount 35 is equal to that of the magnet table 51 attached by facing the non-machined surface of the workpiece material 4 as well as by using the magnetic table 51, the circular grooves around the table 35, and the ball bearing 149. Then, the workpiece material 4 is machined by the spherical whetstone 31 and by rotating the non-machined surface of the spherical material 4 with the air turbine 52.

Figure 29:
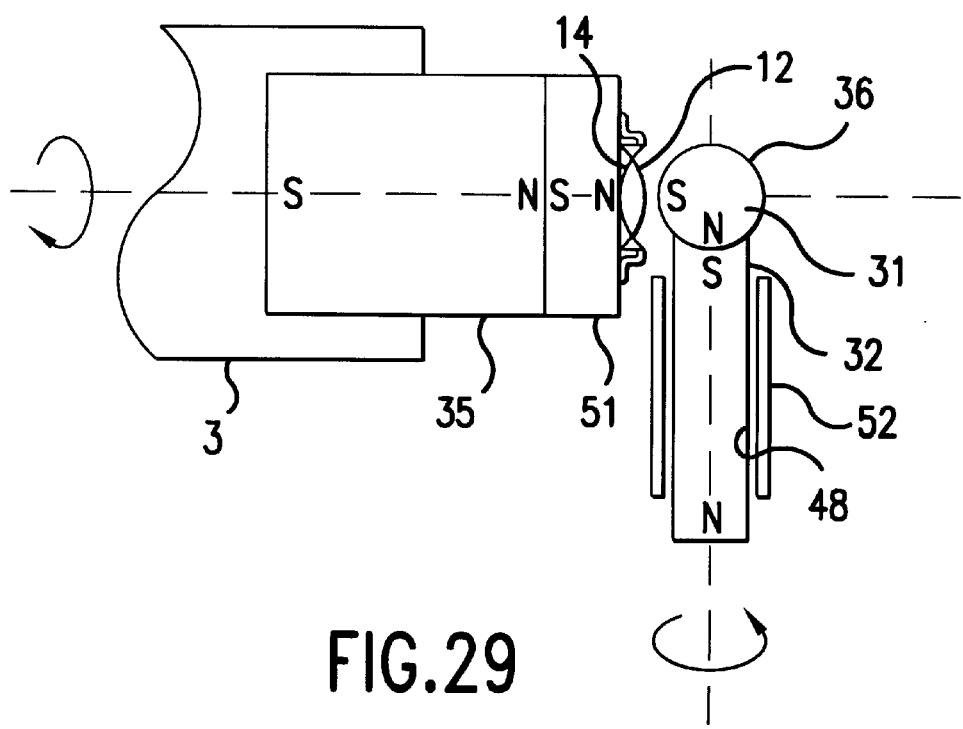
Figure 30:
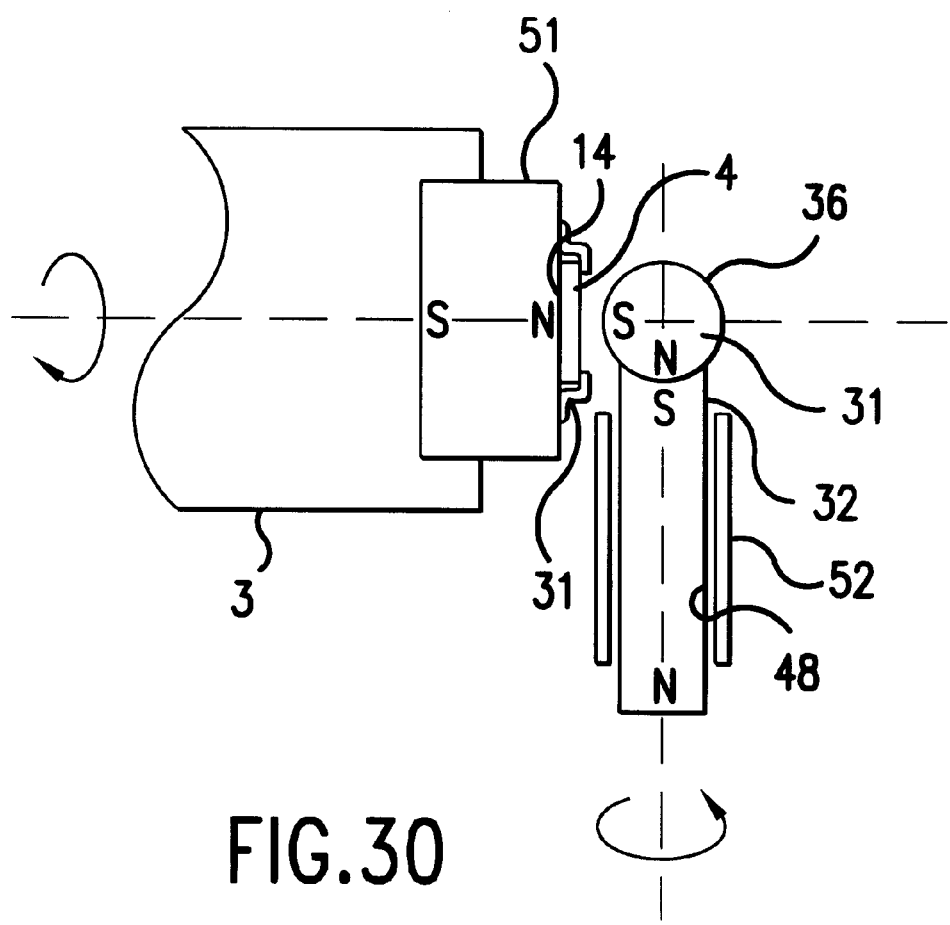

FIGS. 29 and 30 show the direct matching state between the center line of the grinding mount 35 and that of the magnetic table 51. In FIG. 30, the center line of the magnetic table 51 is directly connected to that of the chuck 3, and the lapped object 4 is machined.

Figure 31:
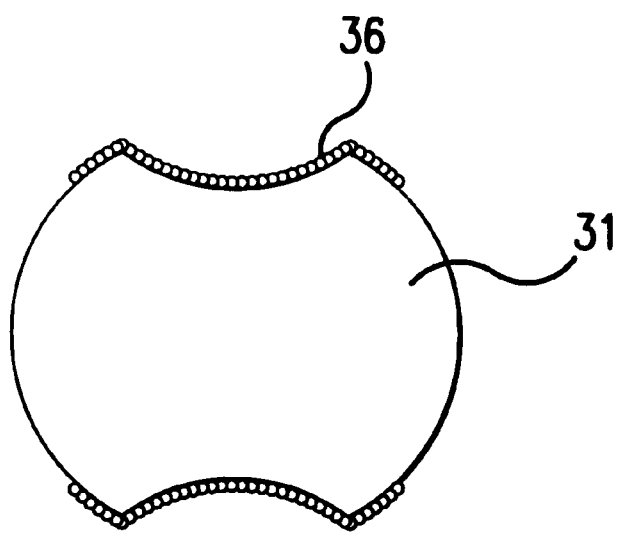
FIGS. 31 and 32 are vertical cross sections of the spherical whetstone of the present invention.

An example of the present invention shown in FIG. 31 is explained below. FIG. 31 is a schematic diagram of the structural drawings of how to machine quartz oscillators. FIGS. 31–41 are vertical cross sections. In these FIGS, number 3 is the chuck, 4 is the lapped material, 5 is the vacuum chuck, 31 is the spherical whetstone, 32 is the holding part, 33 is the adhesive film with a hole, 35 is the table, 36 is the whetstone surface, 48 is the magnet holder, 49 is the spherical grinding element, and 50 is the lapping grain.

Figure 32:
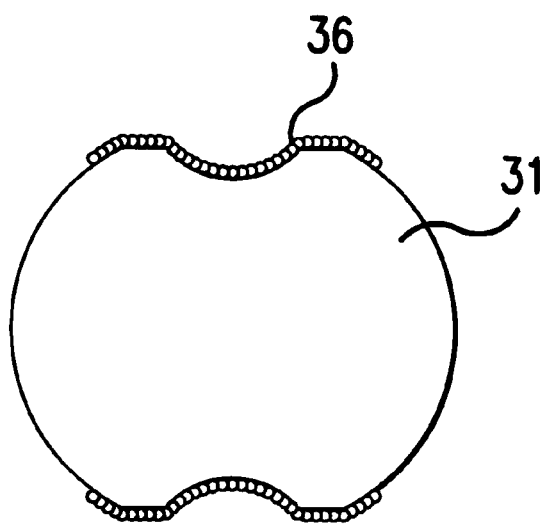

FIGS. 31 and 32 show the state of the lapping surface 36, which is formed partially on the spherical whetstone 31 by electroplating or electroless plating, on the spherical grinding element 49. Also the whetstone surface 36 can be formed totally on the spherical whetstone 31.

Figure 33:
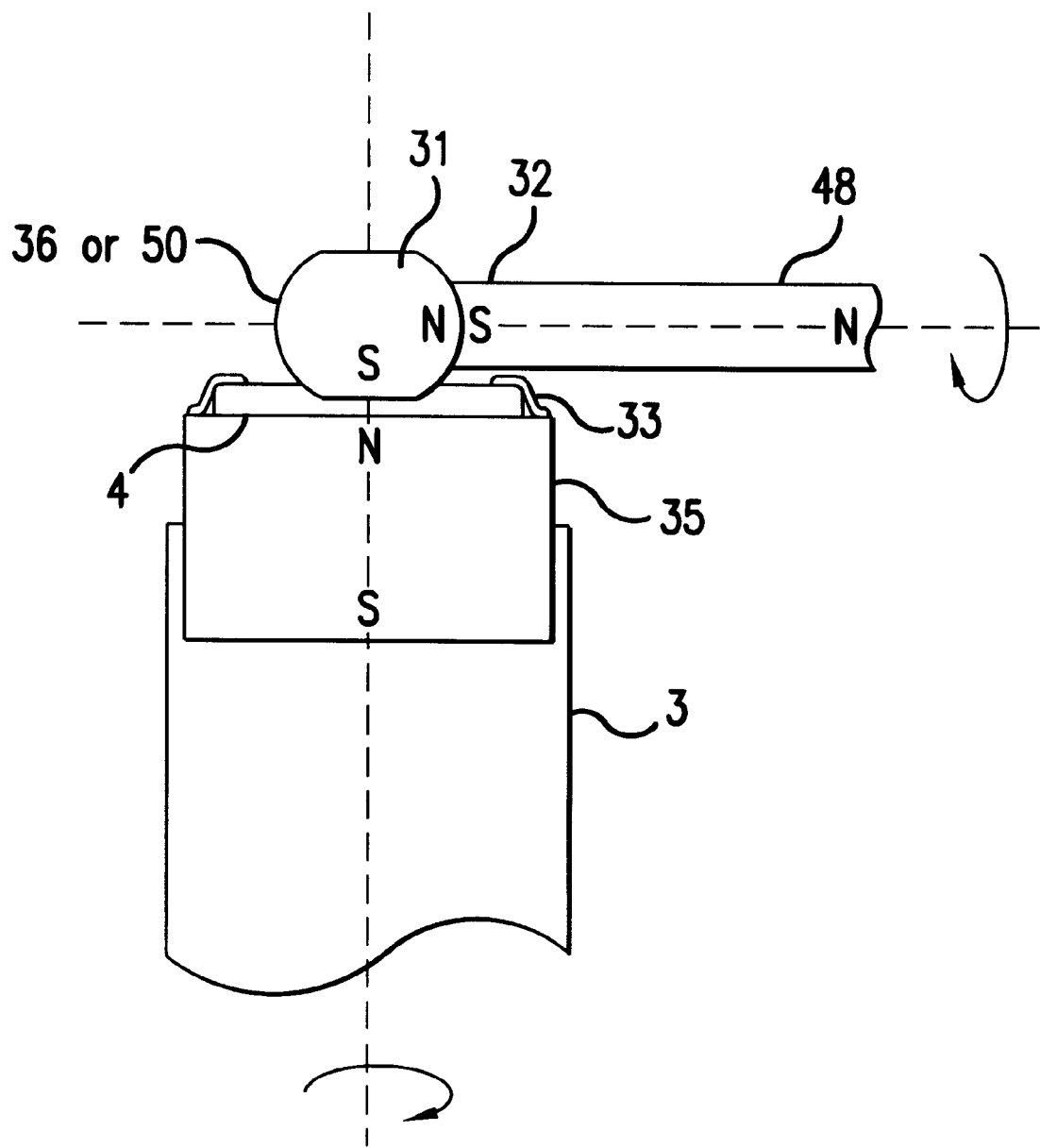
FIGS. 33–36 are vertical cross sections that show the lapping apparatus for quartz of the present invention.
Figure 34:
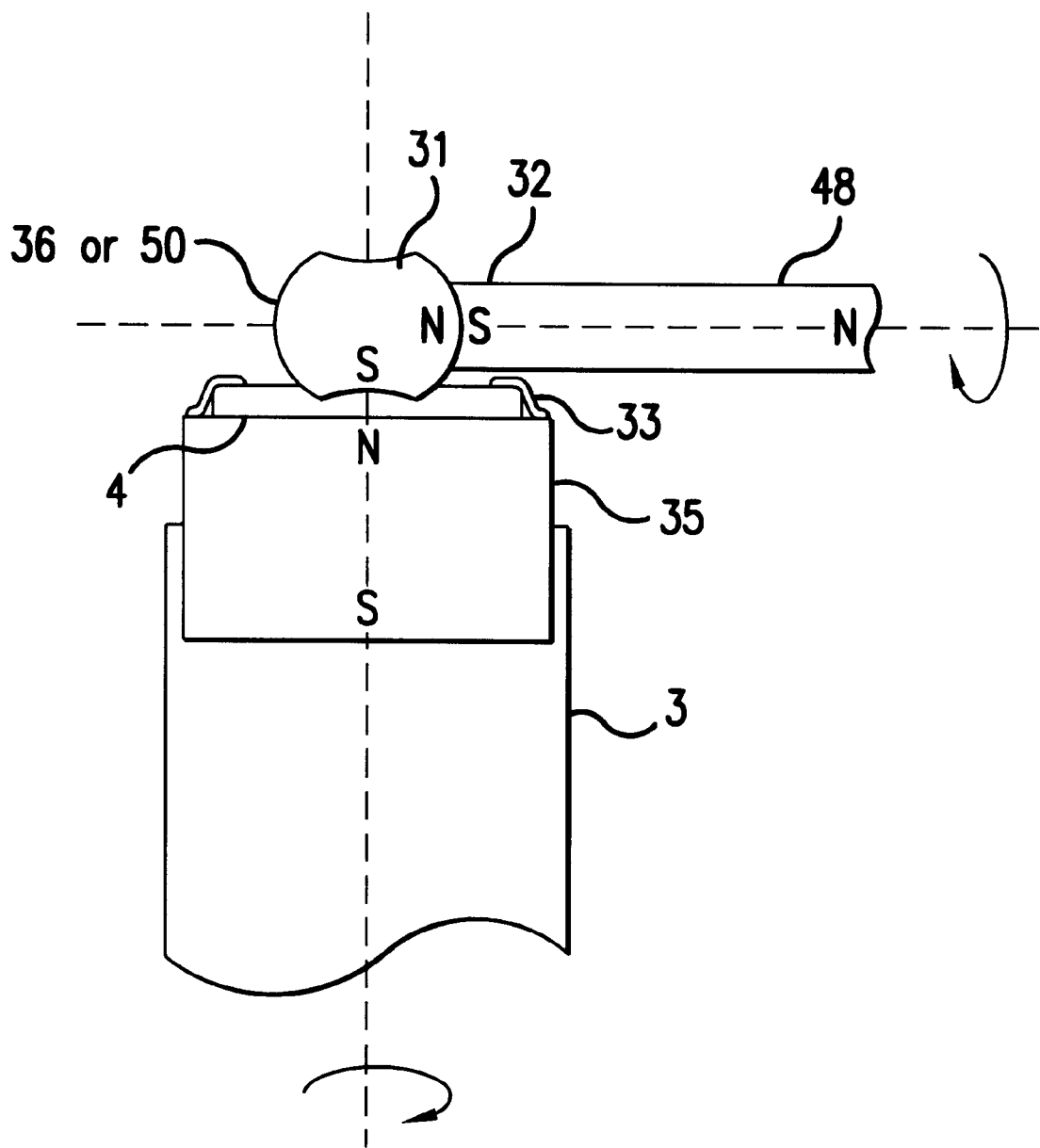
Figure 35:
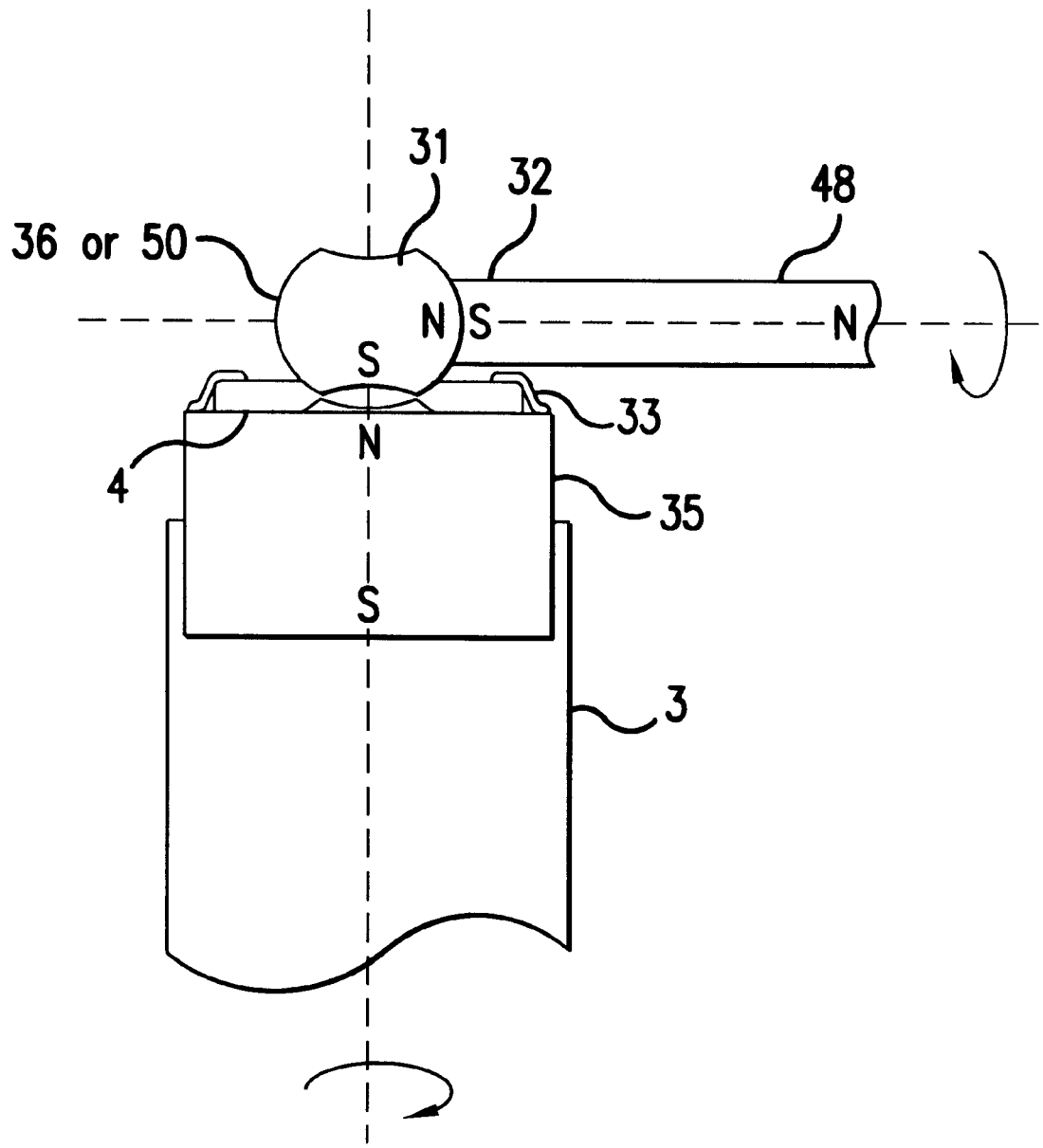
Figure 36:
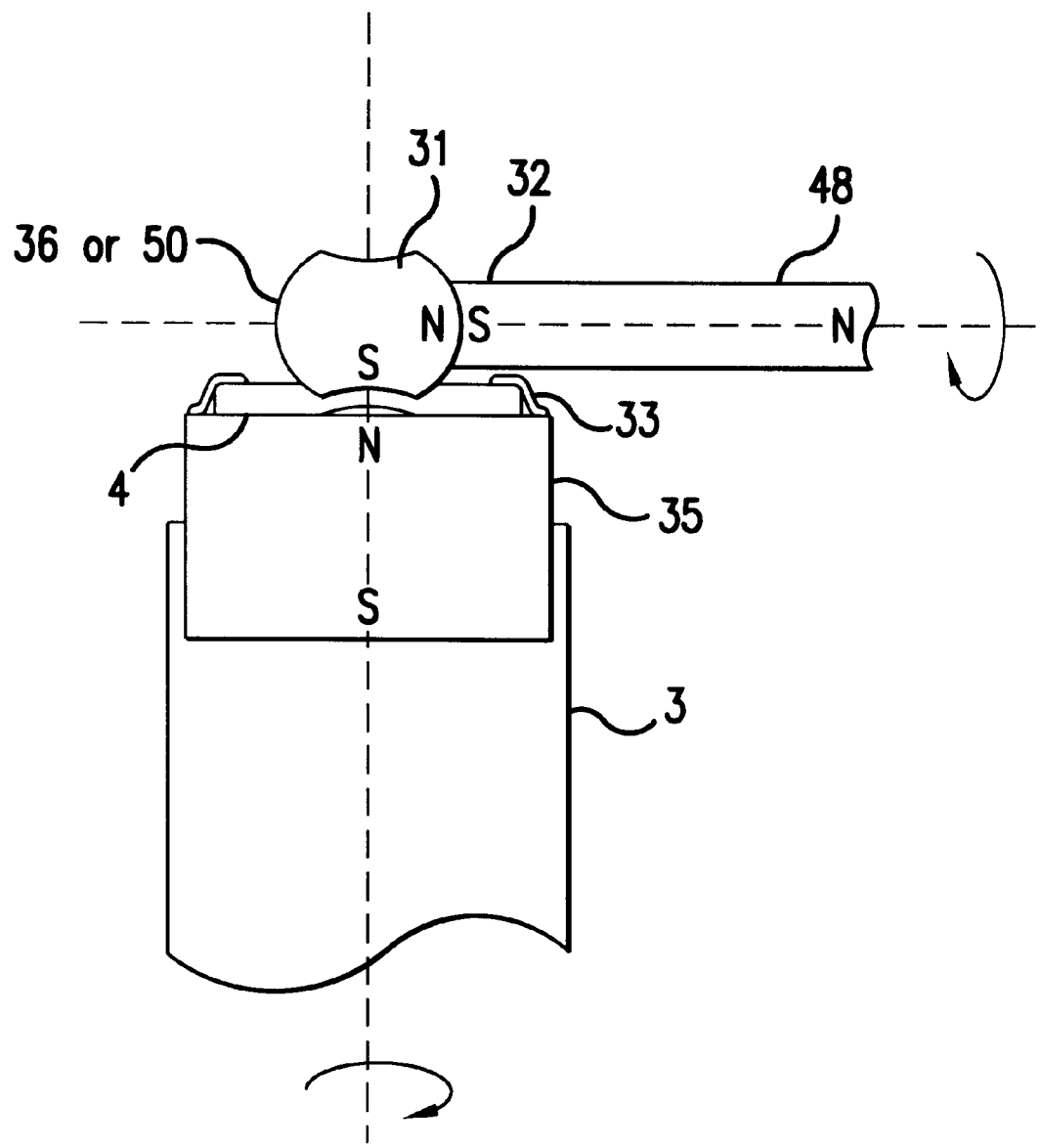

FIGS. 33 and 34 show the shaving or lapping state of the workpiece material 4 while the spherical whetstone 31 is attracted and fixed to the end part of the holder 32 at the tip of the magnet holder 48 by using the magnetic induction of the grinding mount 35 made of a magnet. The spherical whetstone 31 held at the end of the magnet holder 48 rotates at over 10,000 rpm. Also, the workpiece material 4 is shaved and lapped by rotating it as shown in FIGS. 33 and 34. The spherical whetstone 31 is attracted to the holder 32 at the end of the magnet holder 48 due to the magnetic induction of the table 35. The workpiece material 4 is sandwiched between the grinding mount 35 and the spherical whetstone 31. Thus, whenever the workpiece material 4 is machined in an extremely thin state it will not be destroyed, even if it is impacted by vibration due to machining errors or other reasons, and the workpiece material 4 can be shaved and machined precisely. FIGS. 35 and 36 show the lapping and machining processes of the finished lapped material 12 in the shapes of convex and concave lenses.

Figure 37:
FIGS. 37–41 are vertical cross sections that show the object machined by the lapping process of the present invention.
Figure 38:
Figure 39:
Figure 40:
Figure 41:
Figure 42:
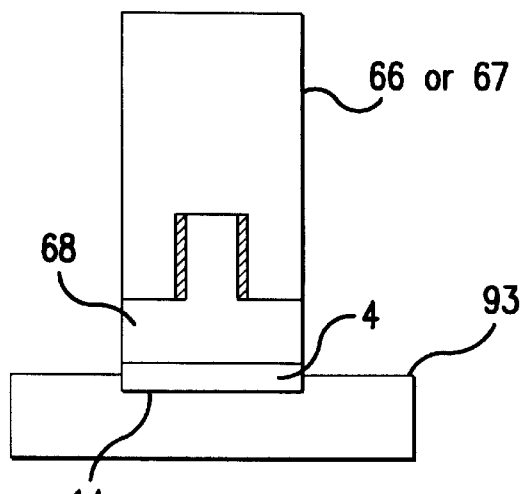
FIGS. 42–44 are vertical cross sections that show a holding method example for lapped material of the present invention.

FIGS. 37–41 show the finished lapped material 12, which is shaved and machined from the workpiece material 4 by the spherical whetstone 31 in FIGS. 30, 31 and 32 by the method seen in FIGS. 14, 15, 16, 18, 28, 29, 33, 34, 35, and 36. FIG. 37 shows the finished lapped material 12 in a planar shape. FIG. 38 shows the finished lapped material 12 in a plano-convex shape, FIG. 39 in a convex lens shape, and FIGS. 40 and 41 in a concave lens shape.

FIGS. 42 through 49 show the state of the workpiece material 4 contacted and attached to the magnetic table 51 or a staggered magnetic table 93, whose U-shaped part is attached with a heated resin such as pine resin. The workpiece material 4 is installed on the table. Pressure is imposed on the workpiece material 4 by the magnetic force of the magnetic table 51 and the staggered magnetic table 93, as well as by using a cylindrical shaped object 66 or a cylindrical shaped magnet 67 on the cylindrical shaped object 66, which is made of iron capped by a plastic part 68 on the workpiece material 4. The plastic part 68 at the end of the cylindrical object 66 or the cylindrical magnet 67 is made from polycarbonate or other materials. The central part of the plastic part 68 is in a hollow cylindrical shape. It is similar to a screw or a bolt Then, the workpiece material 4 is attached to the magnet table 51 by the pressure of the magnetic force from the magnet table 51, and even an extremely thin lapped material, such as quartz, cannot be ruptured.

Figure 43:
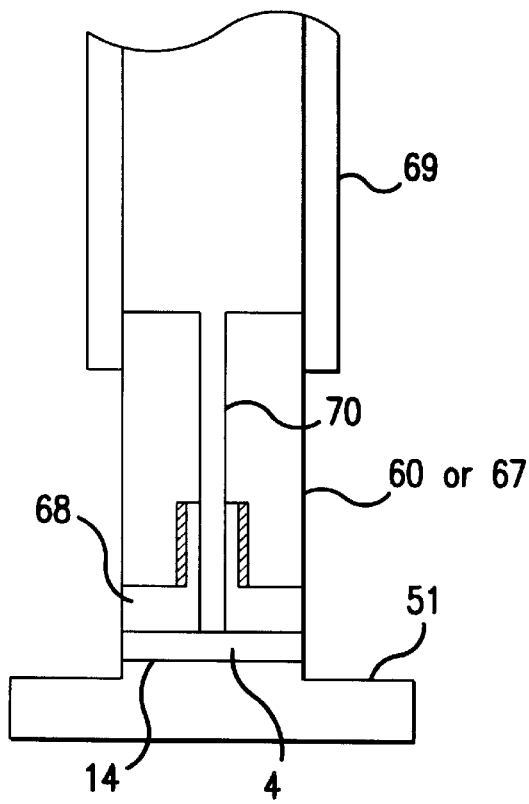
Figure 44:
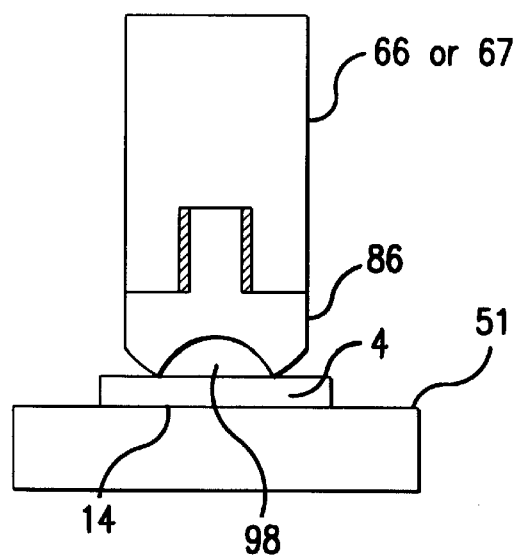
Figure 45:
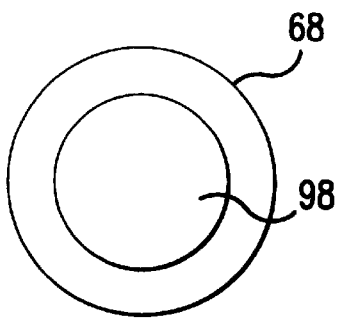
FIGS. 45–49 are a plan showing an example of the plastic part that holds the lapped material.
Figure 46:
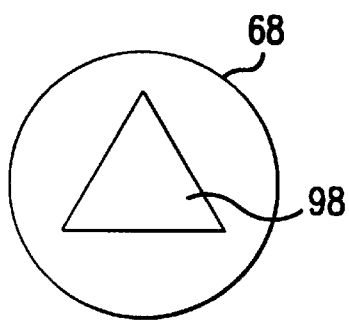
Figure 47:
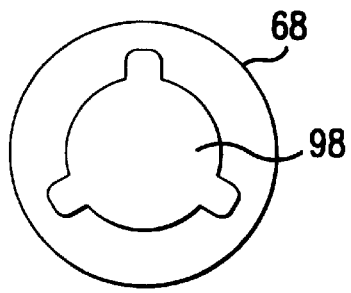
Figure 48:
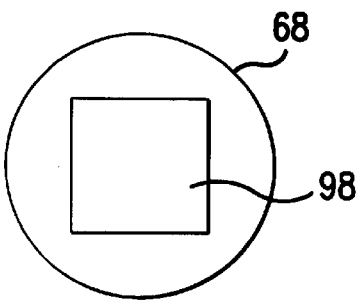
Figure 49:
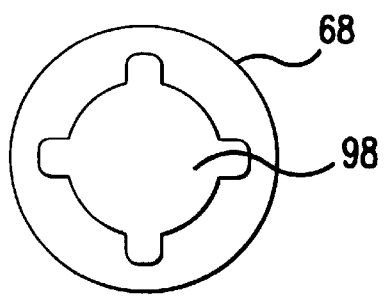

FIG. 43 shows the workpiece material 4 connected to the plastic part 68 by the tip attraction pressure of a vacuum tube 69 through a hole 70 of the cylindrical object 66 or the cylindrical magnet 67. Moreover, the magnetic table 51 is formed in a convex shape in order to ease the positioning of the attached workpiece material 4. The workpiece material 4 is attached with adhesive 14 on the convex part.

Figure 51:
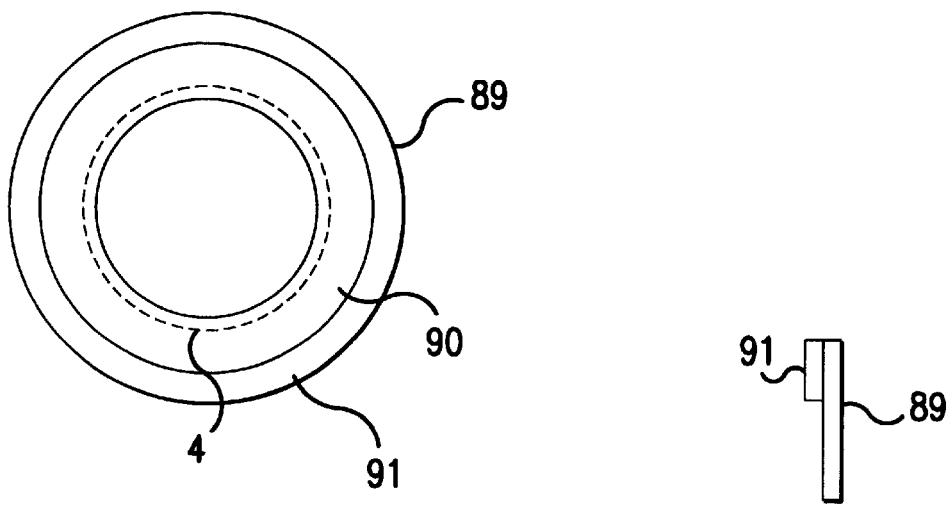
FIGS. 51 and 52 are a front view and a plan view, respectively, that show the doughnut-shaped plate that connects the lapped material to the magnetic plate.
Figure 52:
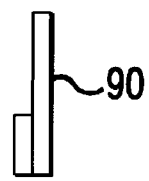

FIGS. 51 and 52 are, respectively, the front view and a cross section that show a doughnut-shaped table 89 used to connect the workpiece material 4 to the magnetic table 51.

Figure 50:
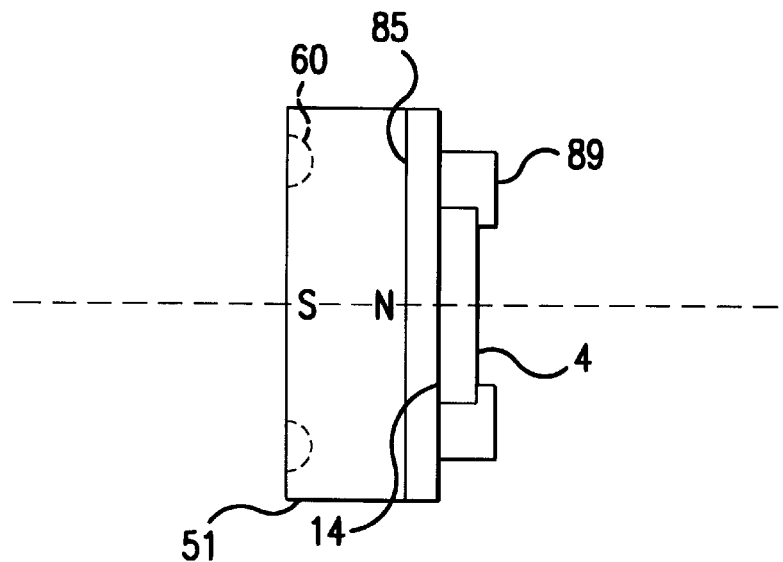
FIG. 50 is a vertical cross section of the assembled state for the lapped material with a magnetic plate.

FIG. 50 is a side view of the doughnut-shaped table 89, which is connected to the magnetic table 51. The doughnut-shaped table 89 is comprised of a sandwich structure of a thin, non-magnetic plate 90 and a magnetic ring 91. As shown in FIG. 50, the heterogeneous crystal workpiece material 4 is attached directly by the magnetic force of the magnetic table 51 to the surface center of the cylindrical magnetic table 51 similar to the diameter of magnetic cylindrical table 35, or else the workpiece material 4 is attached by the surface tension of the water on the surface of a piece of wet suede 85 on the magnetic table 51. Also, the workpiece material 4 can be attached to the magnetic table 51 with pine resin or a mixed resin of wax and other materials.

Figure 53:
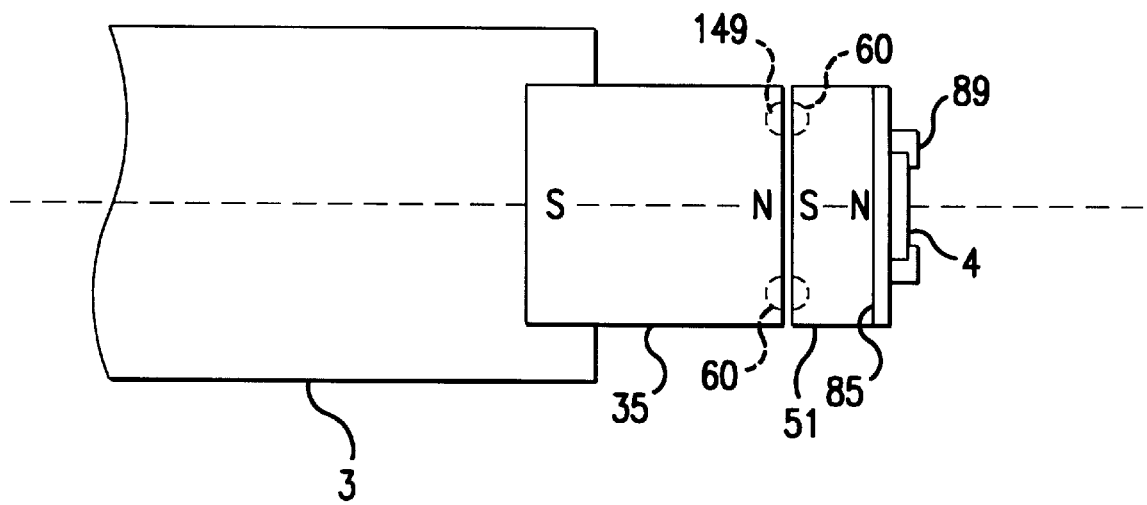
FIGS. 53 and 54 are vertical cross sections of the lapping apparatus for quartz of the present invention.
Figure 54:
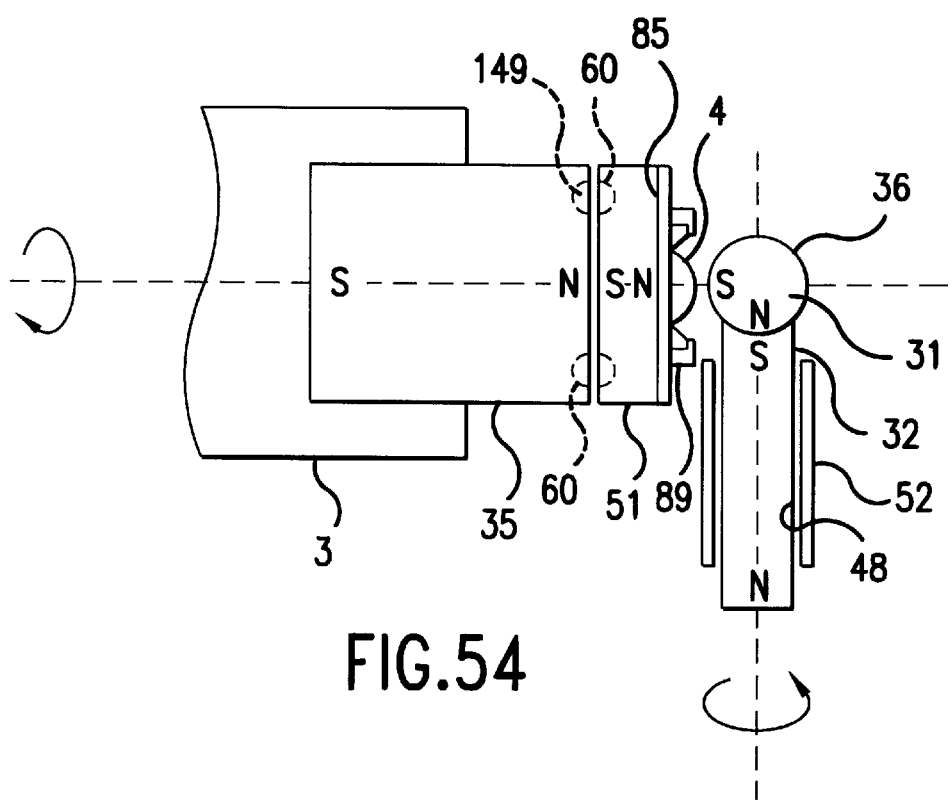
Figure 55:
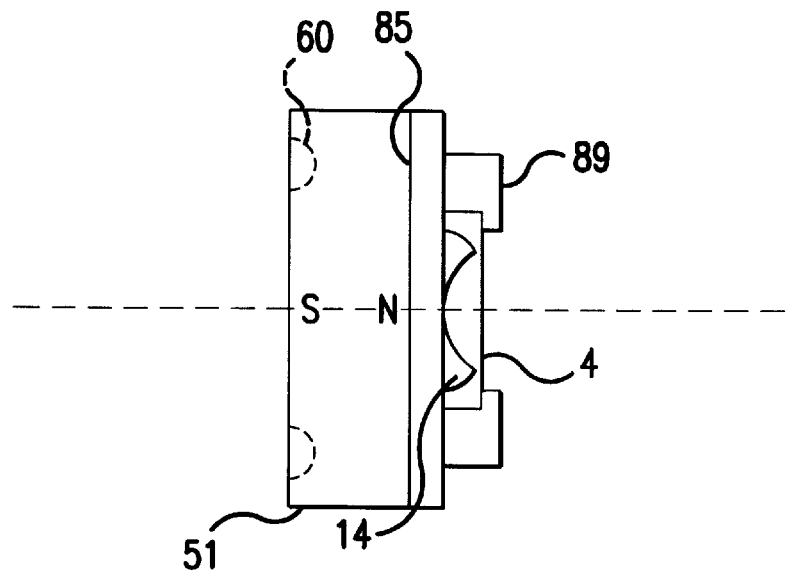
FIG. 55 is a vertical cross section that shows the assembled state of the lapped material.
Figure 56:
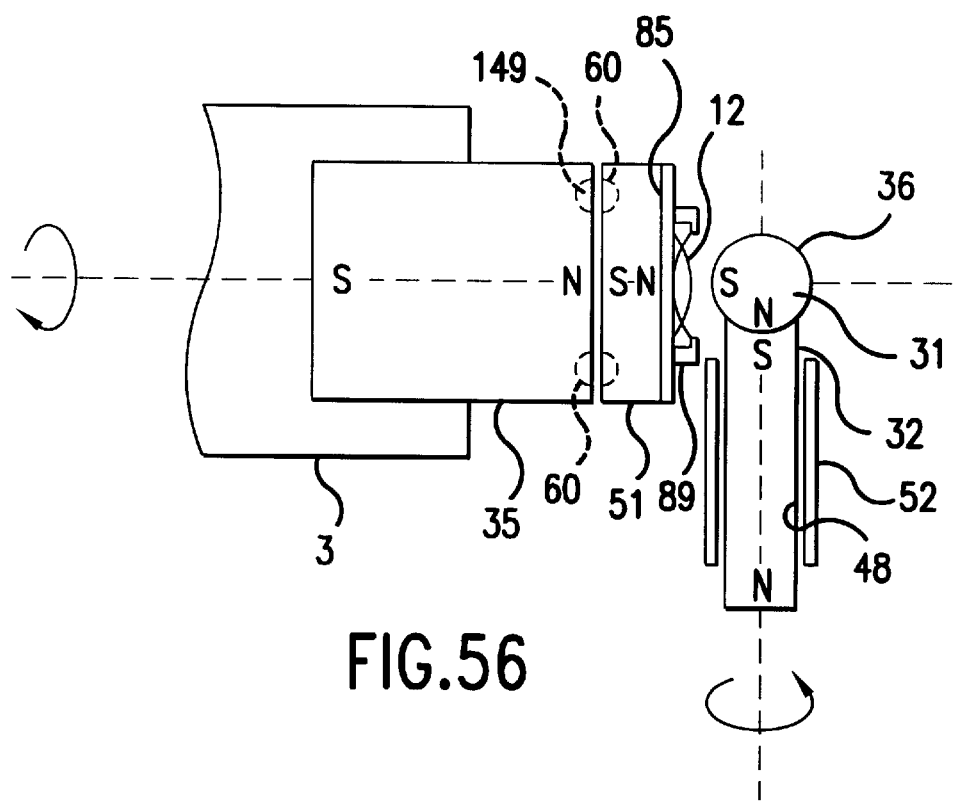
FIGS. 56–58 are vertical cross sections that show the lapping apparatus for quartz of the present invention.
Figure 57:
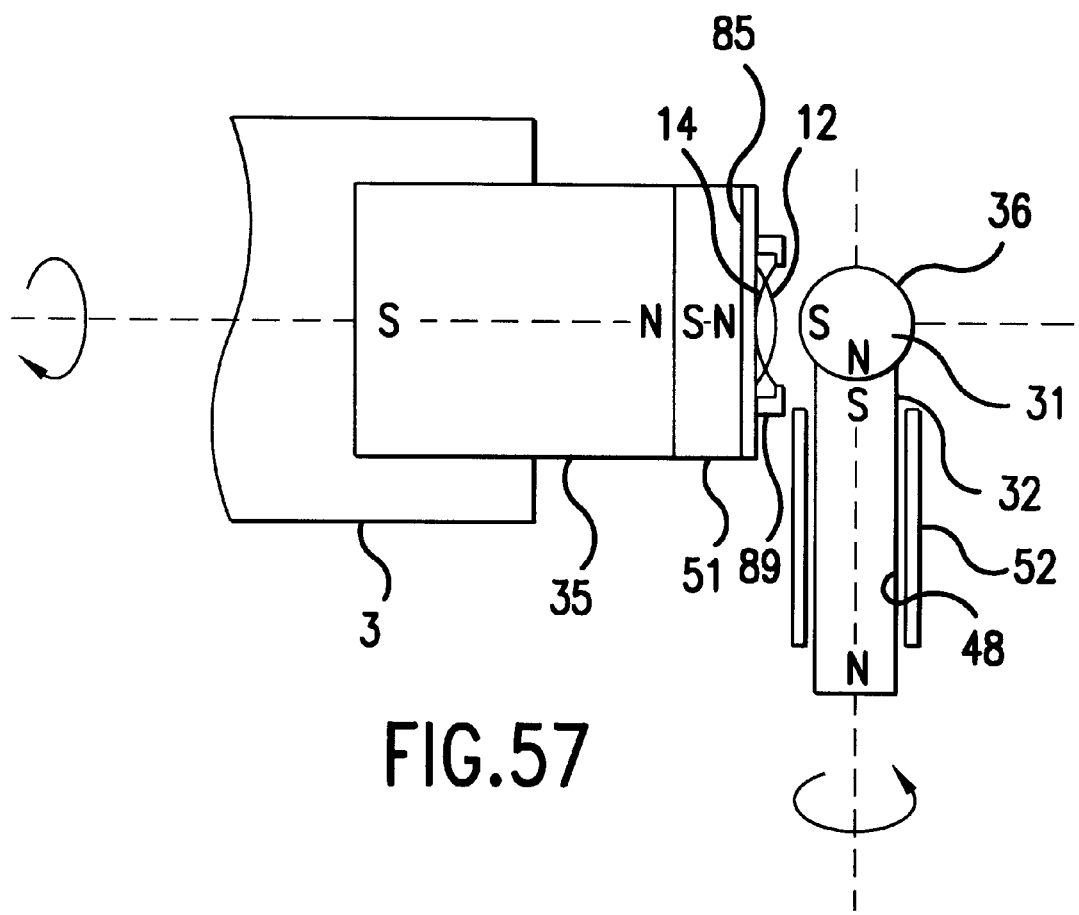
Figure 58:
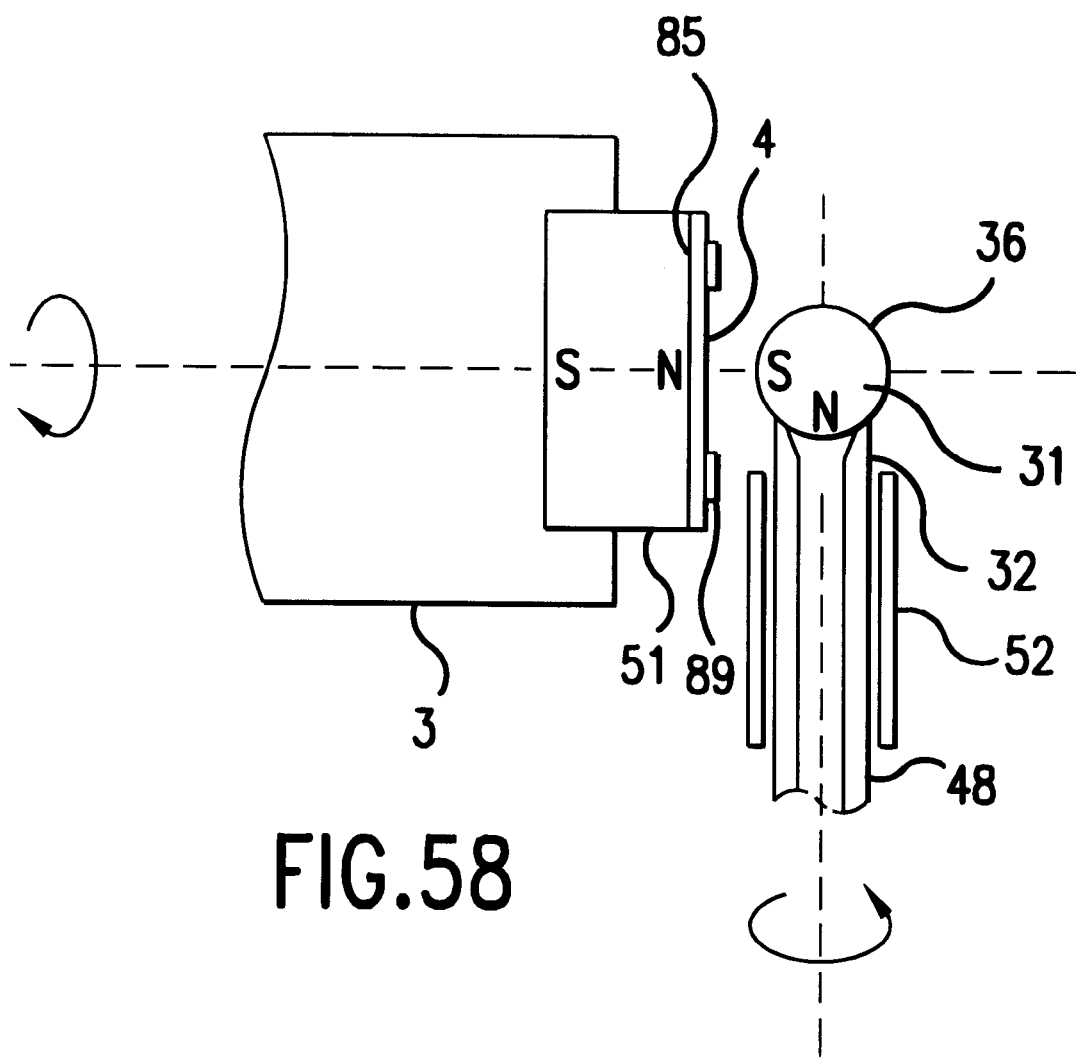

FIG. 53 shows the absorbed state of the magnetic table 51, which is attached to the workpiece material 4, on the central part of the table 35, which is in a spherical shape and is installed at the side of the mechanical primary axis. In order to match the central axis of the magnetic table 51 to that of the table 35, the central axis of the magnetic table 51 is made identical to that of the grinding mount 35 by utilizing the principle of the slide bearing with plural ball bearing 149 and grooves 60, which are machined on the circumference of the magnetic table 51 and the table 35. After the workpiece material 4 is machined by the spherical whetstone 31 as shown in FIG. 54, the central axis of the magnetic table 51 is matched to that of the lapping surface for the workpiece material 4, and the workpiece material 4 is attached on the magnetic table 51 by using resins etc. as shown in FIG. 55. Again, by using the slide bearing principle that uses the ball bearings 149 and the grooves 60 made on the magnetic table 51 and the circumference of the table 35, the non-lapped surface of the workpiece material 4 is machined by rotating the air turbine 52. FIGS. 57 and 58 show the lapping process of the workpiece material 4 when the magnetic table 51 is directly connected to the table 35, whose cylindrical shape is exactly identical to the magnetic table 51.

FIG. 57 shows the lapping process of the workpiece material 4 when the magnetic table 51 is attracted to the central axis of the magnetic chuck 3 by magnetic force. Also, FIG. 58 shows the lapping state of the workpiece material 4, where the spherical shaped whetstone 31 is supported by force of the magnetic holder 48 or the vacuum chuck 5 in a cylindrical or conical shape.

Figure 59:
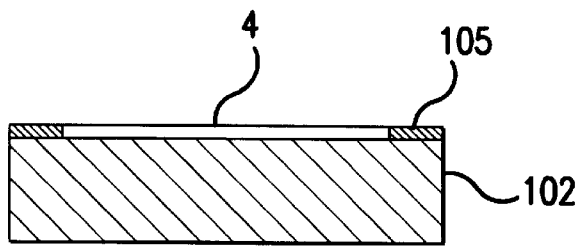
FIGS. 59–61 are vertical cross sections that show one holding method for the lapped material.

FIG. 59 shows that the workpiece material 4, where one side or both sides are shaved and lapped, is thickly attached with an adhesive 14 on the surface of a cylindrical shaped part 102. FIG. 59 also shows that the workpiece material 4 becomes thicker when a ring-shaped holder 105, which is as thick as the workpiece material 4 and is made from aluminum or other materials, is simply placed without the adhesive 14 around the exterior surface of the workpiece material 4. One side is lapped with a cylindrical shaped part 102, which is made from plastics, metals such as aluminum and super steel, or other materials. The other side of the workpiece material 4 is lapped with the ring-shaped holder 105 by using a carrier of a two-sided lapping machine. Then, an ultra thin example 12 can be easily lapped. Furthermore, the two-sided lapping machine enables the parallel, planer and flat surface to easily obtain higher accuracy.

Figure 60:
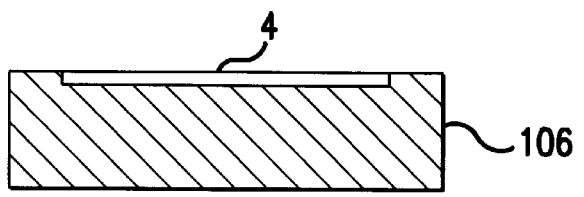

FIG. 60 shows a circular U-shaped part 106, which is approximately as thick as or nearly as high as the workpiece material 4 where one or both sides are lapped, which is machined or molded by using plastics or metals such as aluminum. The workpiece material 4 is attached with the adhesive 14 on part of the U-shaped part 106, or else the workpiece material 4 is simply connected to the U-shaped part 106 without the adhesive 14. As seen in FIG. 59, the exterior part of the workpiece material 4 is formed and protected by the ring-shaped holder 105, whose height is equal to or less than that of the workpiece material 4. A U-shaped part 106 makes the workpiece material 4 thicker. This is because the workpiece material 4 is attached with the adhesive 14 on part of the U-shaped part 106 or it is simply connected without the adhesive 14. One side is lapped with the U-shaped part 106 made from plastics or metals such as aluminum by using a carrier of a two-sided lapping machine. The other side is lapped with both the workpiece material 4 and the ring-shaped part of the U-shaped part 106 around the workpiece material 4. Then, the ultra thin sample 12 is easily lapped in the way shown in FIG. 59.

Figure 61:
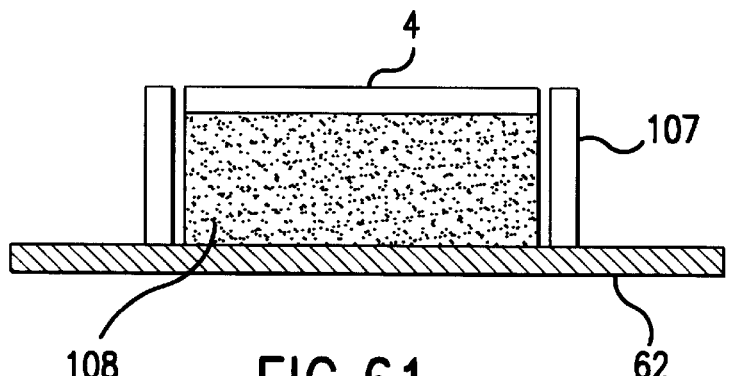
Figure 62:
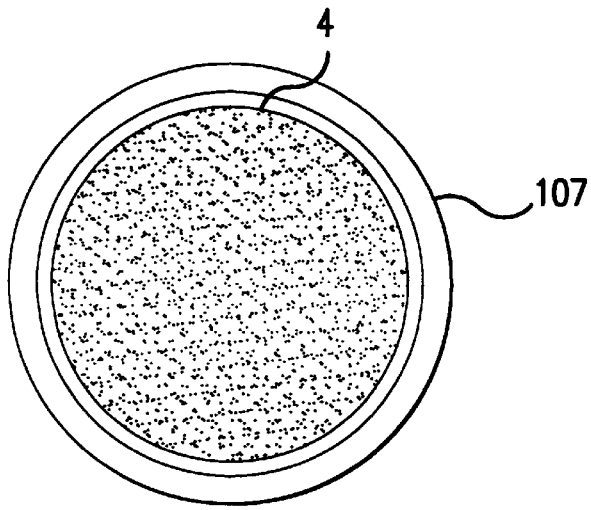
FIG. 62 is the plan for FIG. 61.
Figure 63:
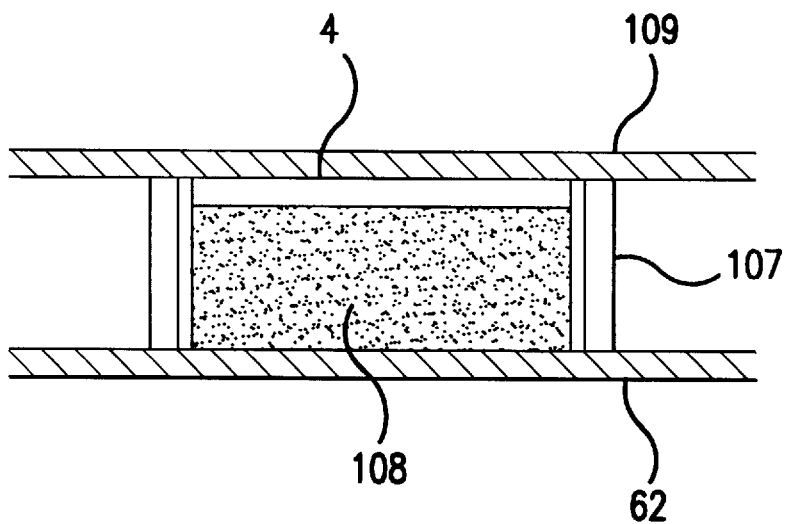
FIG. 63 is a vertical cross section that shows another holding method for the lapped material.
Figure 64:
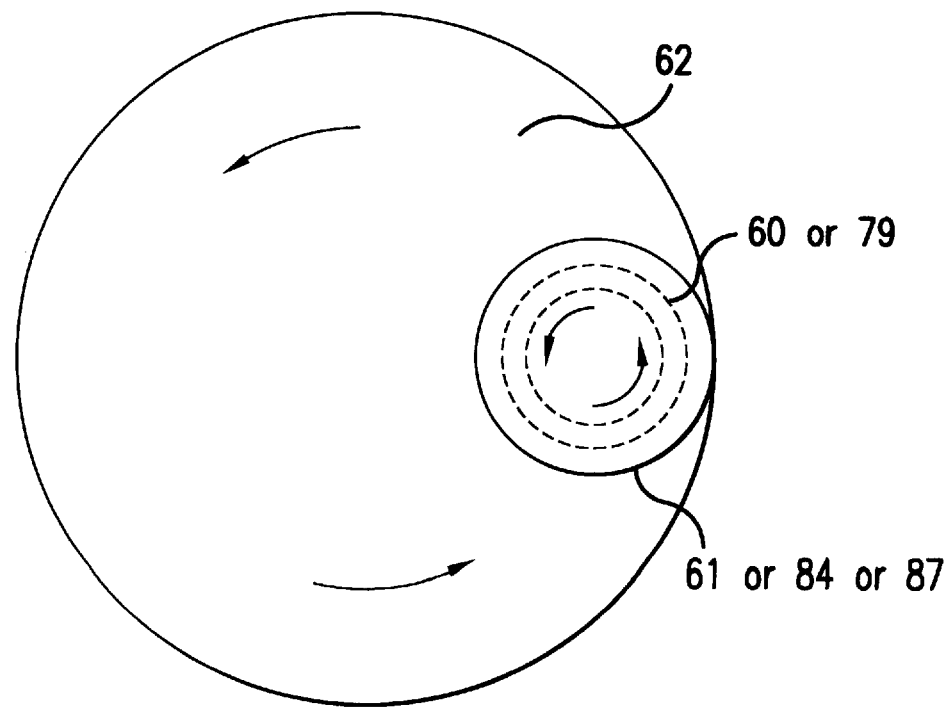
FIG. 64 is the plan for the lapping state during the starring motion (rotation and revolution) of the lapped material of the present invention.
Figure 65:
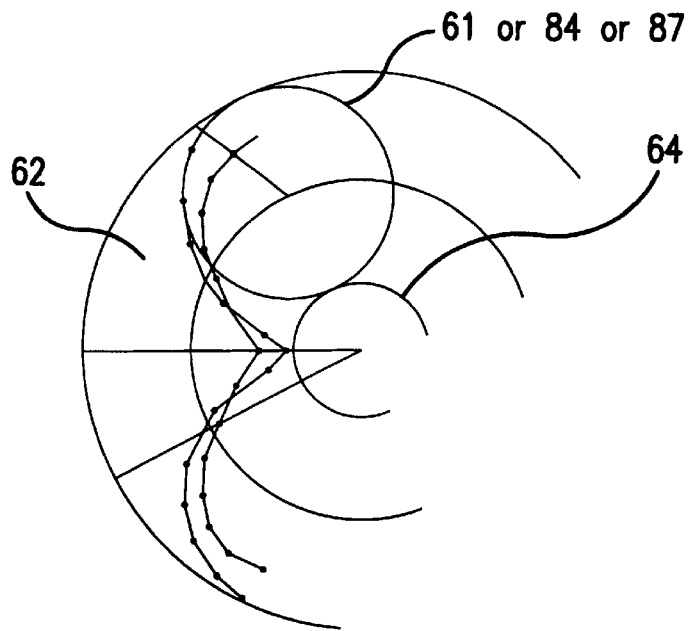
FIG. 65 illustrates the locus of the starring motion.

FIGS. 61 and 62 show how a hollow cylindrical material 107 made from metals such as aluminum is placed on the lower surface of a lapping plate 62. The cylindrical material 108 is inserted into the hollow cylindrical material 107, and is a little shorter. The workpiece material 4 is thicker because it is attached on the exterior surface of the cylindrical material 108 by the adhesive 14, or because the workpiece material 4 is simply connected without the adhesive 14. As shown in FIG. 63, the upper lapping plate 109 and the lower lapping plate 62 are used to employ the carrier of a two-sided lapping machine. As seen in FIGS. 64 and 65, the structure, which is composed of the hollow cylindrical material 107, the cylindrical material 108, and the workpiece material 4, rotates and revolves in a planetary manner. One side laps the upper surface of the workpiece material 4 with the lapping plate 109. The other side laps the lower side of the cylindrical material 108 by the lapping plate 62. The ultra thin lapped material 12 is easily machined.

Figure 66:
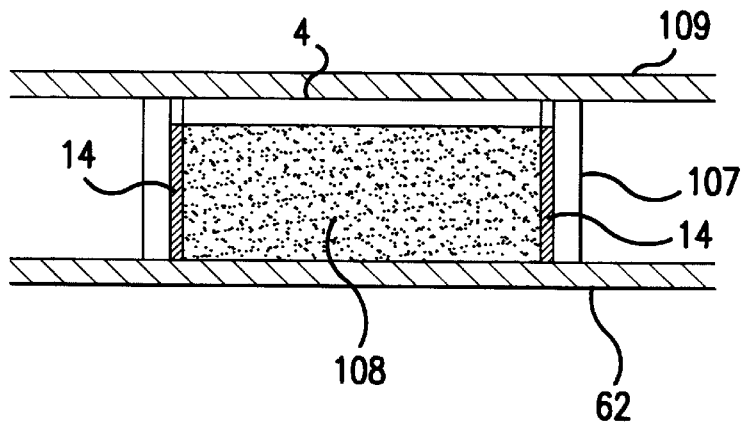
FIGS. 66 and 67 are vertical cross sections that show a holding example for the lapped material.
Figure 67:
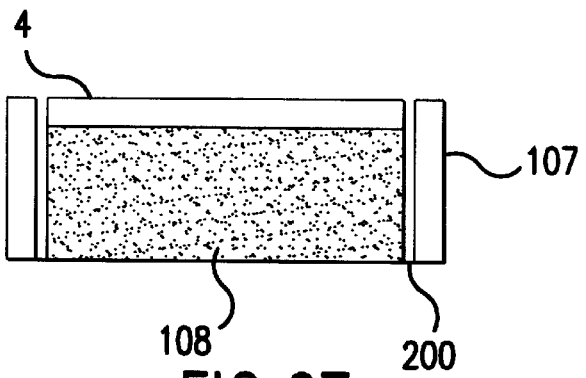

As shown in FIG. 66, the same effect that is seen in FIGS. 61–63 can be obtained, although the separate hollow cylindrical material 107 and the cylindrical material 108 are combined by the adhesive 14 or by a one-sided adhesive tape 200 between the hollow cylindrical material 107 and the cylindrical material 108 as seen in FIG. 67.

Figure 68:
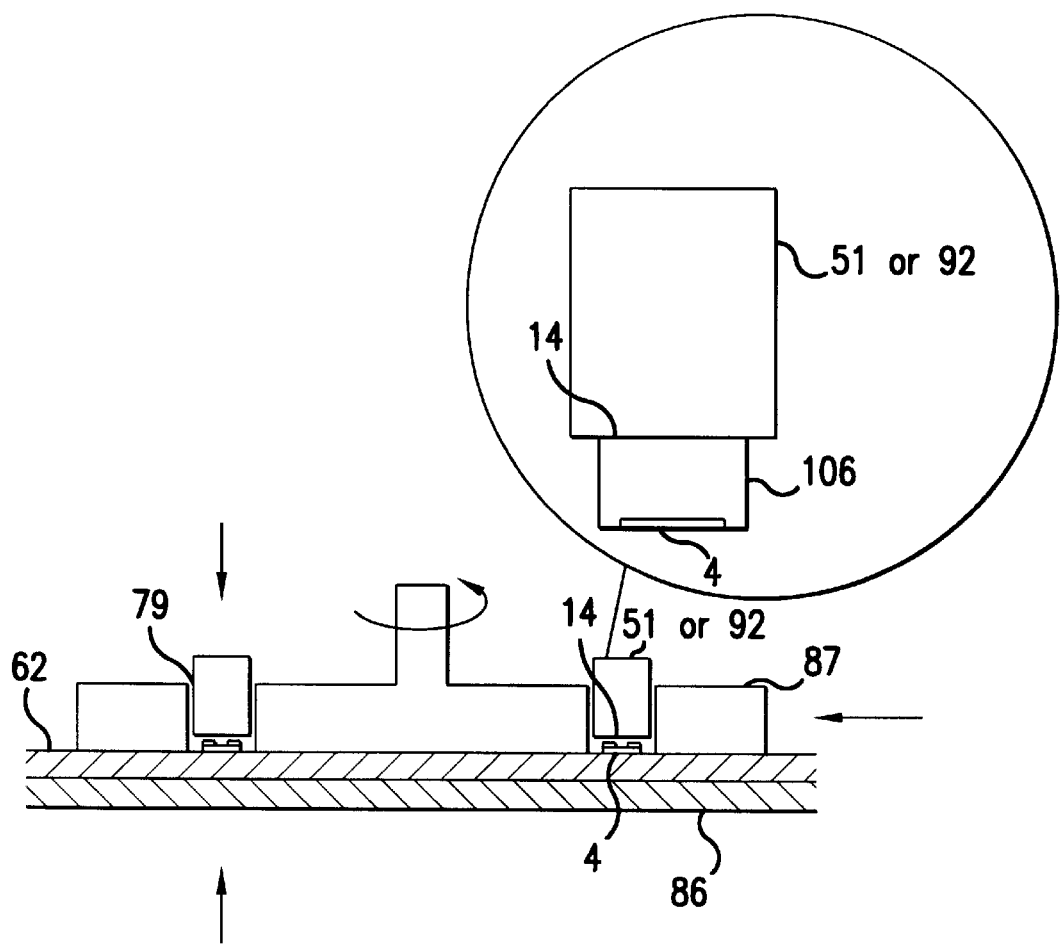
FIGS. 68 and 69 are cross sections that show the lapped state of the present invention.
Figure 69:
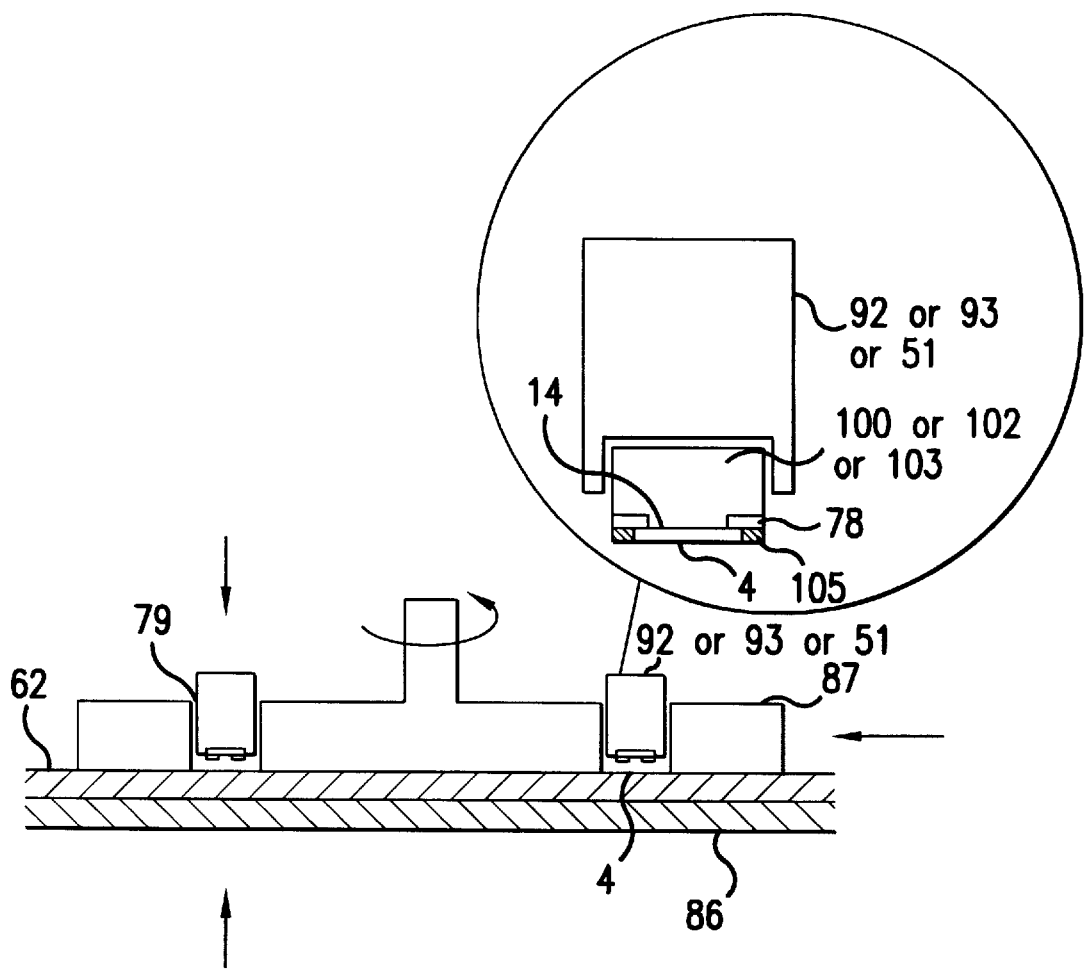

Furthermore, in the case of using a one-sided lapping machine as shown in FIG. 68, when the U-shaped part 106 is attached to the magnetic table 51 or when the U-shaped part 106 is suppressed downward by the magnetic force as shown in FIG. 69, the workpiece material 4 is machined in an ultra thin shape by lapping the workpiece material 4, which is attached to the U-shaped part 106.

Figure 70:
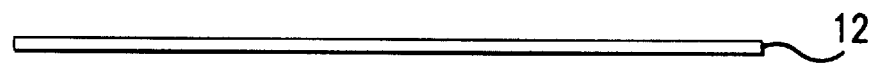
FIGS. 70–73 are cross sections that show the lapped material after the lapping process of the present invention.
Figure 71:

Referring FIG. 70, the reaction-frequency characteristics of the very thinly lapped material 12 shown have a spurious oscillation near the resonance region. However, the lapped material 12 of FIGS. 71–73 have an ideal reaction-frequency property with almost no spurious oscillation.

FIGS. 74–84 and FIG. 85 show the measured diagrams for a wide variety of the finished lapped material 12 such as quartz. These were obtained by the lapping method shown in FIGS. 18, 56, 57, 58, 59, 60, and 63.

Figure 74:
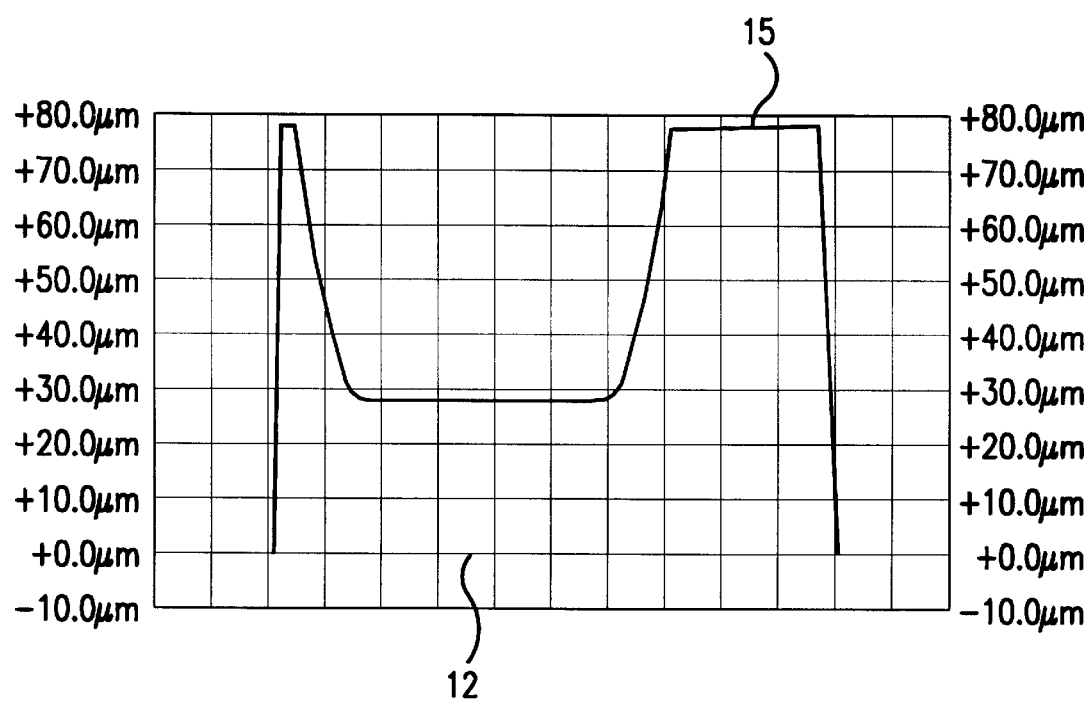
FIGS. 74–84 are diagrams of measured data for the lapped material in various shapes after executing the lapping by the manufacturing method of the present invention.
Figure 75:
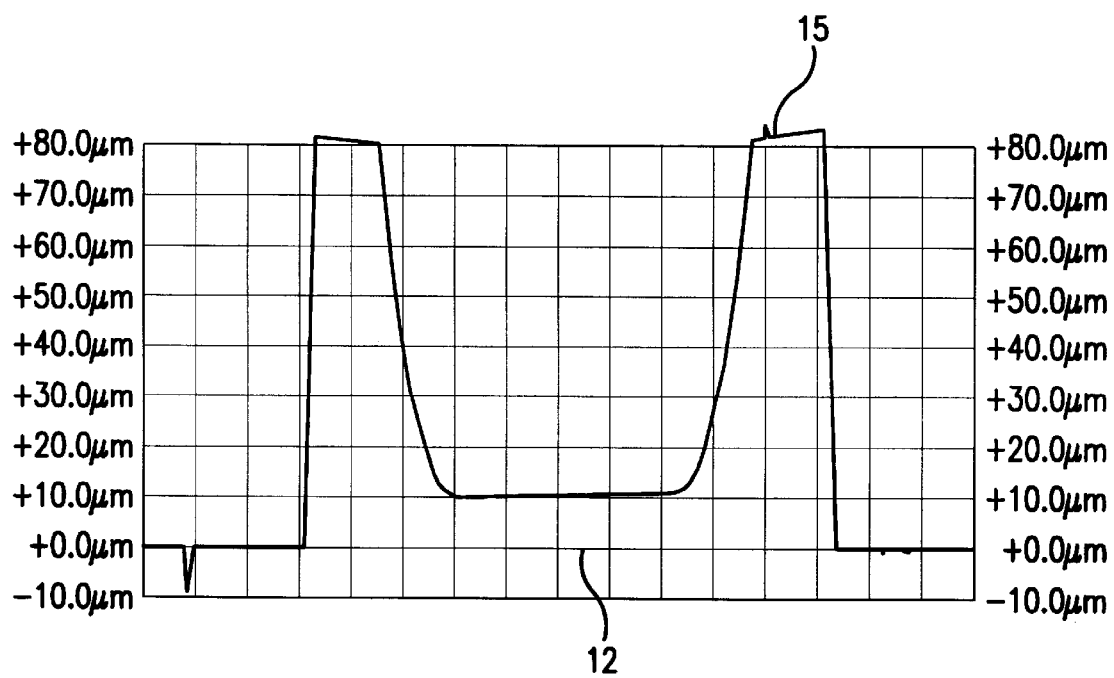
Figure 76:
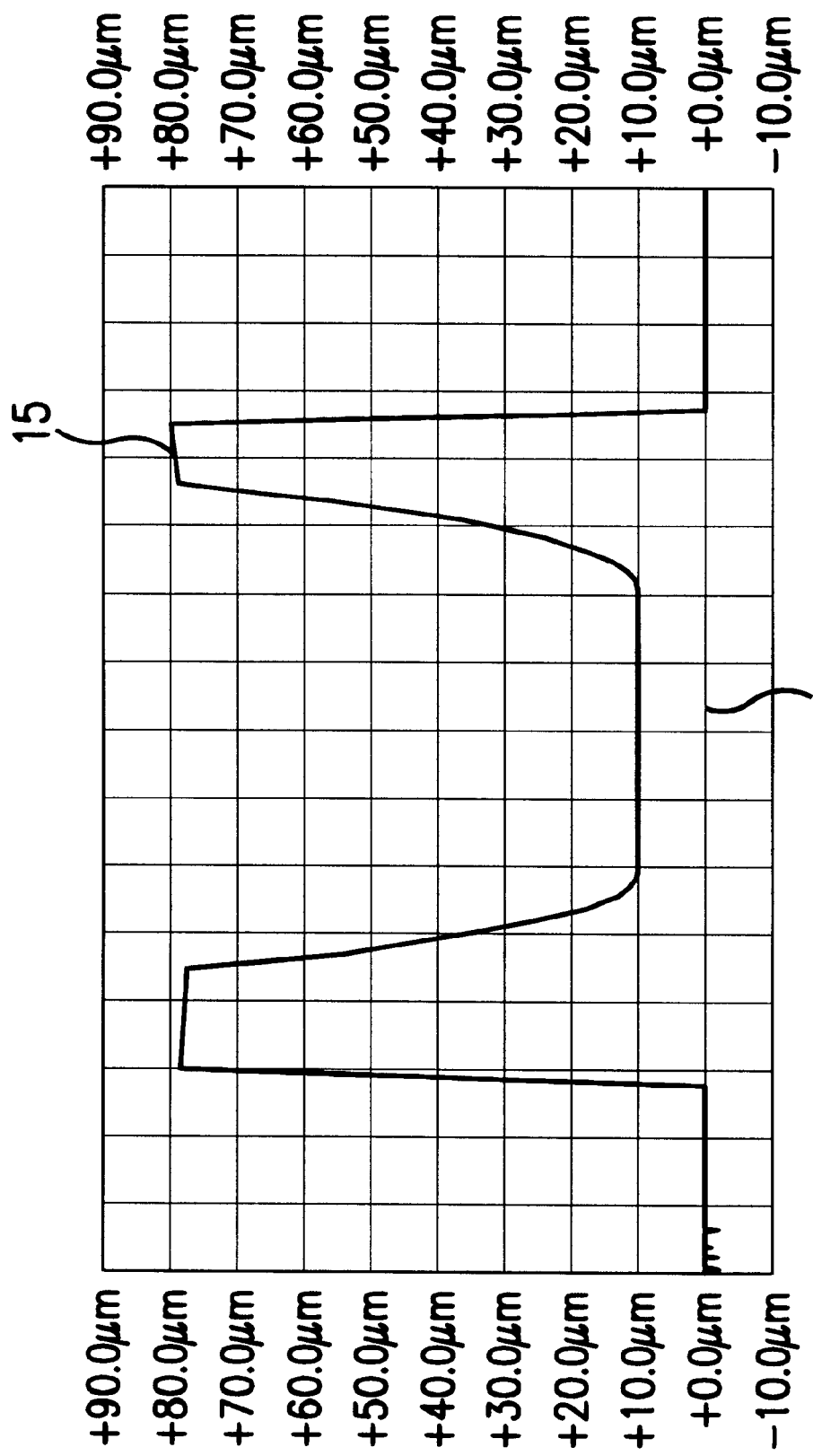
Figure 79:
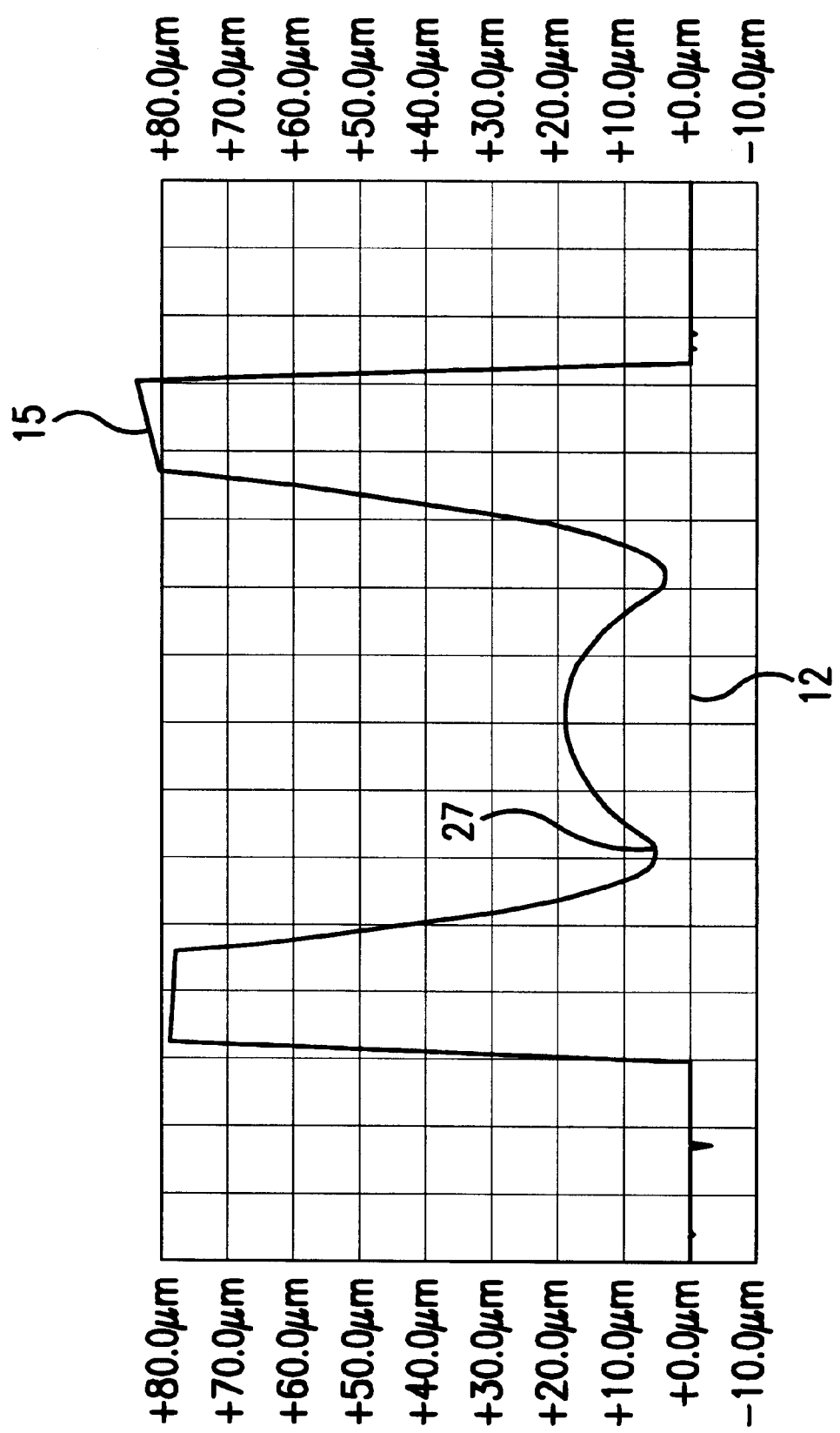
Figure 85:
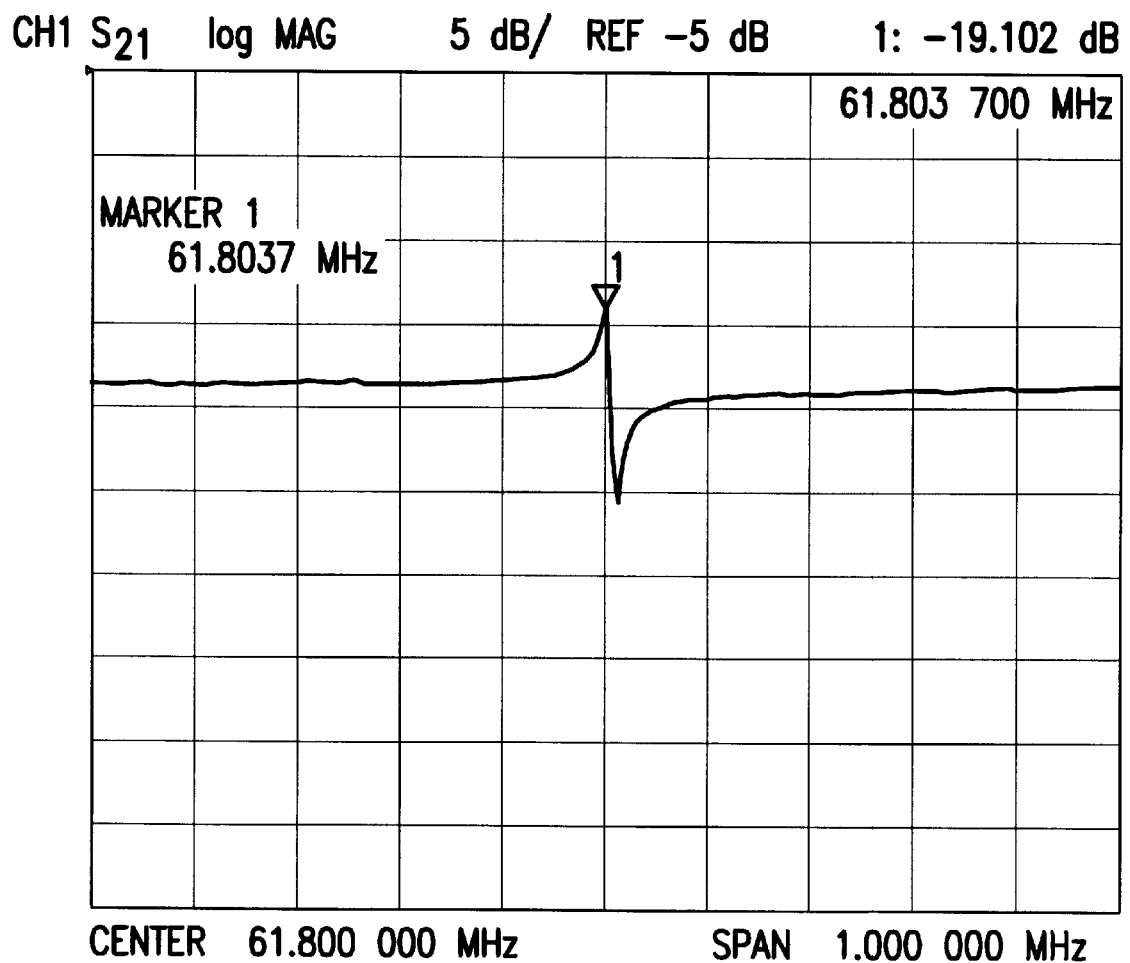
FIGS. 85–89 are diagrams of the reactance frequency characteristics actually measured for the quartz after the machining process.
Figure 86:
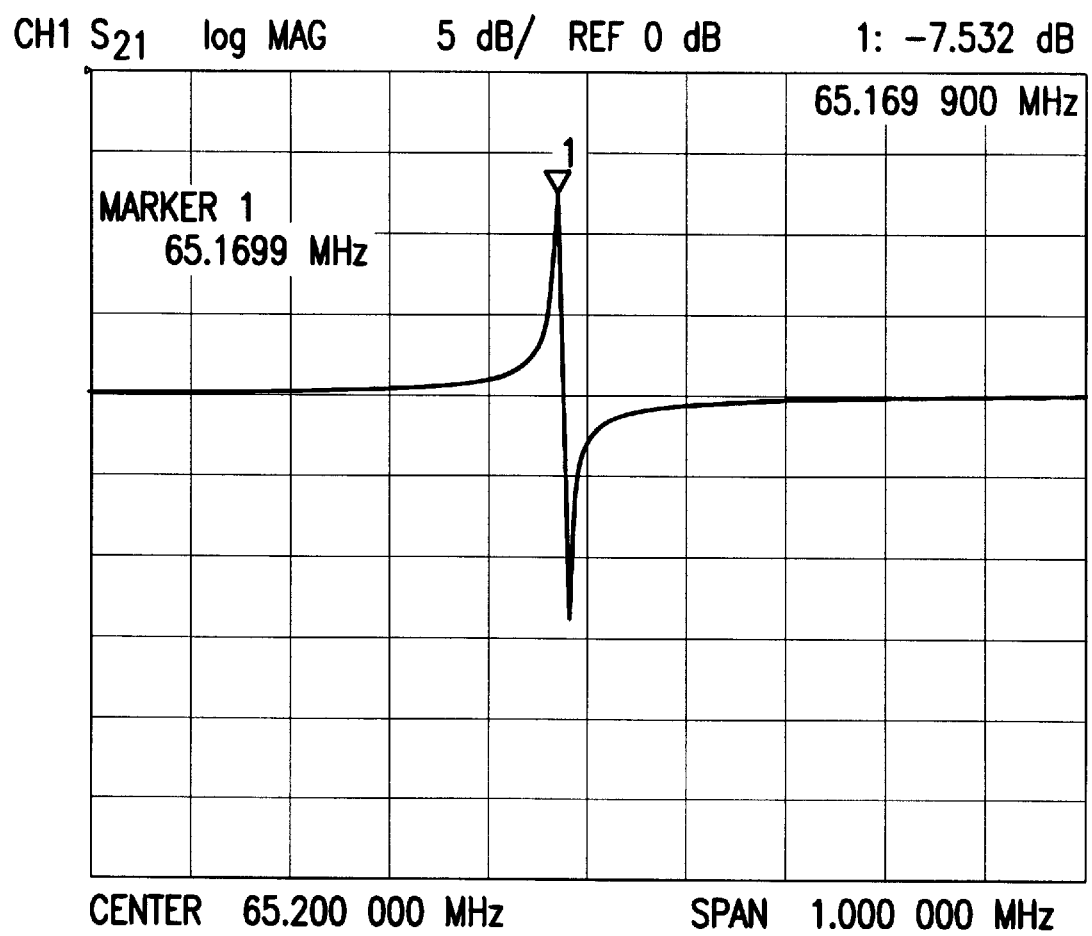
Figure 87:
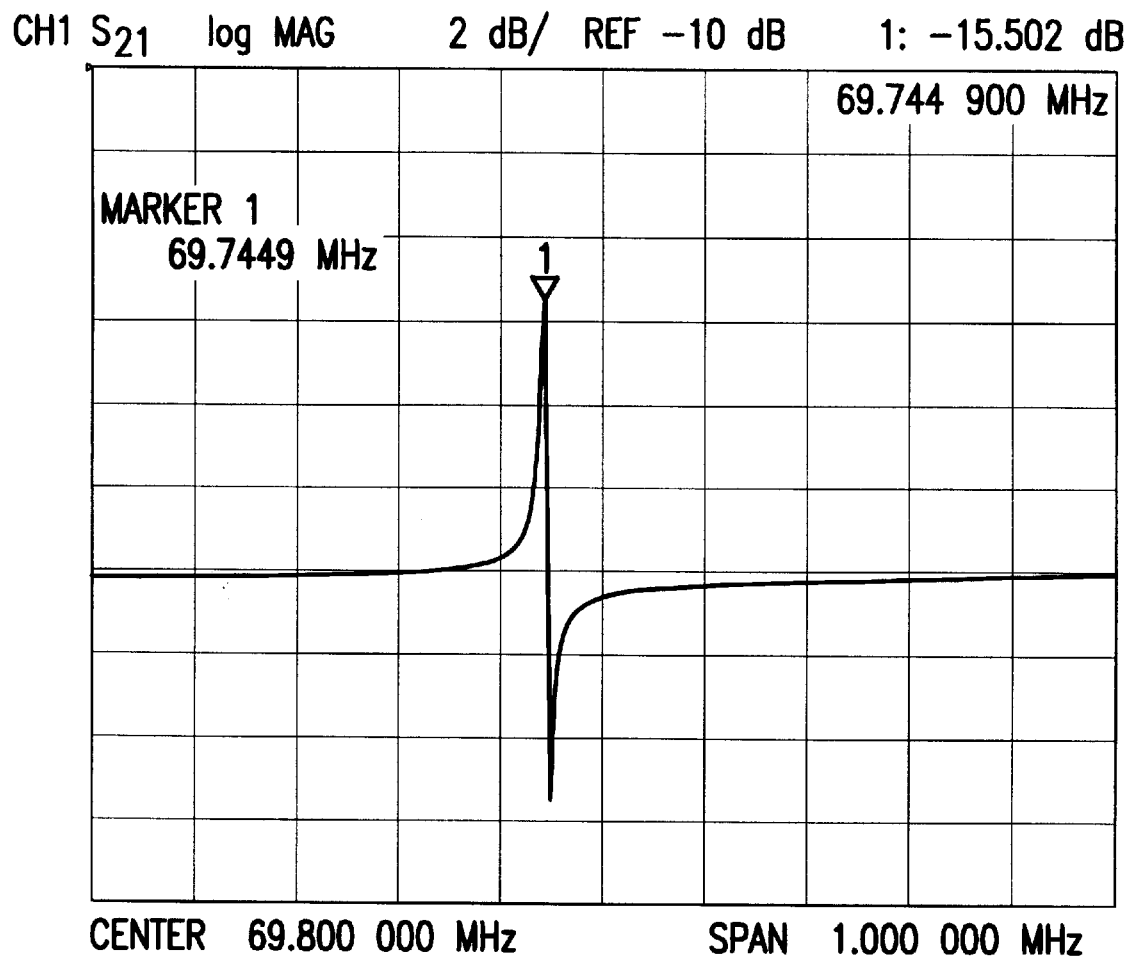
Figure 88:
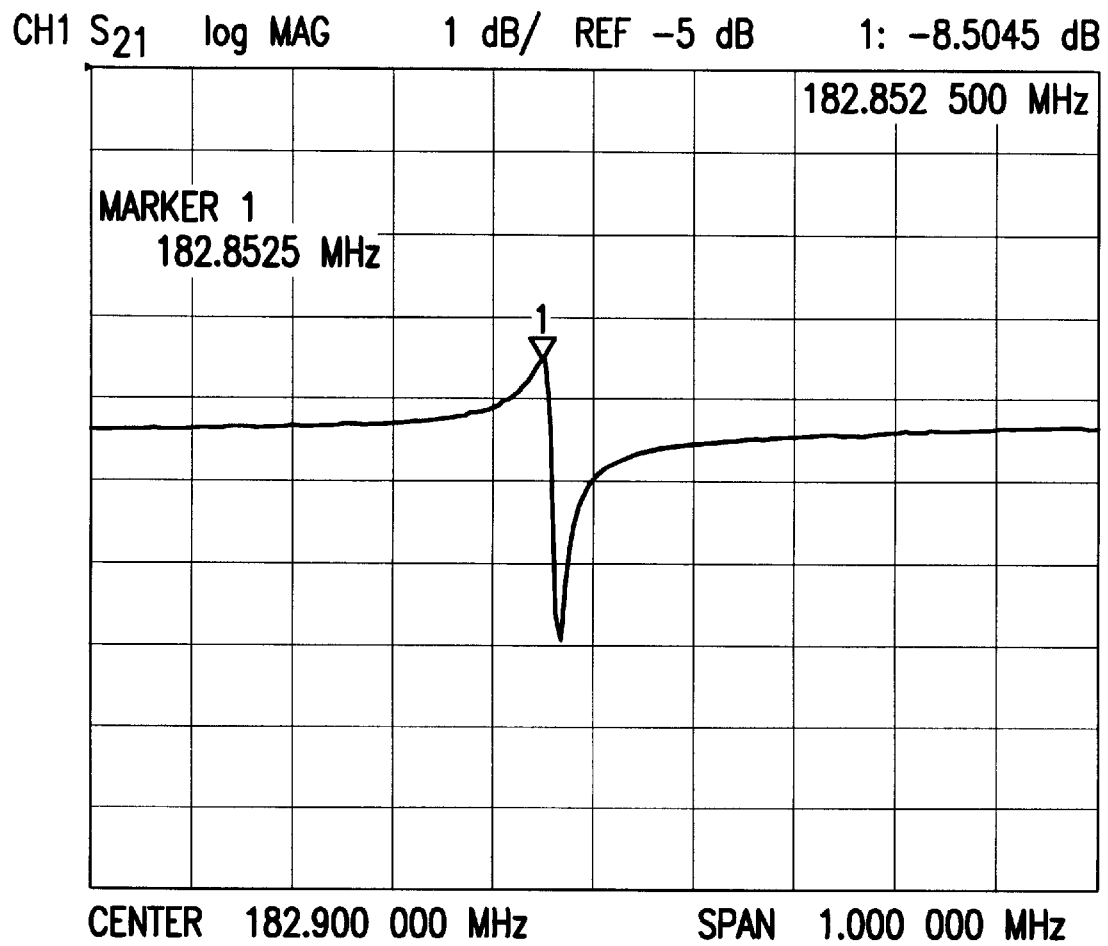
Figure 89:
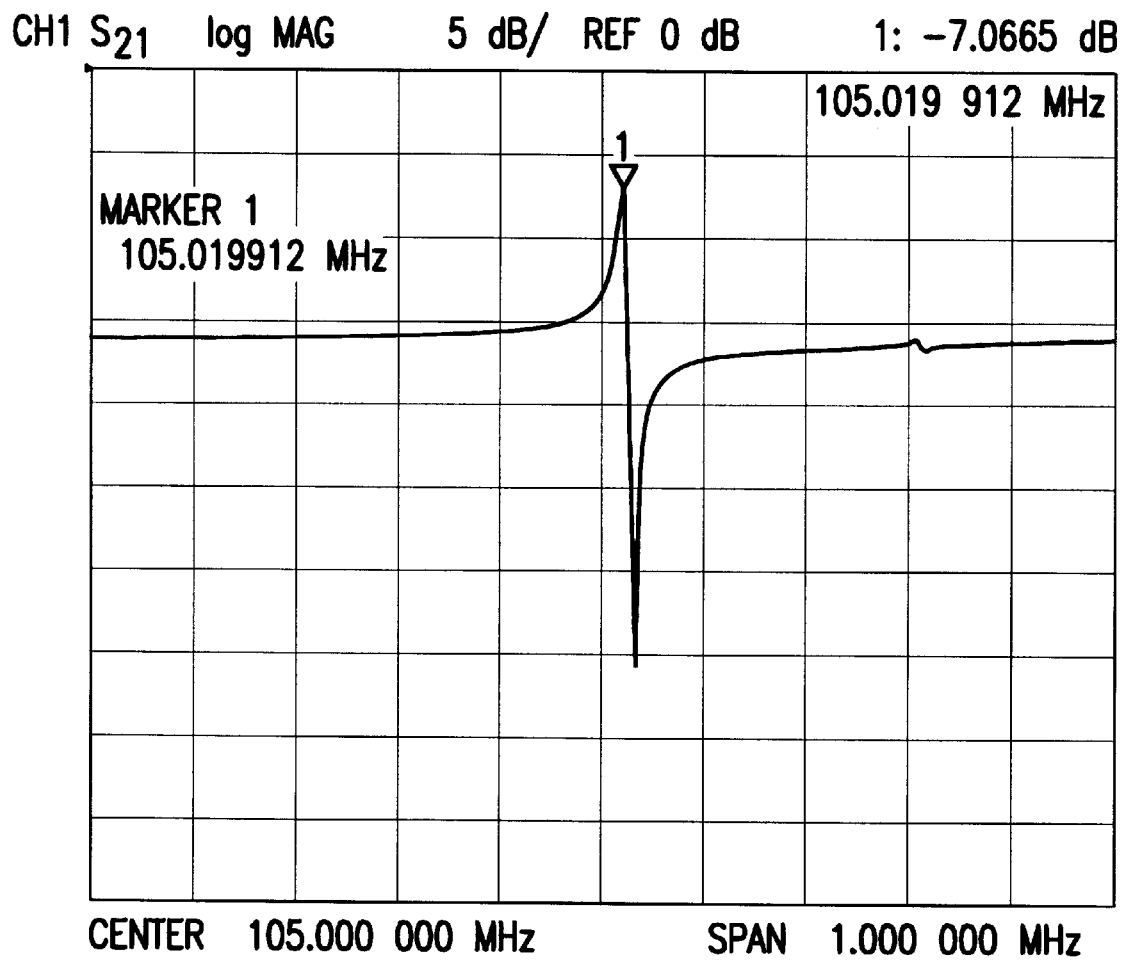

FIGS. 85–89 are measured diagrams of reaction-frequency properties for the finished lapped material 12 as quartz in FIGS. 74 and 79. The measuring instrument used was a Hewlett Packard HP 8753C network analyzer. FIG. 85 shows the data of the finished lapped material 12 in FIG. 74. FIGS. 86–89 show the data of the finished lapped material in FIG. 77. The measured data in FIG. 85 have quasi-frequency vibration with exterior spurious oscillation, which corresponds to the finished lapped material 12. However, the data in FIGS. 85–89 have ideal frequency oscillation of reaction characteristics (impedance). This corresponds to the finished lapped material 12 in FIGS. 77 and 74. The shape of the finished lapped material 12 in FIG. 77 was found to show a different property compared to that in FIG. 74.

Figure 77:
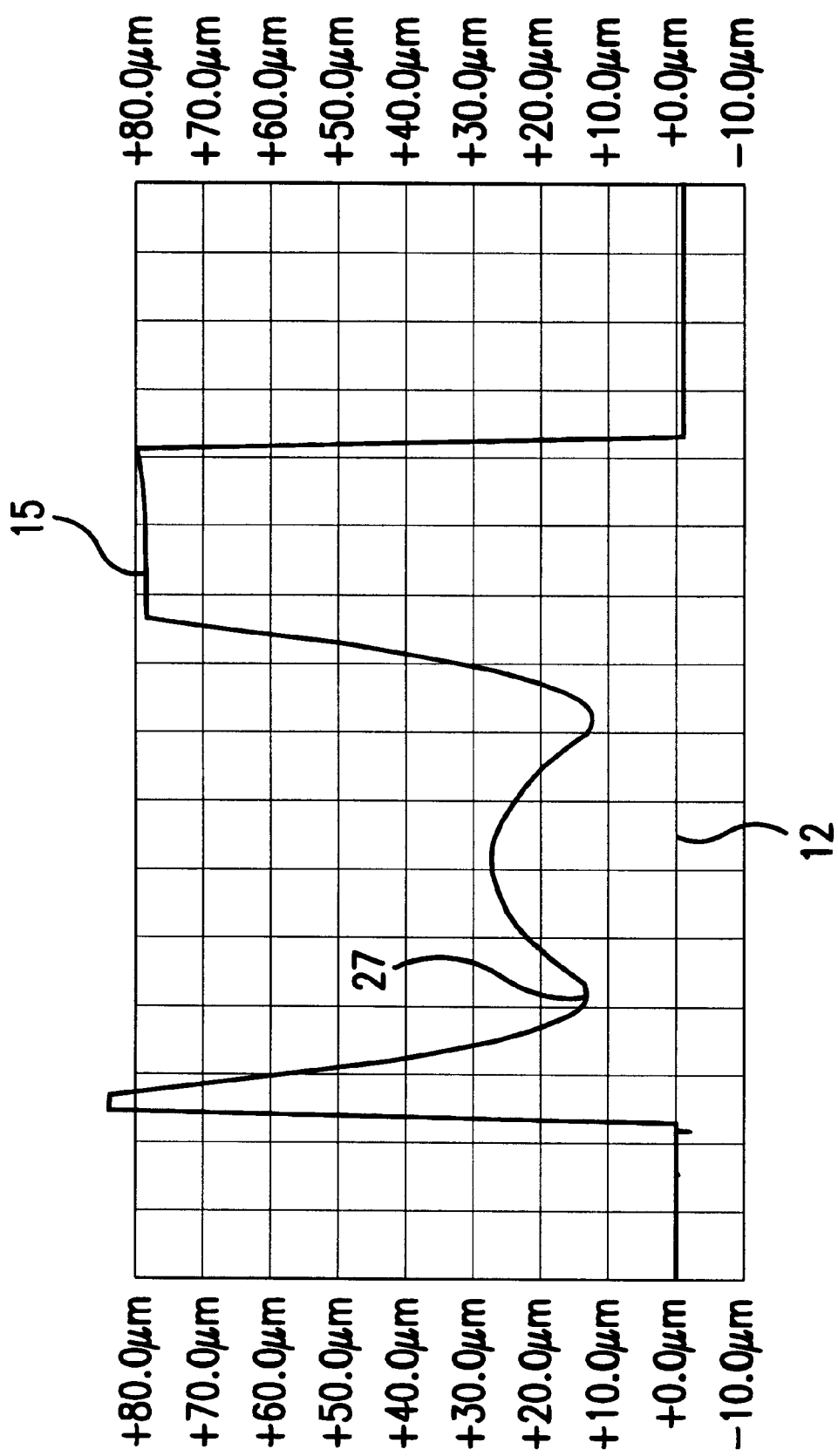
Figure 78:
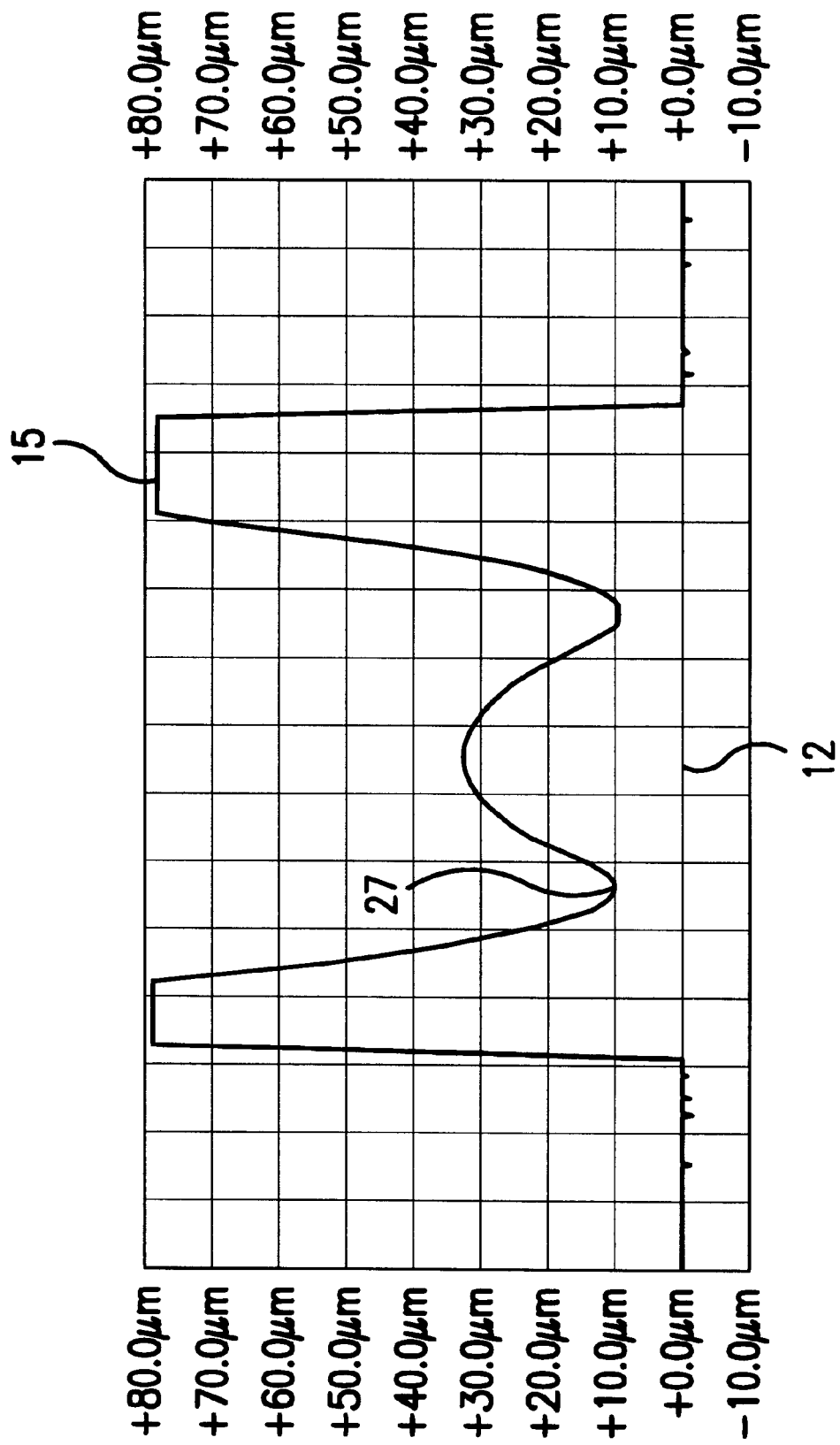
Figure 80:
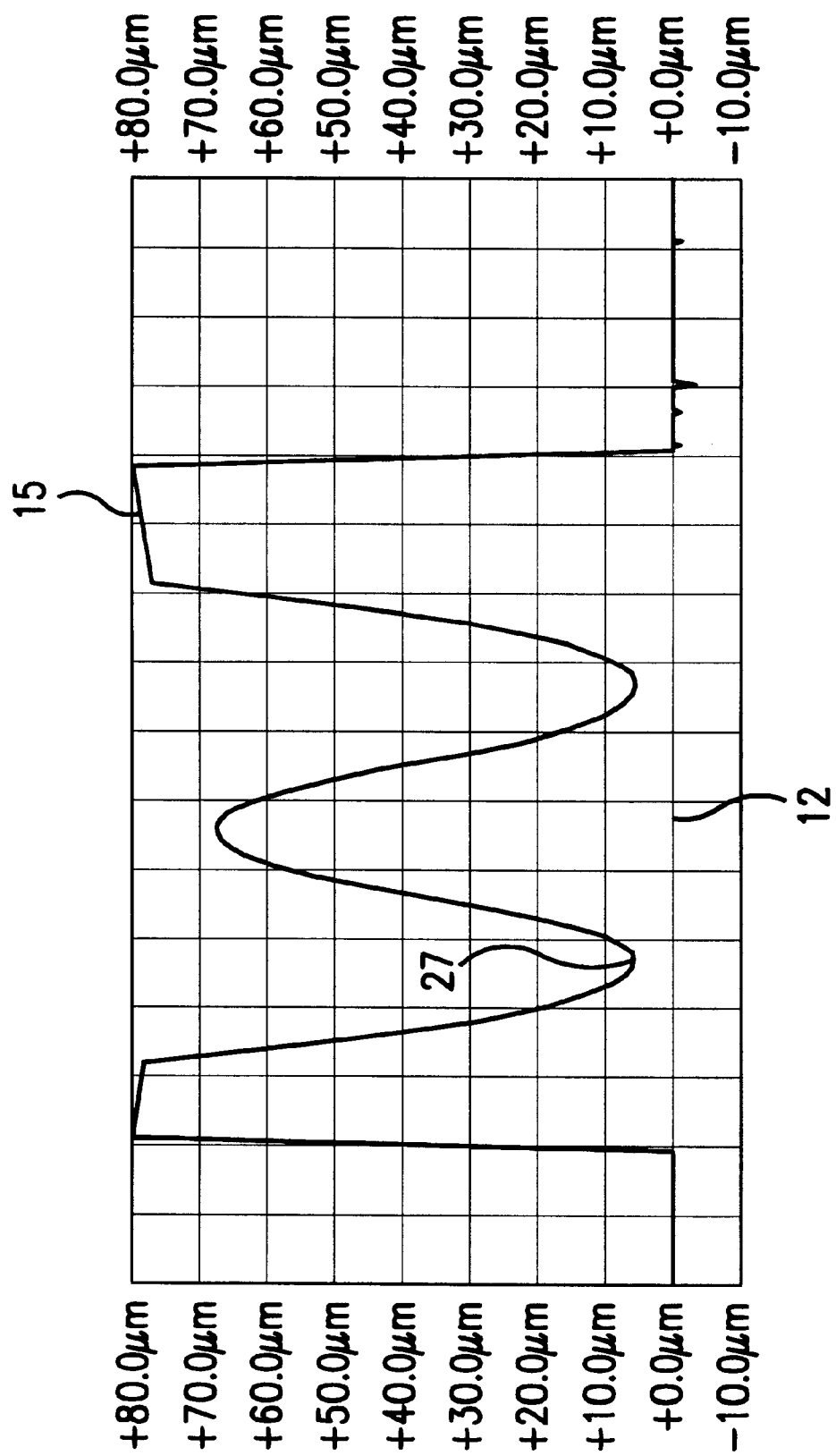
Figure 81:
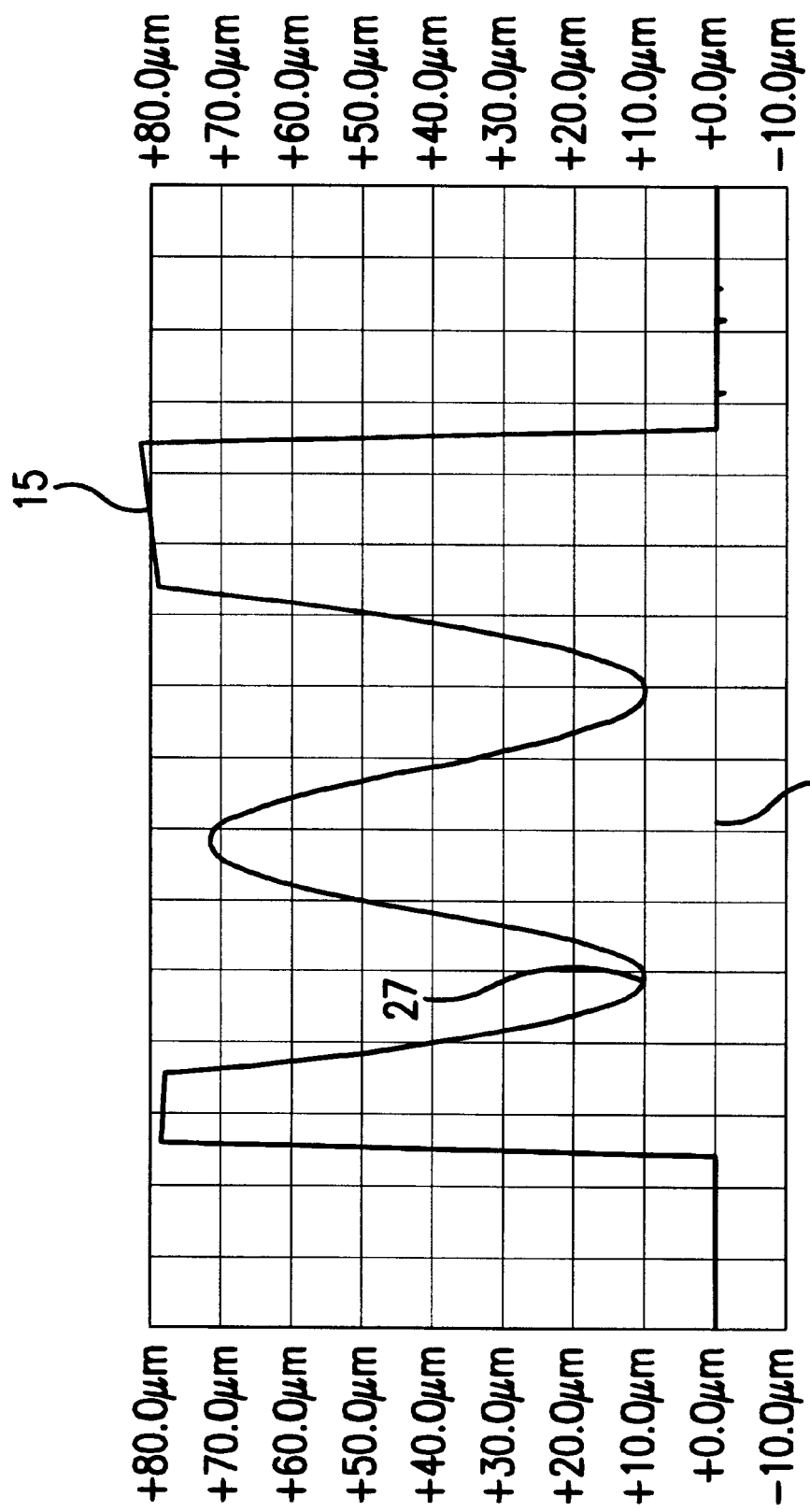
Figure 82:
Figure 83:
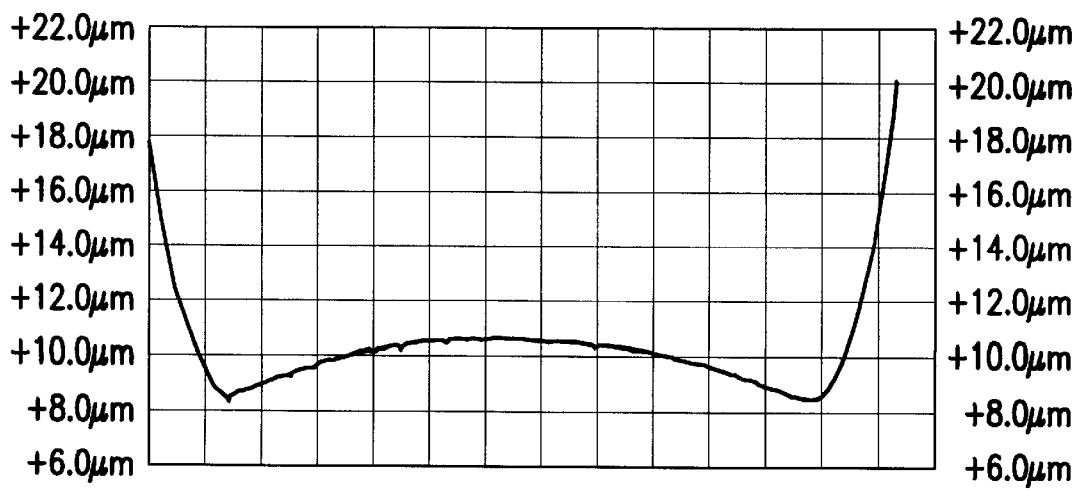
Figure 84:
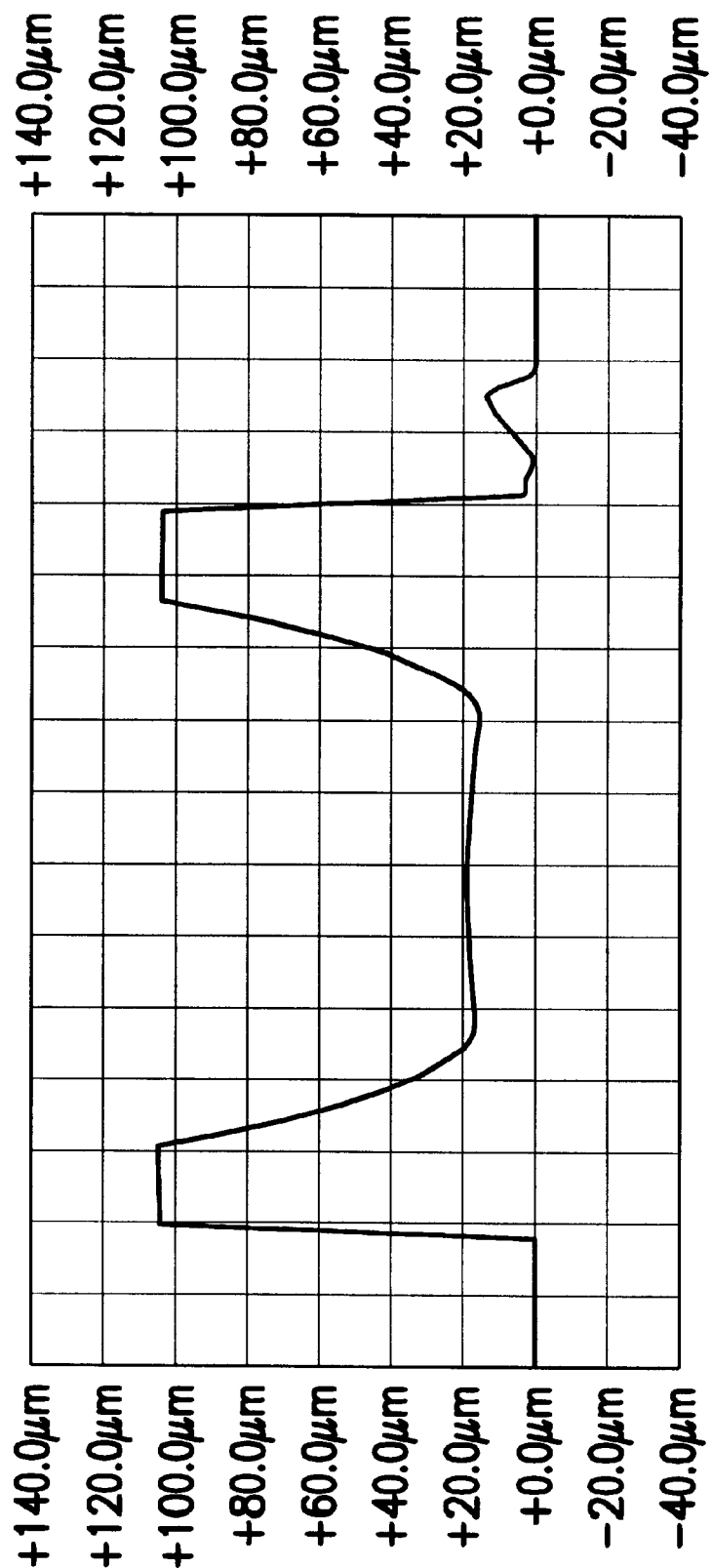

The crucial difference is that the shape of the finished lapped material 12 shown in FIG. 74 is planar (flat) at the oscillating part, and that the shape in FIG. 77 is plano-convex (one side is in a convex lens shape). Even in the case of the plano-convex shape, as seen in FIGS. 80 and 81, the ultra in finished lapped material 12 shown in FIGS. 77–81 was found to show almost no spurious oscillation in the vicinity of the primary frequency when the thickness of the convex lens was less than 70 μm.

Figure 73:
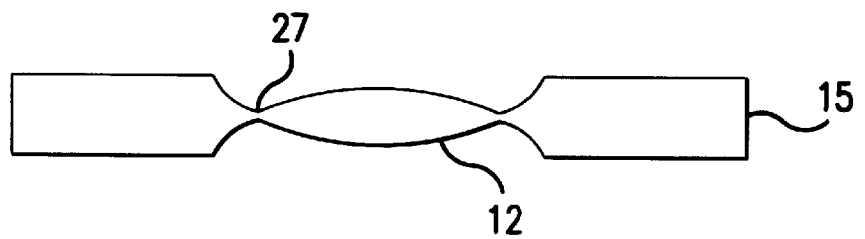

It has commonly been thought that an ideal reaction-frequency oscillation without spurious resonance cannot be obtained unless the shape is bi-convex, as shown in FIG. 73. However, the ideal reaction-frequency oscillation with almost no spurious resonance as shown in the measured data in FIGS. 86–89 is found to be achievable in the plano-convex shape shown in FIG. 77. Also, in the plano-convex case, the finished lapped material 12 should be less than 125 μm.

Figure 72:

The advantages of the finished lapped material 12 in the plano-convex shape in FIG. 72 over the conventional bi-convex shape in FIG. 73 are as follows:

1. Since only one side is in a convex lens shape, the crystal axis can be easily matched to the lapping axis.
2. Since only one side is convex, it can be as thin as possible as compared with that of the bi-convex shape.
3. The grooves 27 and the holding part 15 at the convex finished lapped material 12 are easily machined This is the condition in which the oscillation will not be spurious.

EFFECT OF THE INVENTION

In this invention, a spherical whetstone made of a nearly spherical steel sphere is held freely by magnetic force at the tip of a spherical, cylindrical, or similarly shaped holder, and the whetstone can shave and lap a lapped material as thinly, minutely, and accurately as possible.

Quartz oscillators and quartz resonators are required to be as small, thin, and accurate as possible. Conventional theories and machining methods cannot satisfy this requirement. The quartz oscillators and quartz resonators of this invention, however, are manufactured without difficulty in quite thin, small, and accurate shapes. Therefore, quartz oscillators and quartz resonators are able to transmit and receive directly high frequency waves from 600 MHz to 1,000 MHz. This has been impossible with conventional technology. Mobile communication devices such as mobile telephones can be entirely digitized. Those devices can be made as small as business cards. The present invention can be applied to a wide variety of domains such as small high-resolution radar, small radar that automatically stops cars, tiny radar such as robot eyes, small radar for blind people, high resolution electronic microscopes, communication satellites, as well as other domains.

In using the present invention, quartz oscillators of the lapped material are shaved or lapped by a rotating holding tool directly connected to the holder after forming an adhesive part on the spherical whetstone, on which a diamond grain surface is made in a purely spherical or nearly spherical shape. The spherical whetstone is made of nearly spherical iron steel in which the diameter ranges from approximately 1 mm to several cm. On the surface of the spherical whetstone, a lapping agent is coated with grains of diamond or other substances by means of electroplating, evaporation, CVD process, etc., and the whetstone surface or the diamond grain surface is formed. Therefore, many lapped materials such as quartz, ceramics, ferrite or others, which are as small as 1–10 mm or larger can be lapped into fine spherical shapes by using the spherical whetstone made of a steel sphere in a nearly pure spherical shape. Since the entire sphere surface of the spherical whetstone can be used and consumption is negligible, the material is lapped in a short time and the machining cost to lap it in a thinner and more accurate shape is cheaper. Also, by using NC machines, the spherical whetstone can be used as a cutting tool to lap many objects in the shape of convex lens, concave lens, non-spherical shapes, and other arbitrary shapes.

This novel structure, which is composed of the hollow cylindrical shaped material, the cylindrical shaped material, and the lapped material, rotates and revolves as a planet. One side laps the upper surface with the lapping plate. The other side laps the lower side of the cylindrical material with the lapping plate. An ultra thin material is easily machined. Magnetic force is used to attract the lapped material to the lapping plate. The merits that occur are listed below.

1. Since magnetic attraction is used as the lapping pressure (load), the gravity center is lowered to the limit
2. The extremely small magnet in the diameter, the length, and the weight make it possible for high lapping pressure (load) to occur. For example, a magnet of 5 mm diameter, 10 mm length and 1.5 g weight can produce a lapping pressure (load) of 150 g.
3. Since an extremely small magnet in diameter, length, and weight makes it possible for high lapping pressure (load) to occur, an ultra thin lapped material can be machined. For example, in the case of small quartz without magnetic attraction, other methods cannot load the pressure to the quartz where the diameter is approximately 5 mm.
4. The lapped material can attach to the lapping plate as closely as possible.
5. Even if the gap between the inner diameter of the carrier and the external diameter becomes smaller, the magnet can draw close to the lapping plate surface and the lapping accuracy becomes excellent because the magnet moves freely up and down inside the carrier hole by using magnetic attraction.

The lapped material becomes thicker where a ring-shaped holder is placed without an adhesive around the exterior surface of the lapped material. One side is lapped with the cylindrical shaped part (the so-called "menko" in Japanese). The other side is lapped with a ring-shaped holder by using the carrier of a two-sided lapping machine. An ultra thin sample can be easily lapped. The circular U-shaped part, which is approximately as thick as or nearly as high as the lapped material, is machined or molded by using plastics or metals. The lapped material is attached with an adhesive on part of the U-shaped part, or the lapped material is connected to it without an adhesive. The exterior part of the lapped material is formed and protected by the ring-shaped part, and the U-shaped part makes the lapped material thicker. This is because the lapped material is attached with an adhesive on part of the U-shaped part, or it is simply connected without an adhesive. One side is lapped with the ring-shaped part of the U-shaped part by using the carrier of a two-sided lapping machine. The other side is lapped with both the lapped material and with the ring-shaped part of the U-shaped part around the lapped material. An ultra thin sample is easily lapped by overcoming the defects of the conventional lapping machine as explained below.

1. Since the lapped material is attached to the hollow cylindrical part or the U-shaped part, it is lapped as thinly as possible. This is achieved by using the carrier of a two-sided lapping machine.

2. The ring-shaped holder, which is as thick as the lapped material, is attached on the entire surface of the lapped material, or the ring shape is formed on the exterior surface of the lapped material, and the lapped material is machined together. Then, the lapped material with a large diameter of the exterior surface attached by the ring shaped holder or the U-shaped part can be machined with fewer dispersed errors than in the case of the lapped material alone. Therefore, the parallel planar accuracy of the lapped material is not only higher than that of the stand-alone lapping, but also cannot be destroyed when it is machined to the thinnest shape possible.

3. The main shortcoming of a two-sided lapping machine is that the upper lapping plate rotates counter clockwise while the lower lapping plate rotates clockwise. In other words, the lapped material has a twist stress and the property of the quartz changes due to the residual stress of the two-sided rotation. On the other hand, the lapped material as quartz is not stressed by the twisting force since the two-sided lapping machine moves like a one-sided lapping machine when the upper lapping plate machines the hollow cylindrical part, or when the U-shaped part and the lower lapping plate machines the lapped material as quartz.

4. A one-sided lapping machine cannot shave the lapped material in a higher planar accuracy, but a two-sided lapping machine can do it due to the pressure of the upper and lower lapping plates. Therefore, the present invention, which uses a two-sided lapping machine attached to a hollow cylindrical part or a U-shaped part on the lapped material, can improve the parallel planar accuracy of a one-sided lapping machine. This invention can solve the problem of a two-sided lapping machine not being able to lap an ultra thin material such as quartz. It also leaves a residual stress in the ultra thin lapped material due to the twisting force.

Quartz oscillators are lapped while the magnetic part of the spherical material, on which the whetstone surface or the diamond grain surface on the spherical shaped whetstone is formed, is magnetized. At the same time the lapped object is machined to be partly planar at the central part of said lapped material in the shape of a convex or concave lens. This is accomplished by the circular surface of said spherical whetstone, whose lapping surface is made by electric gild or non-electric gild on the spherical material. When the circular surface of said spherical whetstone, which is attracted by the magnetic force or the vacuum force of the table, rotates by using the holder, the following merits are obtained 1. After the coarse machining is done, the steel sphere with the whetstone surface can be changed easily on the same axis line for fine lapping because the whetstone with the fine lapping surface can be connected smoothly.

2. Since the lapped material is machined in a hollow cylindrical, conical, or spherical shape by the tool during the holder state connected to the lapping machine, the holder in a hollow cylindrical or conical shape can be set to the tip of the fine lapping machine on the central axis line with negligible error.

3. The steel sphere with the whetstone surface is attracted and connected to the tip of the holder by magnetic induction force, vacuum suction, or magnetic force. Therefore, the central axis line of the hollow cylindrical or conical holder is easily matched to the central line of the steel sphere. The material can be lapped with an extremely high accuracy.

INDUSTRIAL APPLICABILITY

The present invention can be applied to a wide variety of electronic apparatuses, communication instruments such as mobile telephones and small high resolution radars, and other things that utilize quartz oscillators and quartz resonators in order to transmit and receive stable high frequency waves.

What is claimed is:

1. A method for manufacturing high-frequency oscillator elements from a workpiece material, comprising the steps of:

providing a tool holder formed of magnetic material providing a magnetic field at a tip thereof;

providing a spherical whetstone made of a magnetic material;

providing a grinding mount made of a magnetic material installed on a main rotating shaft proximate said tool holder through which flux of the magnetic field is channeled;

suspending the spherical whetstone at the tip of the tool holder by magnetic attraction;

mounting the workpiece material on the grinding mount; and rotating said tool holder around an axis coincident with a center of the spherical whetstone while bringing said spherical whetstone into engagement with the workpiece material to lap the workpiece material.

2. The method of claim 1 wherein said spherical whetstone is formed by adhering lapping grains of diamond on a surface of a spherical magnetic material.

3. The method of claim 2 wherein said lapping grains are applied in one of a whole coverage pattern, a lattice pattern, and a lined pattern.

4. The method of claim 1 wherein mounting the workpiece material includes:

fixing the workpiece material to a magnetic table; and mounting the magnetic table on said grinding mount.

5. A method for manufacturing high-frequency oscillator elements from a workpiece material, comprising the steps of:

providing a vacuum chuck having a tip for vacuum mounting;

mounting a spherical whetstone at said tip of said vacuum chuck;

rotating said vacuum chuck around an axis passing through a center of said spherical whetstone;

providing a grinding mount on a main rotating shaft;

fixing the workpiece material on the grinding mount; and lapping the workpiece material using said spherical whetstone rotating on said vacuum chuck.

6. The method of claim 5 wherein said spherical whetstone has a surface coated with lapping grains of diamond.

7. A method for manufacturing high-frequency oscillator elements from a workpiece material having an outer side surface, a planar surface and another surface opposing said planar surface, comprising the steps of:

forming a protecting member around said outer surface and said planar surface of said workpiece material leaving said another surface exposed;

setting said workpiece mounted in said protecting member to a lapping machine; and lapping said another surface of said workpiece and said protecting member simultaneously to form said workpiece into an ultra thin material.

8. A manufacturing method of claim 7 wherein said protecting member is a single cylindrical plate having a concavity formed therein containing said workpiece material.

9. An apparatus for manufacturing high-frequency oscillator elements from a workpiece material, comprising:

a tool holder made of a magnetic material having a tip, the tool being mounted on a rotational drive for rotating said tool holder;

a spherical whetstone made of a magnetic material magnetically mounted on the tip of said tool holder;

a grinding mount made of a magnetic material installed to a main rotatable shaft; and a drive for rotating said tool holder around an axis passing through a center of said spherical whetstone.

10. The apparatus of claim 9 wherein said spherical whetstone has a surface coated with lapping grains of diamond.

11. An apparatus for manufacturing high-frequency oscillator elements from a workpiece material, comprising:

a vacuum chuck having a tip for vacuum mounting;

a spherical whetstone mounted on the tip of said vacuum chuck; and a drive for rotating said vacuum chuck around an axis passing through a center of said spherical whetstone.

12. The apparatus of claim 11 wherein said spherical whetstone has a surface coated with lapping grains of diamond.

\* \* \* \* \*